United States Patent
Yoo et al.

(10) Patent No.: US 9,214,409 B2
(45) Date of Patent: Dec. 15, 2015

(54) SEMICONDUCTOR DEVICE

(71) Applicant: Samsung Electronics Co., Ltd., Suwon-si (KR)

(72) Inventors: Jin-Hyuk Yoo, Hwaseong-si (KR); Dae-Hyun Jang, Seongnam-si (KR); Yoo-Chul Kong, Seoul (KR); Kyoung-Sub Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/786,853

(22) Filed: Mar. 6, 2013

(65) Prior Publication Data

US 2013/0320486 A1    Dec. 5, 2013

(30) Foreign Application Priority Data

May 29, 2012    (KR) .......................... 10-2012-0056925

(51) Int. Cl.
*H01L 29/76*    (2006.01)
*H01L 23/48*    (2006.01)
*H01L 27/115*   (2006.01)

(52) U.S. Cl.
CPC ............ *H01L 23/48* (2013.01); *H01L 27/1157* (2013.01); *H01L 27/11573* (2013.01); *H01L 27/11582* (2013.01); *H01L 2924/0002* (2013.01)

(58) Field of Classification Search
CPC .................. H01L 27/11578; H01L 27/11582; H01L 27/1157; H01L 27/11573
USPC .................... 257/314, 501, 506, 508, E21.19, 257/E21.41, E21.677, 315–321; 438/257–267
See application file for complete search history.

(56) References Cited

U.S. PATENT DOCUMENTS

| | | |
|---|---|---|
| 2009/0179257 A1 | 7/2009 | Komori et al. |
| 2010/0213537 A1 | 8/2010 | Fukuzumi et al. |
| 2011/0115014 A1 | 5/2011 | Ichinose et al. |
| 2011/0207303 A1* | 8/2011 | Jeong et al. ................... 438/487 |
| 2011/0291172 A1* | 12/2011 | Hwang et al. .................. 257/314 |
| 2012/0083077 A1* | 4/2012 | Yang et al. ..................... 438/156 |

* cited by examiner

*Primary Examiner* — Brook Kebede
(74) *Attorney, Agent, or Firm* — Myers Bigel Sibley & Sajovec, PA

(57) ABSTRACT

Provided is a semiconductor device. The semiconductor device includes a conductive pattern disposed on a semiconductor substrate. First and second conductive lines disposed on the conductive pattern and located at the same level as each other, are provided. An isolation pattern is disposed between the first and second conductive lines. A first vertical structure passing through the first conductive line and conductive pattern is provided. A second vertical structure passing through the second conductive line and conductive patterns is provided. An auxiliary pattern passing through the conductive pattern and in contact with the isolation pattern is provided.

20 Claims, 88 Drawing Sheets

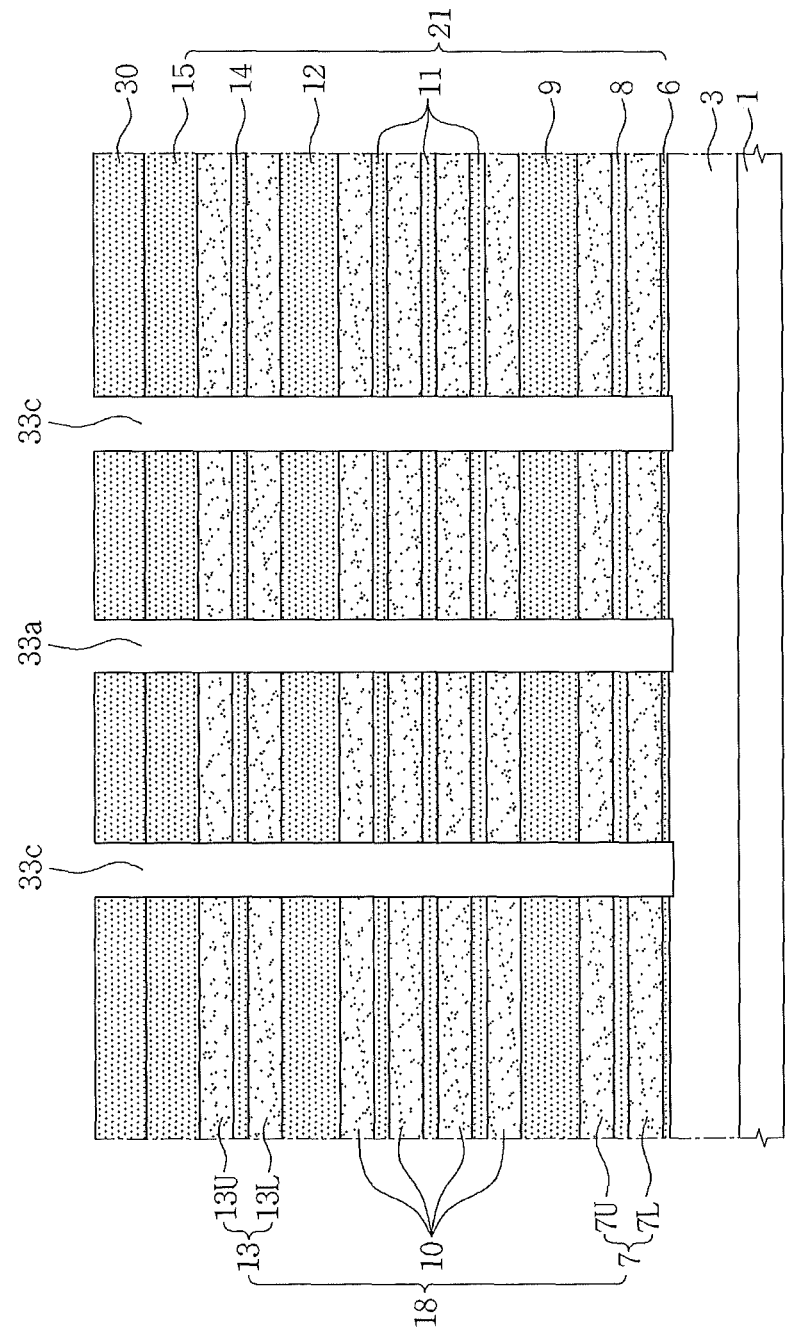

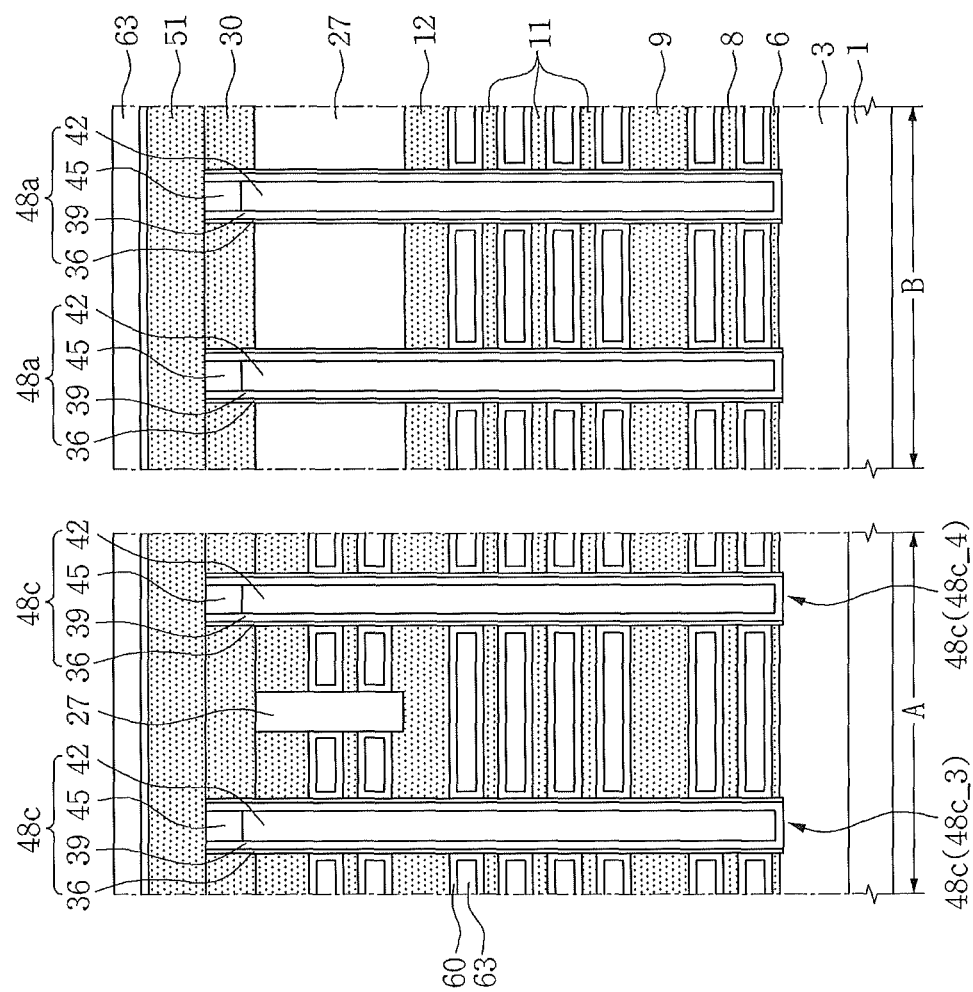

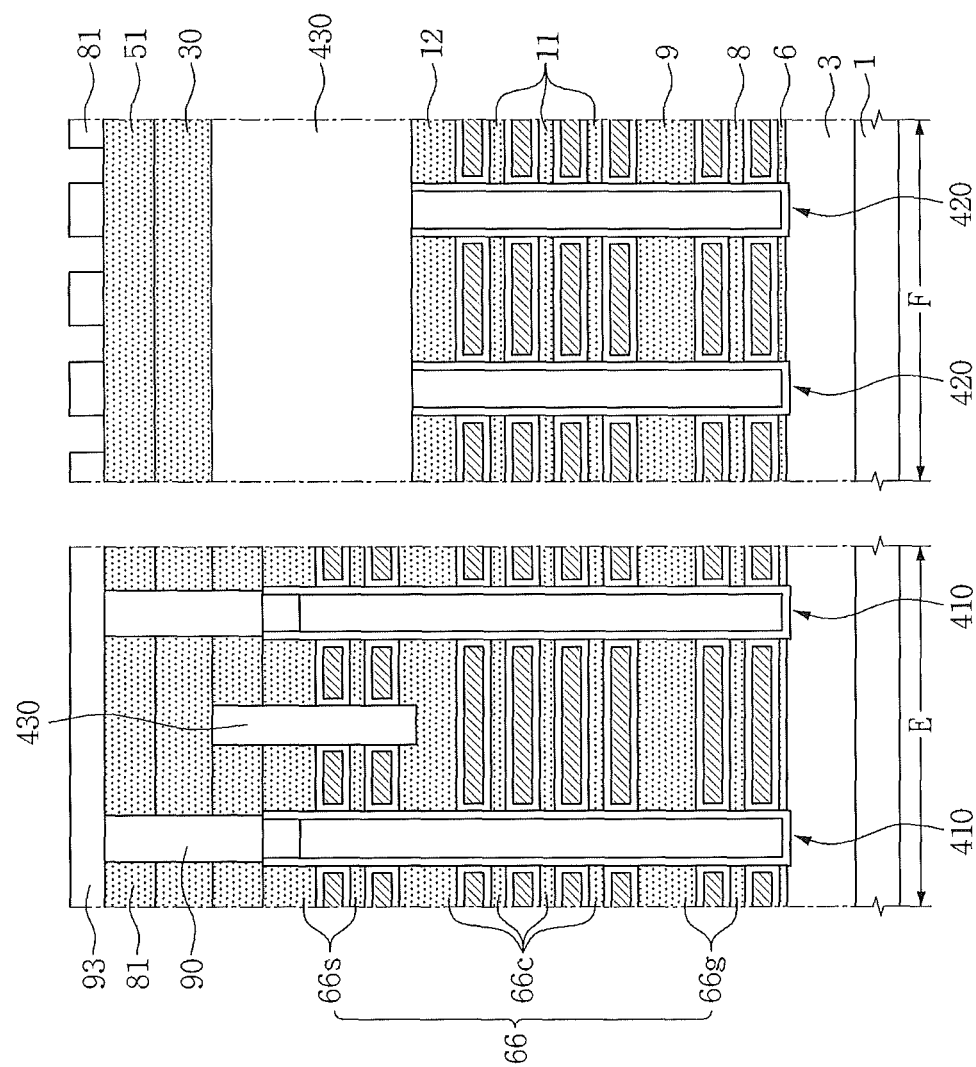

SEMICONDUCTOR DEVICE

CROSS-REFERENCE TO RELATED APPLICATION

This application claims priority under 35 U.S.C. §119 to Korean Patent Application No. 10-2012-0056925 filed on May 29, 2012, the disclosure of which is hereby incorporated by reference in its entirety.

BACKGROUND

1. Field

Embodiments of the inventive concept relate to a semiconductor device, a method of fabricating the same and an electronic apparatus and system.

2. Description of Related Art

In order to shrink a size of a semiconductor device and improve the performance, various methods by which a plurality of memory cells are vertically formed on a substrate, have been studied.

SUMMARY

Embodiments of the inventive concept provide semiconductor devices capable of fabricating highly reliable three-dimensional transistors.

Other embodiments of the inventive concept provide methods of fabricating the semiconductor devices.

Still other embodiments of the inventive concept provide an electronic apparatus and electronic system having the semiconductor devices.

The technical objectives of the inventive concept are not limited to the above disclosure; other objectives may become apparent to those of ordinary skill in the art based on the following descriptions.

In accordance with an aspect of the inventive concept, a semiconductor device is provided. The semiconductor device includes a conductive pattern disposed on a semiconductor substrate. First and second conductive lines disposed on the conductive pattern and located at the same level as each other are provided. An isolation pattern is disposed between the first and second conductive lines. A first vertical structure passing through the first conductive line and the conductive pattern is provided. A second vertical structure passing through the second conductive line and conductive pattern is provided. An auxiliary pattern passing through the conductive pattern and in contact with the isolation pattern is provided.

In some embodiments, the auxiliary pattern may have a greater width than the isolation pattern.

In other embodiments, the auxiliary pattern may pass through the isolation pattern.

In still other embodiments, the semiconductor device may further include a bit line intersecting the first and second conductive lines and overlapping the first and second vertical structures and the auxiliary pattern, a first contact structure interposed between the bit line and the first vertical structure and electrically connecting the bit line and the first vertical structure, a second contact structure interposed between the bit line and the second vertical structure and electrically connecting the bit line and the second vertical structure, and an insulating material interposed between the bit line and the auxiliary pattern and insulating the bit line from the auxiliary pattern.

In accordance with another aspect of the inventive concept, a semiconductor device is provided. The semiconductor device includes first and second insulating vertical patterns disposed on a semiconductor substrate and spaced apart from each other. First and second conductive lines disposed between the first and second insulating vertical patterns and located at the same level as each other are provided. Conductive patterns are disposed between the first and second conductive lines and the semiconductor substrate. An isolation pattern is interposed between the first and second conductive lines. A first vertical structure passes through the first conductive line and conductive patterns. A second vertical structure passes through the second conductive line and conductive patterns. Auxiliary patterns are disposed between the first and second conductive lines and passing through the conductive patterns.

In some embodiments, the semiconductor device may further include a third vertical structure passing through the first conductive line and the conductive patterns, and spaced apart from the first vertical structure, and a fourth vertical structure passing through the second conductive line and the conductive patterns and spaced apart from the second vertical structure. A distance between the first and second vertical structures may be greater than a distance between the third and fourth vertical structures.

In other embodiments, the semiconductor device may further include a first bit line intersecting the first and second conductive lines and overlapping the first and second vertical structures, and a second bit line intersecting the first and second conductive lines and overlapping the third and fourth vertical structures. The first bit line may overlap one of the auxiliary patterns, and the second bit line may pass between the auxiliary patterns in a plan view.

In still other embodiments, each of the first and second vertical structures may include a semiconductor pattern electrically connected to the semiconductor substrate.

In still other embodiments, the first conductive line may have a first width between the isolation pattern located between the auxiliary patterns, and the first insulating vertical pattern, and a second width smaller than the first width, between the first insulating vertical pattern and the auxiliary patterns.

In still other embodiments, the auxiliary patterns may be spaced apart from each other and in direct contact with the isolation pattern.

In still other embodiments, the isolation pattern may have a line shape.

In still other embodiments, the auxiliary patterns may pass through the conductive patterns and the isolation pattern.

In still other embodiments, the semiconductor device may further include interlayer insulating layers repeatedly and alternatively stacked with the conductive patterns. The auxiliary patterns may pass through the conductive patterns and the interlayer insulating layers.

In still other embodiments, the auxiliary patterns may have upper surfaces located at the same level as upper surfaces of the first and second vertical structures.

In still other embodiments, the first and second vertical structures may have upper surfaces located at a different level from the isolation pattern.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 31A and 31B are cross-sectional views showing still another modified example of the semiconductor device in accordance with the embodiment of the inventive concept;

DETAILED DESCRIPTION OF THE EMBODIMENTS

Figure 1:
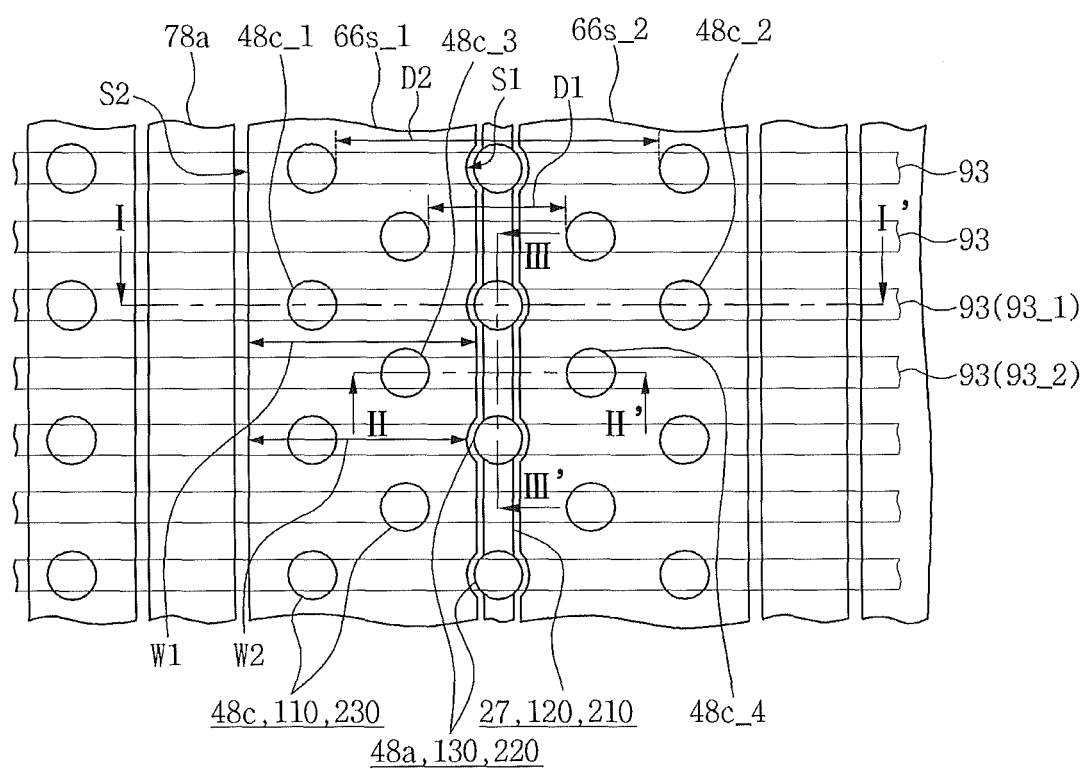
FIG. 1 is a plan view showing a semiconductor device in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First, a semiconductor device in accordance with an embodiment of the inventive concept will be described with reference to FIGS. 1, 2A, and 2B. FIG. 2A shows a cross-sectional view taken along line I-I' in FIG. 1. In FIG. 2B, a part denoted by character A shows a region taken along line II-II' in FIG. 1, and a part denoted by character B shows a region taken along line III-III' in FIG. 1

Figure 2A:
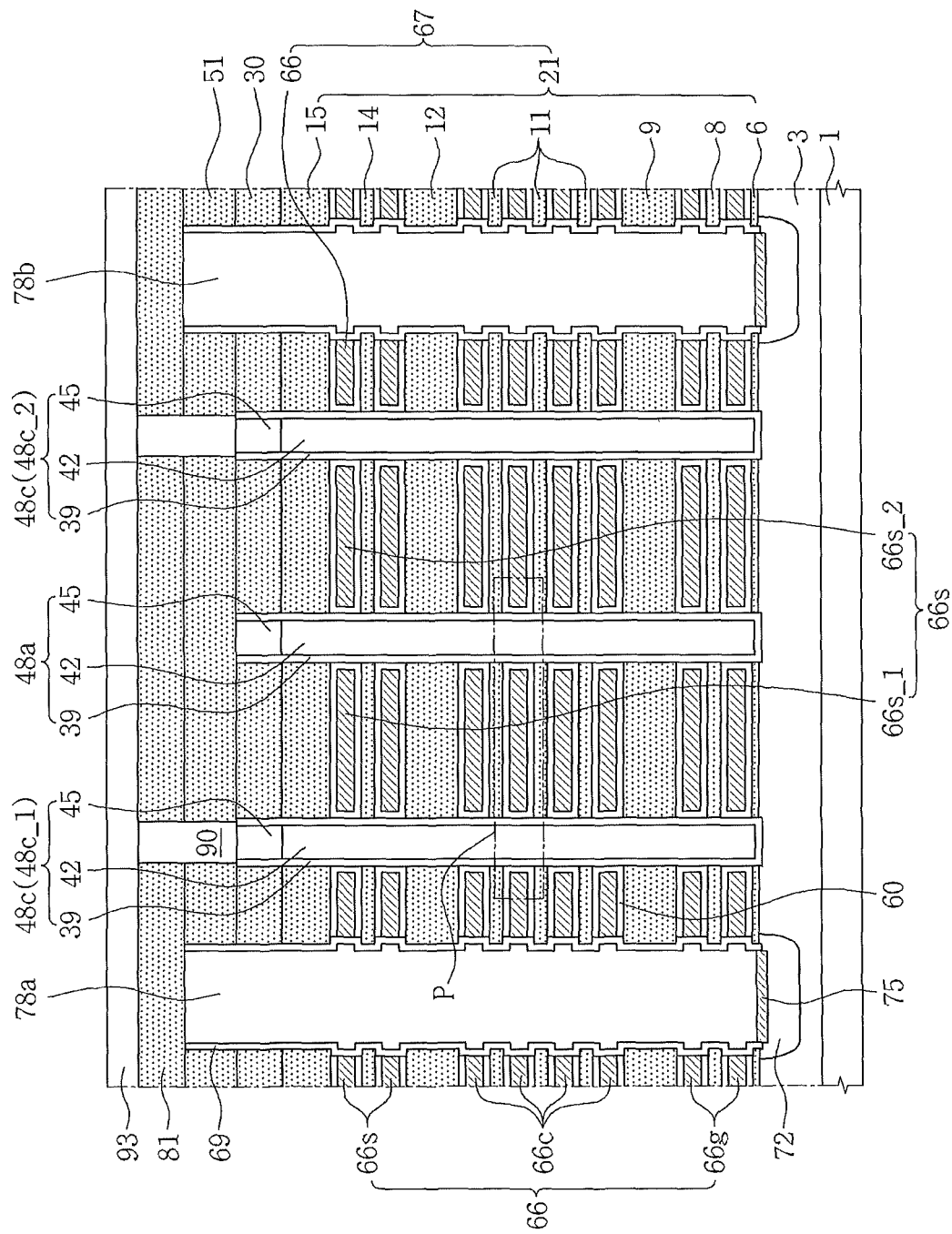
FIGS. 2A and 2B are cross-sectional views showing a semiconductor device in accordance with an embodiment of the inventive concept.
Figure 2B:
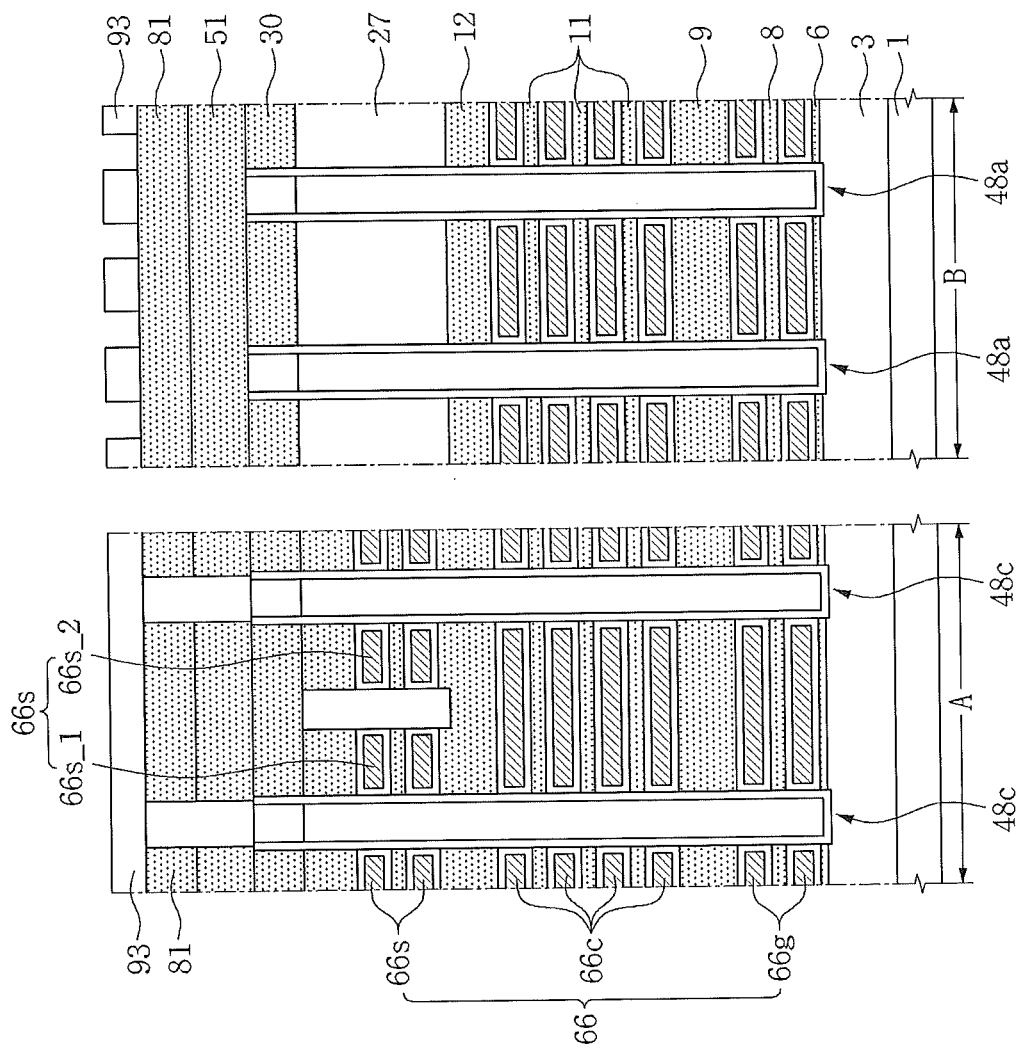

Referring to FIGS. 1, 2A, and 2B, a substrate 1 may be provided. The substrate 1 may be a semiconductor substrate. For example, the substrate 1 may be a silicon substrate, a germanium substrate, or a silicon-germanium substrate. On the other hand, the substrate 1 may be a silicon on insulating layer (SOI). The substrate 1 may include a memory cell array region in which memory cells are formed, and a peripheral circuit region in which peripheral circuits for operating the memory cells are formed. A well region 3 may be provided in the substrate 1.

Insulating vertical patterns 78a and 78b may be disposed on the substrate 1. The insulating vertical patterns 78a and 78b may have line shapes spaced apart from each other. The insulating vertical patterns 78a and 78b may be parallel to each other. The insulating vertical patterns 78a and 78b may include a first insulating vertical pattern 78a and second insulating vertical pattern 78b which are adjacent to each other. The first and second insulating vertical patterns 78a and 78b may be formed of an insulating material such as silicon oxide.

A stacked structure 67 may be disposed on the substrate 1. The stacked structure 67 may be disposed between the insulating vertical patterns 78a and 78b.

The stacked structure 67 may include a plurality of interlayer insulating layers 21 and a plurality of conductive patterns 66. The interlayer insulating layers 21 may be spaced apart from each other and vertically arranged on the substrate 1 located between the insulating vertical patterns 78a and 78b. The conductive patterns 66 may be disposed between the interlayer insulating layers 21 spaced apart from each other. The interlayer insulating layers 21 and the conductive patterns 66 may be alternately and repeatedly stacked on the substrate 1 located between the insulating vertical patterns 78a and 78b.

The conductive patterns 66 may include one or more lower conductive patterns 66g, a plurality of intermediate conductive patterns 66c, and a plurality of upper conductive patterns 66s. The intermediate conductive patterns 66c may be located at a higher level than the lower conductive patterns 66g, and the upper conductive patterns 66s may be located at a higher level than the intermediate conductive patterns 66c.

The upper conductive patterns 66s may include a first conductive line 66s_1 and a second conductive line 66s_2 which are spaced apart from each other in the same plane. The first and second conductive lines 66s_1 and 66s_2 may be located at the same level and spaced apart from each other.

In the embodiments, the conductive patterns 66 may be gate electrodes or gate lines of a semiconductor memory device. For example, the intermediate conductive patterns 66c may be cell gate electrodes of a non-volatile memory device, and the one or more lower conductive patterns 66g interposed between the lowermost cell gate electrode among the cell gate electrodes and the substrate 1 may be ground selection gate electrodes, and the upper conductive patterns 66s located on the cell gate electrodes 66c may be string selection gate electrodes or string selection gate lines.

The interlayer insulating layers 21 may include a lowermost insulating layer 6 interposed between the lower conductive patterns 66g and the substrate 1, a lower insulating layer 8 interposed between the lower conductive patterns 66g, a lower interlayer insulating layer 9 interposed between the lower conductive patterns 66g and the intermediate conductive patterns 66c, an intermediated insulating layers 11 interposed between the intermediate conductive patterns 66c, an upper interlayer insulating layer 12 interposed between the intermediate conductive patterns 66c and the upper conductive patterns 66s, an upper insulating layer 14 located between the upper conductive patterns 66s disposed thereabove and therebelow, and the uppermost insulating layer 15 disposed on the upper conductive patterns 66s. The upper interlayer insulating layer 12 may be formed to have a greater vertical thickness than the upper insulating layer 14 and each of the intermediate insulating layers 11.

The conductive patterns 66 may be formed to include at least one of a doped semiconductor (e.g., a doped silicon, etc.), a metal (e.g., tungsten, copper, aluminum, etc.), a conductive metal nitride (e.g., titanium nitride, tantalum nitride, tungsten nitride, etc.), a conductive metal-semiconductor compound (e.g., a metal silicide, etc.), and a transition metal (e.g., titanium, tantalum, etc), etc. The interlayer insulating layers 21 may be formed of an insulating material such as silicon oxide, etc.

An isolation pattern 27 may be disposed between the first conductive line 66s_1 and the second conductive line 66s_2. In a memory device, the isolation pattern 27 may be a pattern to separate or electrically isolate the first and second conductive lines 66s_1 and 66s_2 which function as a string selection gate line of the memory device. The isolation pattern 27 may be referred to as a string selection isolation pattern. The isolation pattern 27 may be formed of an insulating material such as silicon oxide, etc.

A first capping layer 30 may be disposed on the stacked structure 67 and the isolation pattern 27. The first capping layer 30 may be disposed between the insulating vertical patterns 78a and 78b. The first capping layer 30 may formed of silicon oxide.

Vertical structures 48c passing through the first capping layer 30, interlayer insulating layers 21, and conductive patterns 66 may be disposed. The vertical structures 48c may pass through the first capping layer 30, the interlayer insulating layers 21, and the conductive patterns 66, and may be physically connected to the substrate 1. For example, the vertical structures 48c may be electrically connected to the well region 3 of the substrate 1. In a plan view, the vertical structures 48c may be arranged in bilateral symmetry with respect to the isolation pattern 27.

The vertical structures 48c may include first to fourth vertical structures 48c_1, 48c_2, 48c_3, and 48c_4.

The first and third vertical structures 48c_1 and 48c_3 may be located between the first insulating vertical pattern 78a and the isolation pattern 27, and adjacent to each other. The first and third vertical structures 48c_1 and 48c_3 may pass through the first capping layer 30, the interlayer insulating layers 21, the first conductive line 66s_1, the intermediate conductive patterns 66c, and the lower conductive patterns 66g. The first vertical structure 48c_1 may be closer to the first insulating vertical pattern 78a than the isolation pattern 27. The third vertical structure 48c_3 may be closer to the isolation pattern 27 than the first insulating vertical pattern 78a.

The second and fourth vertical structures 48c_2 and 48c_4 may be located between the second insulating vertical pattern 78b and the isolation pattern 27, and adjacent to each other. The second and fourth vertical structures 48c_2 and 48c_4 may pass through the first capping layer 30, the interlayer insulating layers 21, the second conductive line 66s_2, the intermediate conductive patterns 66c, and the lower conductive patterns 66g. The second vertical structure 48c_2 may be closer to the second insulating vertical pattern 78b than the isolation pattern 27. The fourth vertical structure 48c_4 may be closer to the isolation pattern 27 than the second insulating vertical pattern 78b. The second and fourth vertical structures 48c_2 and 48c_4 may be disposed to form a mirror structure with the first and third vertical structures 48c_1 and 48c_3, across the isolation pattern 27.

The first and second vertical structures 48c_1 and 48c_2 may be arranged in symmetry with respect to the isolation pattern 27, and the third and fourth vertical structures 48c_3 and 48c_4 may be arranged in symmetry with respect to the isolation pattern 27. A distance D2 between the first and second vertical structures 48c_1 and 48c_2 may be greater than a distance D1 between the third and fourth vertical structures 48c_3 and 48c_4.

Auxiliary patterns 48a may be disposed to pass through the first capping layer 30, the isolation pattern 27, the interlayer insulating layers 21, the intermediate conductive patterns 66c, and the lower conductive patterns 66g. The auxiliary patterns 48a may pass through the isolation pattern 27 and be in direct contact with the isolation pattern. The auxiliary patterns 48a, in a plan view, may be disposed between the first and second conductive lines 66s_1 and 66s_2.

The auxiliary patterns 48a may be disposed between the vertical structures 48c_1 and 48c_2 which are facing each other across the isolation pattern 27 and have a relatively large distance therebetween, and may not be disposed between the vertical structures 48c_3 and 48c_4 which are facing each other across the isolation pattern 27 and have a relatively small distance therebetween.

One of the auxiliary patterns 48a may be disposed between the first and second vertical structures 48c_1 and 48c_2, and may not be disposed between the third and fourth vertical structures 48c_3 and 48c_4.

The auxiliary patterns 48a may be formed at the same level as the vertical structures 48c. The auxiliary patterns 48a may be formed to have the same cross-sectional structure as the vertical structures 48c. The auxiliary patterns 48a may be formed of the same material as the vertical structures 48c Each of the vertical structures 48c and auxiliary patterns 48a may include a semiconductor pattern 39. For example, each of the vertical structures 48c and auxiliary patterns 48a may include an insulating core pattern 42, a pad pattern formed on the core pattern 42, and the semiconductor pattern 39 which is interposed between a bottom of the core pattern 42 and the substrate 1 and extend to sides of the core pattern 42 and pad pattern 45. The semiconductor pattern 39 may be formed of a semiconductor material in which a channel area of a transistor can be formed. For example, the semiconductor pattern 39 may be formed of a semiconductor material such as silicon.

On the other hand, the vertical structures 48c and the auxiliary patterns 48a may be formed as pillar-shaped semiconductor patterns.

A dielectric 60 including a part interposed between the conductive patterns 66 and the vertical structures 48c, a part interposed between the conductive patterns 66 and the interlayer insulating layers 21, and a part interposed between the conductive patterns 66 and the auxiliary patterns 48a, may be disposed.

The first conductive line 66s_1 may have a first width W1 between the first insulating vertical pattern 78a and the isolation pattern 27 located between the auxiliary patterns 48a, and a second width W2 between the first insulating vertical pattern 78a and the auxiliary patterns 48a. The second width W2 may be smaller than the first width W1. Likewise, the second conductive line 66s_2 may have a first width W1 between the second insulating vertical pattern 78b and the isolation pattern 27 located between the auxiliary patterns 48a, and a second width W2, smaller than the first width W1, between the second insulating vertical pattern 78b and the auxiliary patterns 48a.

Sides of the first and second conductive lines 66s_1 and 66s_2 facing each other across the isolation pattern 27 and auxiliary patterns 48a may have a curved shape in a plan view, and sides of the first and second conductive lines 66s_1 and 66s_2 adjacent to the insulating vertical patterns 78a and 78b may have a line shape in a plan view. For example, the first conductive line 66s_1 may have a first side S1 and second side S2 opposing each other. The first side S1 of the first conductive line 66s_1 may be closer to the isolation pattern 27 and auxiliary patterns 48a than the first insulating vertical pattern 78a, and may have a curved shape in a plan view. The second side S2 of the first conductive line 66s_1 may be closer to the first insulating vertical pattern 78a than the isolation pattern 27 and auxiliary patterns 48a, and may have a line shape in a plan view.

A second capping layer 51 covering the vertical structures 48c, the auxiliary patterns 48a, and the first capping layer 30, may be disposed. The second capping layer 51 may be located between the insulating vertical patterns 78a and 78b. The second capping layer may be formed of silicon oxide.

A capping interlayer insulating layer 81 covering the first and second insulating vertical patterns 78a and 78b, and the second capping layer 51, may be disposed. The capping interlayer insulating layer 81 may be formed of an insulating layer such as silicon oxide.

Insulating spacers 69 may be disposed on sides of the insulating vertical patterns 78a and 78b. The insulating spacers 69 may be formed of an insulating material such as silicon nitride or silicon oxide. The insulating spacers 69 may be interposed between the insulating vertical patterns 78a and 78b and the stacked structures 67, and between the insulating vertical patterns 78a and 78b and the first and second capping layers 30 and 51.

Impurity regions 72 may be disposed in the substrate 1 located under the insulating vertical patterns 78a and 78b. The impurity regions 72 may have a different conductive type from the well region 3. A metal-semiconductor compound 75 such as a metal silicide may be disposed between the insulating vertical patterns 78a and 78b and the impurity region 72.

Conductive contact structures 90 may be disposed to pass through the capping interlayer insulating layer 81 and the second capping layer 51, and electrically connected to the vertical structures 48c.

Bit lines 93 electrically connected to the contact structures 90 may be disposed on the capping interlayer insulating layer 81. The bit lines 93 may have line shapes parallel to each other.

The bit lines 93 may have line shapes in a direction intersecting with the first and second conductive lines 66s_1 and 66s_2. For example, in a plan view, the bit lines 93 may have line shapes perpendicularly intersecting with the first and second conductive lines 66s_1 and 66s_2.

The bit lines 93 may overlap the vertical structures 48c. The contact structures 90 may be interposed between the vertical structures 48c and the bit lines 93, and electrically connect the vertical structures 48c and the bit lines 93.

The bit lines 93 may be spaced apart from the auxiliary patterns 48a.

Among the bit lines 93, one of a pair of bit lines 93 adjacent to each other may overlap one of the auxiliary patterns 48a, and the other one may not overlap the auxiliary patterns 48a.

The bit lines 93 may include a first bit line 93_1 and a second bit line 93_2 which are adjacent to each other. The first bit line 93_1 may overlap the first and second vertical structures 48c_1 and 48c_2, and overlap the auxiliary pattern 48a located between the first and second vertical structures 48c_1 and 48c_2. The second bit line 93_2 may overlap the third and fourth vertical structures 48c_3 and 48c_4, and may not overlap the auxiliary patterns 48a.

An insulating material may be interposed between the bit line 93_1 overlapping the auxiliary patterns 48a among the bit lines, and the auxiliary patterns 48a. For example, the capping interlayer insulating layer 81 and second capping layer 51 interposed between the bit lines 93 and auxiliary patterns 48a, may insulate the bit lines 93 from the auxiliary patterns 48a.

Figure 3:
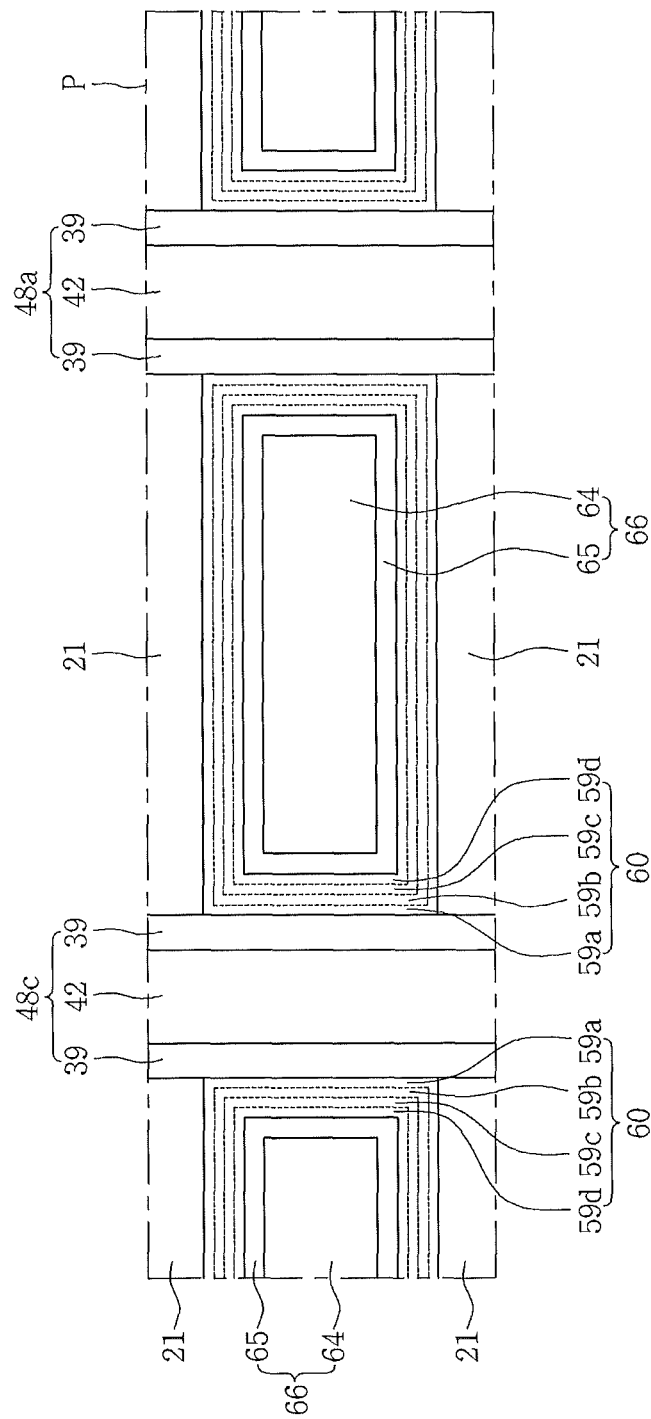
FIG. 3 is a partially enlarged view of a portion P of FIG. 2A.

FIG. 3 is a partly enlarged view showing the part P of FIG. 2A. The conductive patterns 66 and the dielectric 60 will be described with reference to FIGS. 1, 2A, and 2B as well as FIG. 3.

Referring to FIGS. 1, 2A and 2B, and 3, each of the conductive patterns 66 may include a first conductive pattern 64 and a second conductive pattern 65.

The first conductive pattern 64 may be interposed between the interlayer insulating layers 21.

The second conductive pattern 65 may include a part interposed between the first conductive pattern 64 and the interlayer insulating layers 21, a part interposed between the first conductive pattern 64 and the vertical structures 48c, and a part interposed between the first conductive pattern 64 and the auxiliary patterns 48a. The first conductive pattern 64 may be formed of a conductive material such as tungsten, and the second conductive pattern 65 may be formed of a conductive metal nitride such as titanium nitride, tantalum nitride, or tungsten nitride.

The dielectric 60 may be formed in a plurality of layers including an element for storing information of a memory device. The dielectric 60 may include a first dielectric layer 59a, a second dielectric layer 59b, a third dielectric layer 59c, and a fourth dielectric layer 59d.

In the dielectric 60 located between the vertical structures 48c and the conductive patterns 66, the first dielectric layer 59a, the second dielectric layer 59b, the third dielectric layer 59c, and the fourth dielectric layer 59d may be sequentially arranged in a direction from the vertical structures 48c to the conductive patterns 66. The first dielectric layer 59a may be adjacent to or closed to the vertical structures 48c, and the fourth dielectric layer 59d may be adjacent to or closed to the conductive patterns 66. In addition, the second and third dielectric layers 59b and 59c may be interposed between the first dielectric 59a and the fourth dielectric layer 59d. The second dielectric layer 59b may be interposed between the third dielectric layer 59c and the first dielectric layer 59a.

The first dielectric layer 59a may be a tunnel dielectric layer, the second dielectric layer 59b may be a layer for storing information of the non-volatile memory device, the third dielectric layer 59c may be a barrier dielectric layer, and the fourth dielectric layer 59d may be a blocking dielectric layer.

The first dielectric layer 59a may include at least one of a silicon oxide layer and a nitrogen-doped silicon oxide layer.

The second dielectric layer 59b may be a material layer capable of trapping charge to store information. The second dielectric layer 59b may be formed of a material which can trap and retain charge injected from the semiconductor pattern 39 through the first dielectric layer 59a as a tunnel dielectric layer, or remove trapped charge in the second dielectric layer 59b for storing information, depending on an operation condition of the non-volatile memory device. For example, the second dielectric layer 59b may include at least one of silicon nitride and a high dielectric material. The high dielectric material may included a dielectric material, such as aluminum oxide (AlO), zirconium oxide (ZrO), hafnium oxide (HfO), or lanthanum oxide (LaO), which has a higher dielectric constant than silicon oxide.

The third dielectric layer 59c may be formed of a dielectric material, such as silicon oxide, having an energy band-gap greater than an energy band-gap of a high dielectric material.

The fourth dielectric layer 59d may include a high dielectric material having a higher dielectric constant, for example, a metal oxide such as HfO and/or AlO, than the first dielectric layer 59a as the tunnel dielectric layer.

Figure 4A:
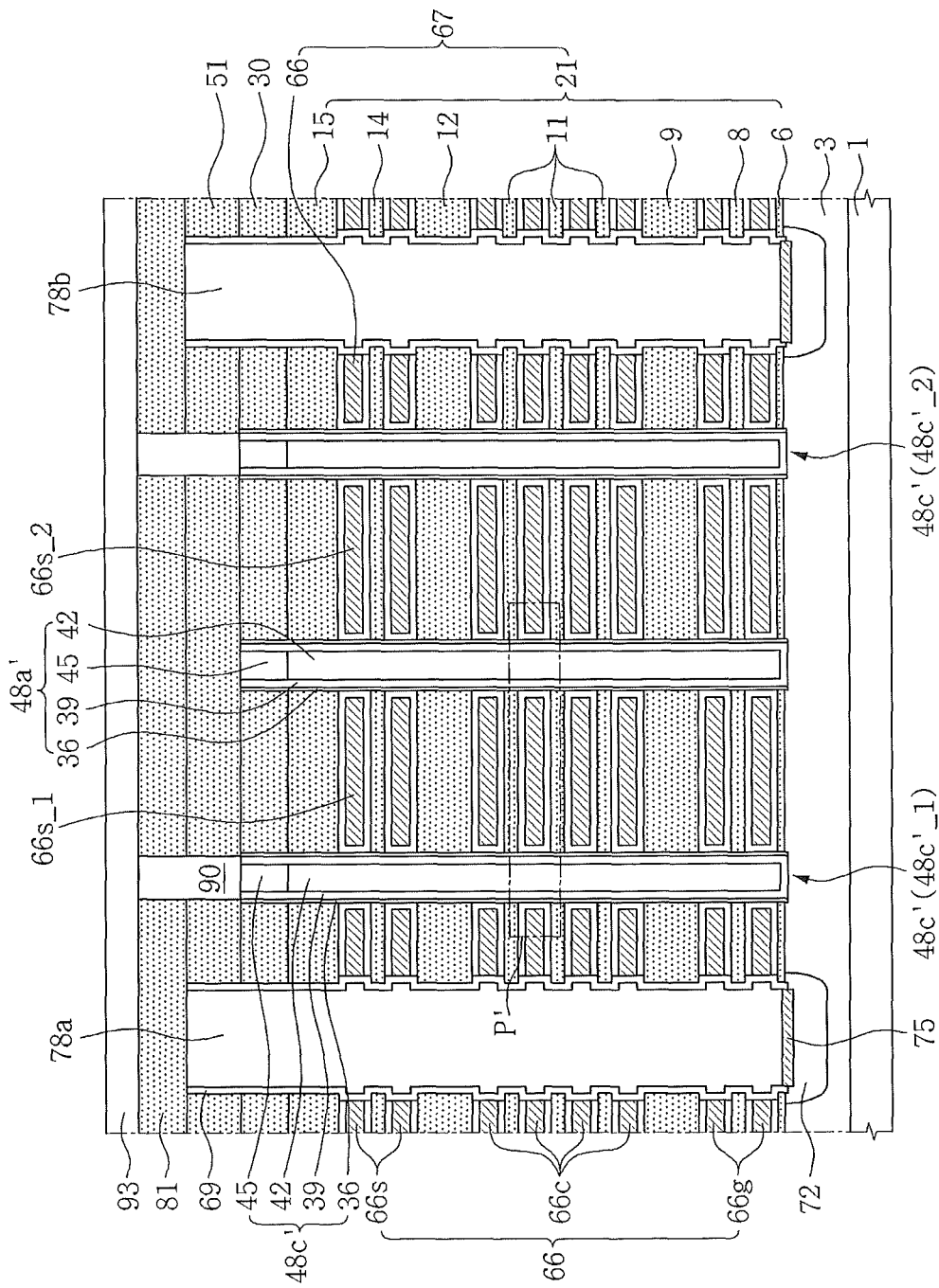
FIGS. 4A and 4B are cross-sectional views showing a modified example of the semiconductor device in accordance with the embodiment of the inventive concept.
Figure 4B:
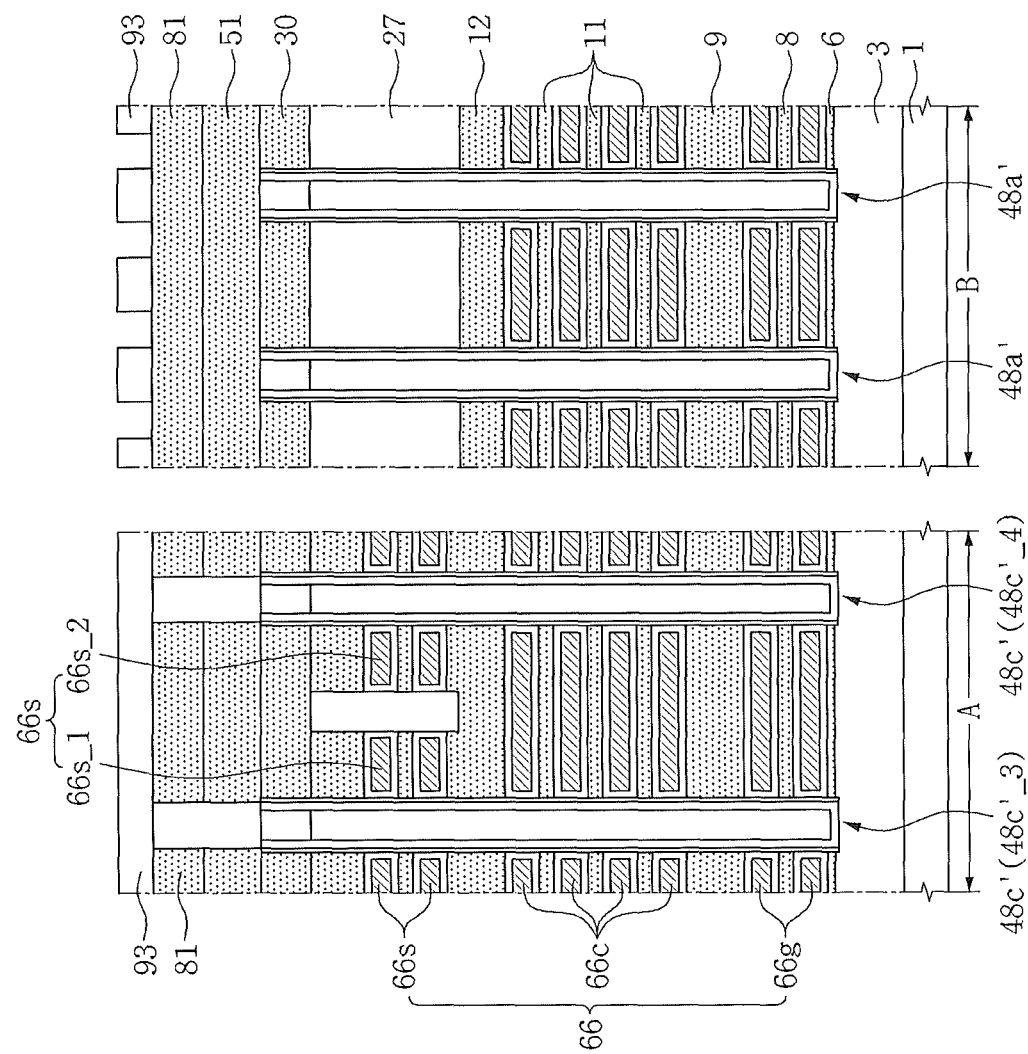
Figure 5:
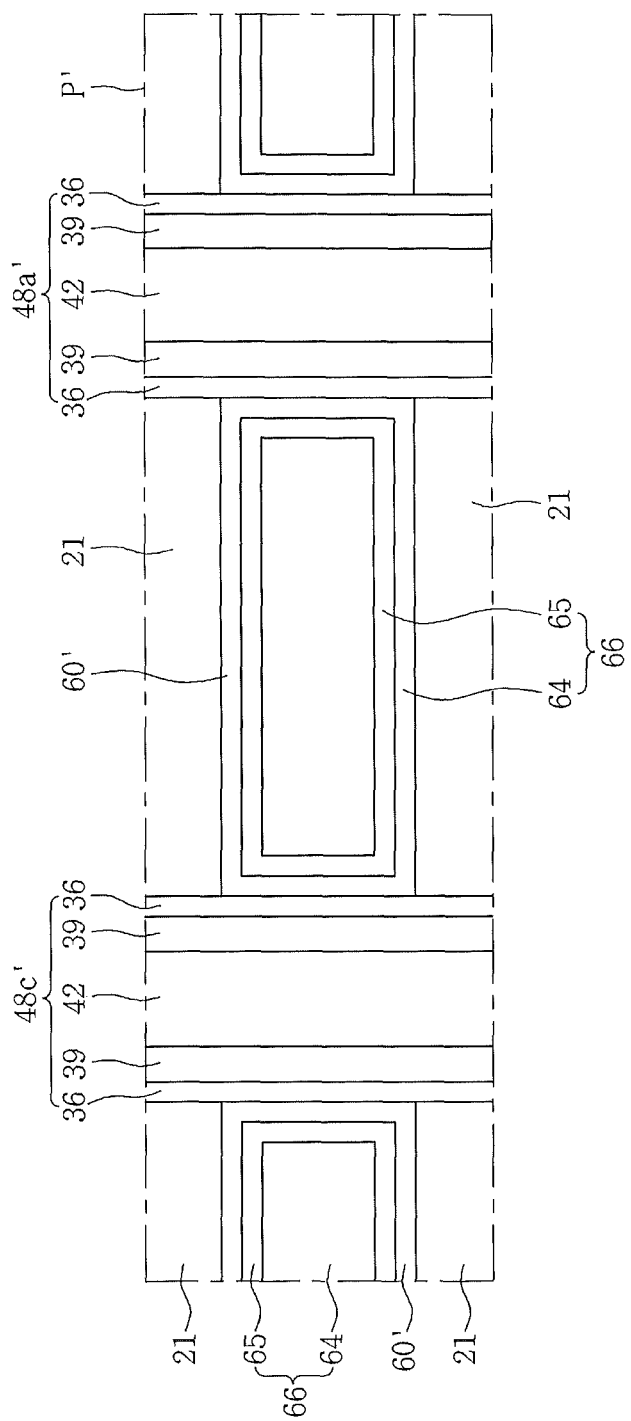
FIG. 5 is a partially enlarged view of a portion P' of FIG. 4A.

In some embodiments, each of the vertical structures 48c may include a vertical dielectric. Likewise, a semiconductor device having the vertical structures 48c including the vertical dielectric will be described with respect to FIGS. 4A, 4B, and 5. FIG. 4A shows a cross-sectional view taken along line I-I' in FIG. 1. In FIG. 4B, a part denoted by character A shows a region taken along line II-II' in FIG. 1, and a part denoted by character B shows a region taken along line III-III' in FIG. 1. FIG. 5 is a partly enlarged view showing the part P of FIG. 4A.

Referring to FIGS. 4A, 4B, and 5, each of the vertical structures 48c' and the auxiliary patterns 48a' may include a vertical dielectric 36. For example, each of the vertical structures 48c' and the auxiliary patterns 48a' may include the core pattern 42, the pad pattern 45 formed on the core pattern 42, the semiconductor pattern 39 interposed between the bottom of the core pattern 42 and the substrate 1 and extending to sides of the core pattern 42 and pad pattern 45, and the vertical dielectric 36 disposed on side of the semiconductor pattern 39.

One of the vertical dielectric 36 and the dielectric 60' may include an element for storing information of the non-volatile memory device.

At least one of the vertical dielectric 36 and the dielectric 60' may be formed as a multilayer. Likewise, an embodiment in which at least one of the vertical dielectric 36 and the dielectric 60' is formed as a multilayer, will be described with respect to FIG. 6. Here, FIG. 6 is a partly enlarged view showing the part P' in FIG. 4A.

Figure 6:
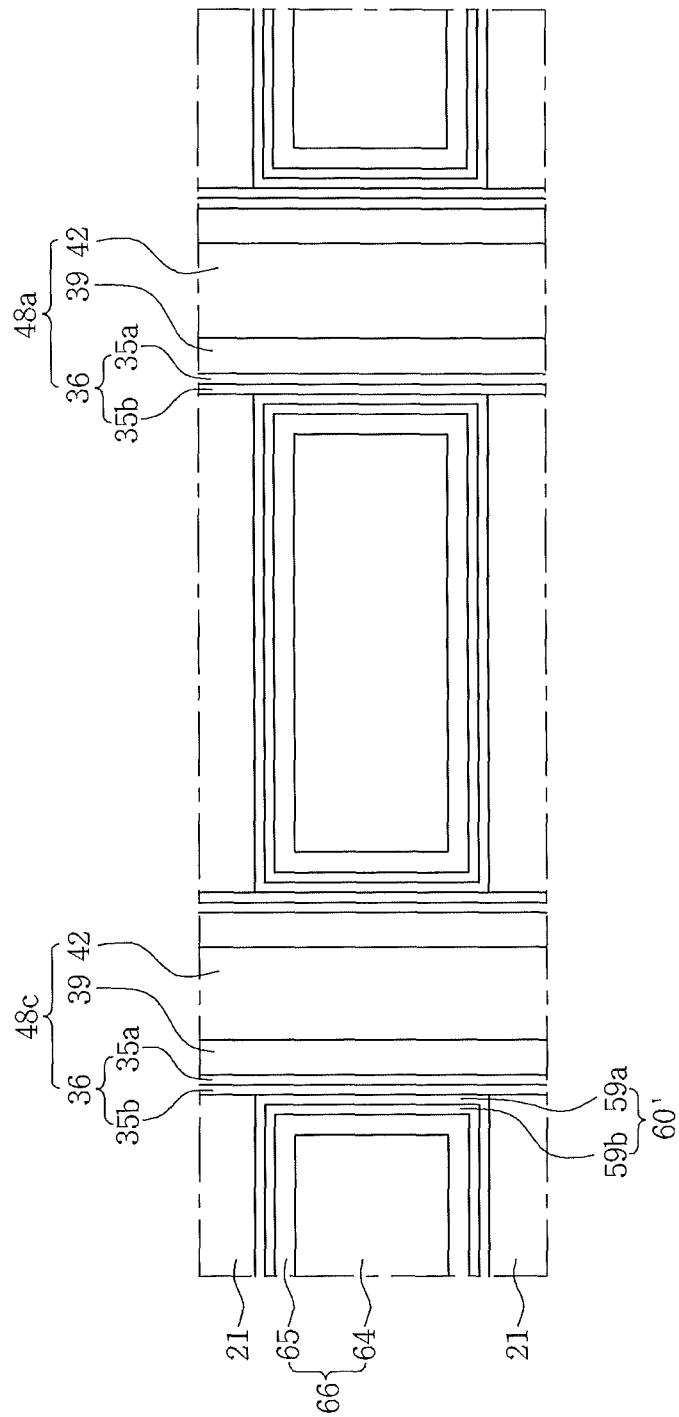
FIG. 6 is a cross-sectional view showing a modified example of FIG. 5.

Referring to FIG. 6, one of the vertical dielectric 36 and the dielectric 60' may include a layer for storing information and may be formed as a multilayer. For example, the vertical dielectric 36 may include a tunnel dielectric layer 35a and an information storage layer 35b, and the dielectric 60' may include a barrier dielectric layer 59a and a blocking dielectric layer 59b.

In a part located between the semiconductor pattern 39 and the dielectric 60', the tunnel dielectric layer 35a may be closer to the semiconductor pattern 39 than to the dielectric 60', and the information storage layer 35b may be closer to the dielectric 60' than to the semiconductor pattern 39.

In a part located between the conductive patterns 66 and the vertical dielectric 36, the blocking dielectric layer 59b may be closer to the conductive patterns 66 than to the vertical dielectric 36, and the barrier dielectric layer 59a may be closer to the vertical dielectric 36 than to the conductive patterns 66.

Figure 7A:
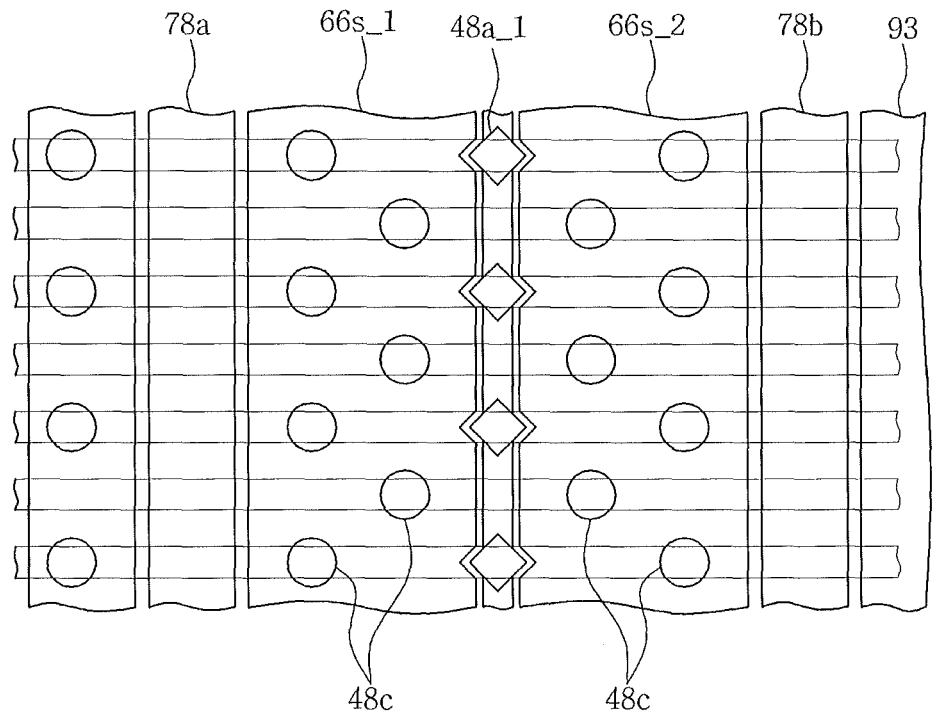
FIGS. 7A to 7C are plan views respectively showing another modified example of the semiconductor device in accordance with the embodiment of the inventive concept.

The auxiliary patterns 48a may be a circular shape in a plan view. However, the inventive concept may not be limited thereto. For example, the auxiliary patterns 48a may be a polygonal or oval shape. For example, as shown in FIG. 7A, in a plan view, square-shaped auxiliary patterns 48a_1 in which two of vertices are close to the insulating vertical patterns 78a and 78b may be disposed.

Figure 7B:
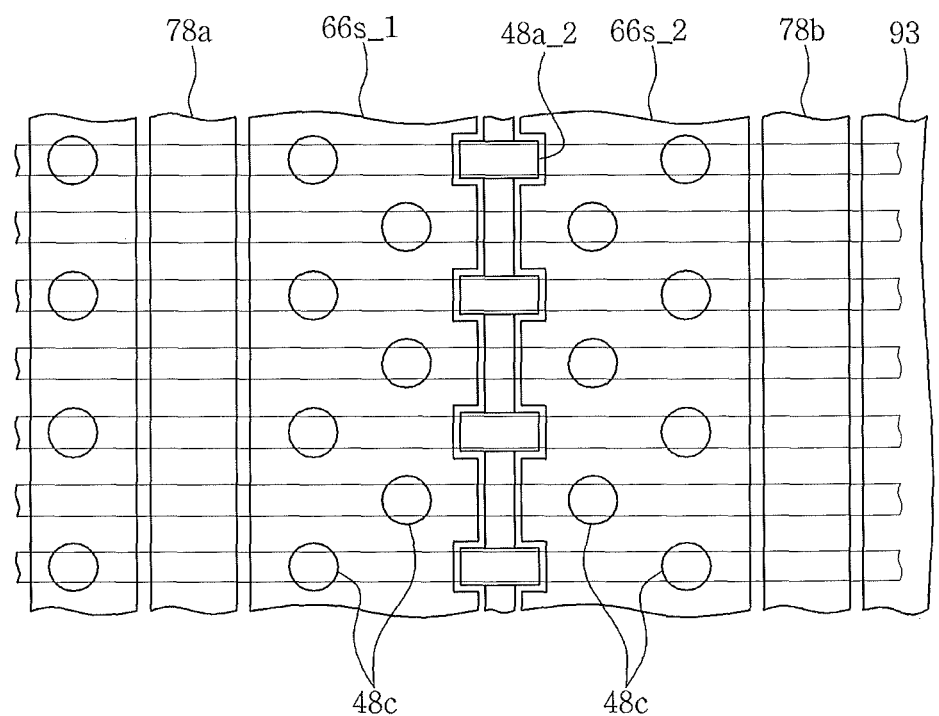

On the other hand, as shown in FIG. 7B, in a plan view, rectangular-shaped auxiliary patterns 48a_2 may be disposed. The rectangular-shaped auxiliary patterns 48a_2, in a plan view, may have a long axis toward the insulating vertical patterns 78a and 78b.

Figure 7C:
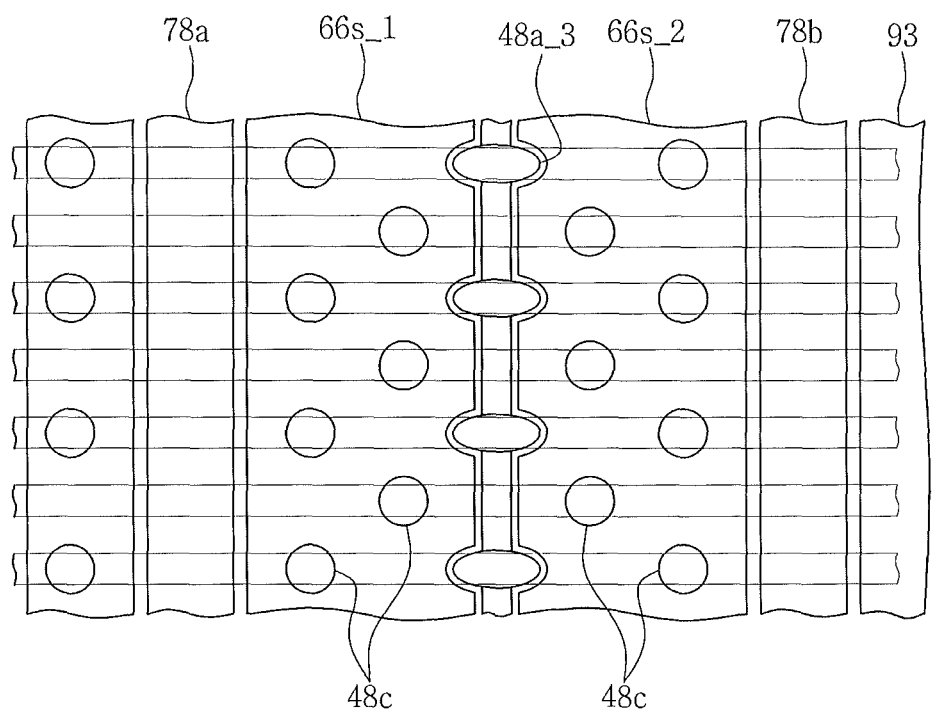

On the other hand, as shown in FIG. 7C, in a plan view, oval-shaped auxiliary patterns 48a_3 may be disposed. The oval-shaped auxiliary patterns 48a_3, in a plan view, may have a long axis toward the insulating vertical patterns 78a and 78b.

Methods of fabricating semiconductor devices described in FIGS. 2A to 4B in accordance with an embodiment of the inventive concept, and a modification thereof will be described. FIGS. 8A and 8B, 9A and 9B, 10A and 10B, 11A and 11B, 12A and 12B, 13A and 13B, 14A and 14B, 15A and 15B, 16A and 16B, and 17A and 17B are cross-sectional views describing a method of fabricating a semiconductor device in accordance with an embodiment of the inventive concept.

In FIGS. 8A to 17B, FIGS. 8A, 9A, 10A, 11A, 12A, 13A, 14A, 15A, 16A, and 17A show cross-sectional views taken along line I-I' in FIG. 1. In FIGS. 8B, 9B, 10B, 11B, 12B, 13B, 14B, 15B, 16B, and 17B, a part denoted by character A shows a region taken along line II-II' in FIG. 1, and a part denoted by character B shows a region taken along line III-III' in FIG. 1.

Figure 8A:
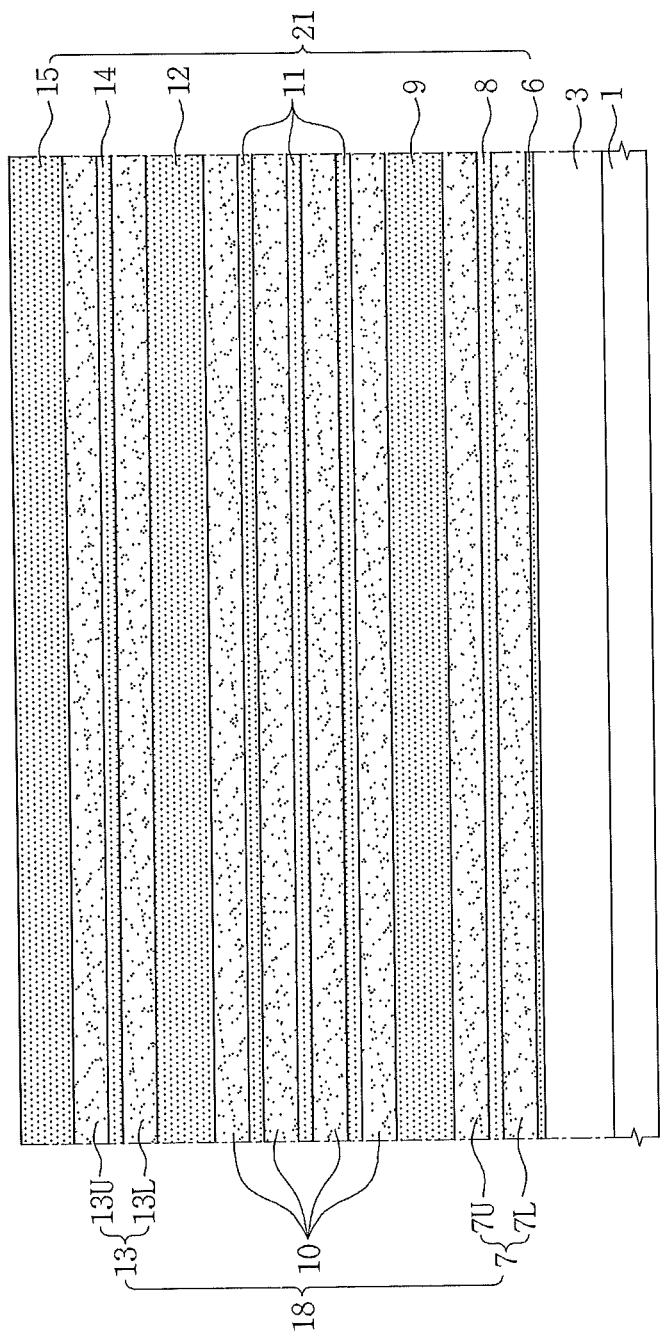
FIGS. 8A to 17B are cross-sectional views showing a method of fabricating a semiconductor device in accordance with an embodiment of the inventive concept.
Figure 8B:
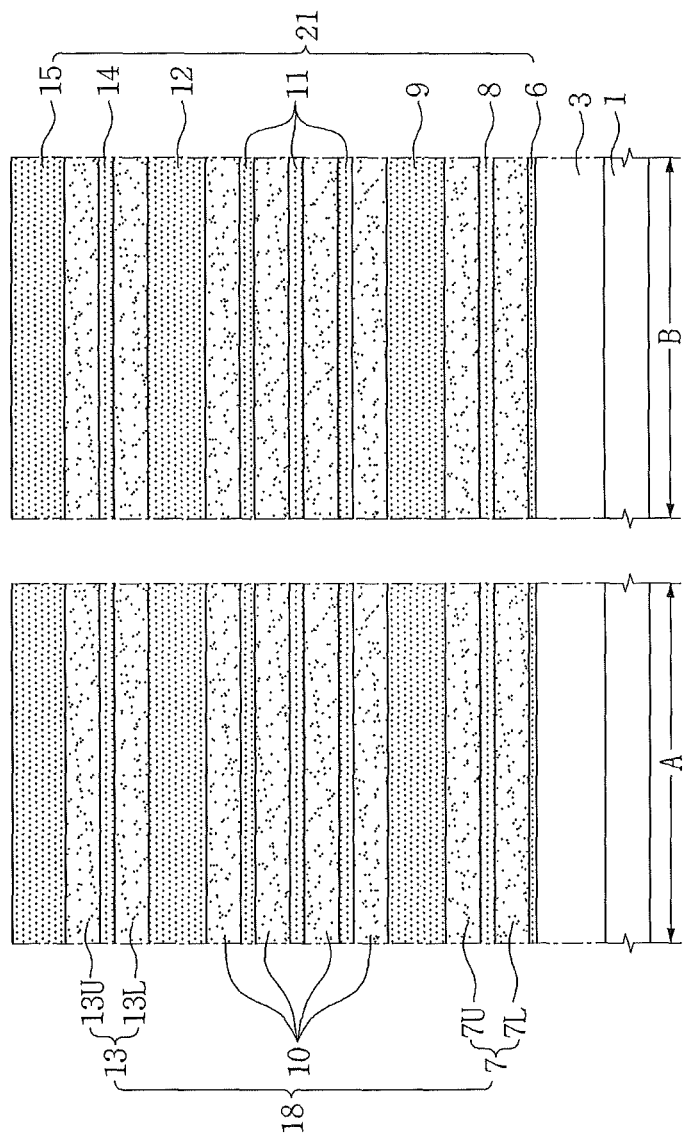

Referring to FIGS. 1, 8A, and 8B, a substrate 1 may be prepared. The substrate 1 may be a semiconductor substrate. For example, the substrate 1 may be a semiconductor substrate formed of a semiconductor material such as silicon. The substrate 1 may include a well region 3 having a first conductivity type. The first conductivity type may be a p-type.

Horizontal layers 18 and 21 may be formed on the substrate 1. The horizontal layers 18 and 21 may include interlayer insulating layers 21 and sacrificial layers 18 which are alternatively, repeatedly, and vertically stacked. The sacrificial layers 18 may be spaced apart from each other by the interlayer insulating layers 21.

The sacrificial layers 18 may be formed of a material having etch selectivity with respect to the interlayer insulating layers 21. For example, the interlayer insulating layers 21 may be formed of an insulating oxide (for example, silicon oxide formed by a CVD method), and the sacrificial layers 18 may be formed of an insulating nitride, etc. For example, when the interlayer insulating layers 21 are formed of silicon oxide, the sacrificial layers 18 may be formed of an insulating nitride such as silicon nitride.

The sacrificial layers 18 may include one or more lower sacrificial layers 7, a plurality of intermediate sacrificial layers 10, and one or more upper sacrificial layers 13.

The intermediate sacrificial layers 10 may be located at a higher level than the lower sacrificial layers 7, and the upper sacrificial layers 13 may be located at a higher level than the intermediate sacrificial layers 10. The lower sacrificial layers 7 may include a first lower sacrificial layer 7L and a second lower sacrificial layer 7U located at a higher level than the first lower sacrificial layer 7L. The upper sacrificial layers 13 may include a first upper sacrificial layer 13L and a second upper sacrificial layer 13U located at a higher level than the first upper sacrificial layer 13L.

The interlayer insulating layers 21 may include a lowermost insulating layer 6 interposed between the first lower sacrificial layer 7L and the substrate 1, a lower interlayer 8 interposed between the first and second lower sacrificial layers 7L and 7U, a lower insulating layer 9 interposed between the second lower sacrificial layer 7U and the intermediate sacrificial layers 10, an intermediate interlayers 11 interposed between the intermediate sacrificial layers 10, an upper insulating layer 12 interposed between the intermediate sacrificial layers 10 and the first upper sacrificial layer 13L, an upper interlayer 14 interposed between the first and second upper sacrificial layers 13L and 13U, and the uppermost insulating layer 15 disposed on the second upper sacrificial layer 13U.

The upper insulating layer 12 may be formed to have a greater vertical thickness than the upper interlayer 14 and each of the intermediate interlayers 11.

Figure 9A:
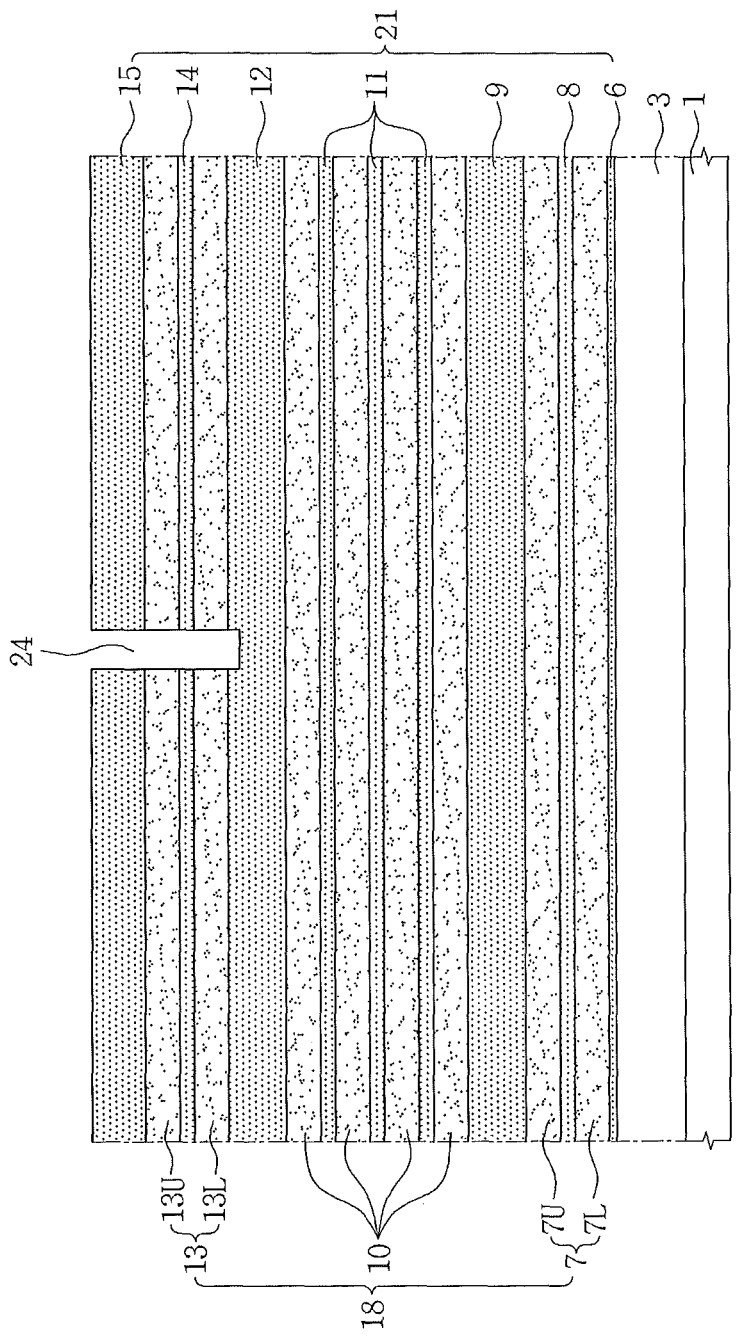
Figure 9B:
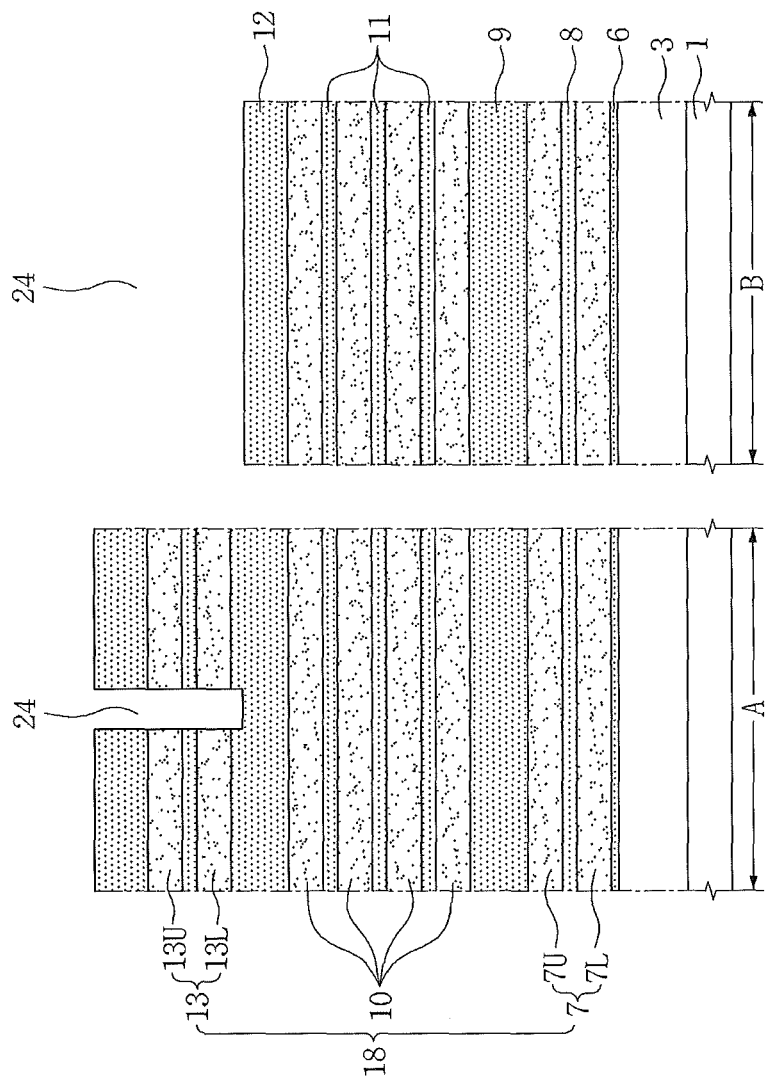

Referring to FIGS. 1, 9A, and 9B, a trench 24 passing through and intersecting some of the horizontal layers 18 and 21 may be formed. The trench 24 may be formed to pass through and intersect at least the upper sacrificial layers 13 among the horizontal layers 18 and 21. The trench 24 may pass through and intersect the uppermost insulating layer 15, the upper sacrificial layers 13, and the upper interlayer 14. The trench 24 may have a line shape in a plan view.

Figure 10A:
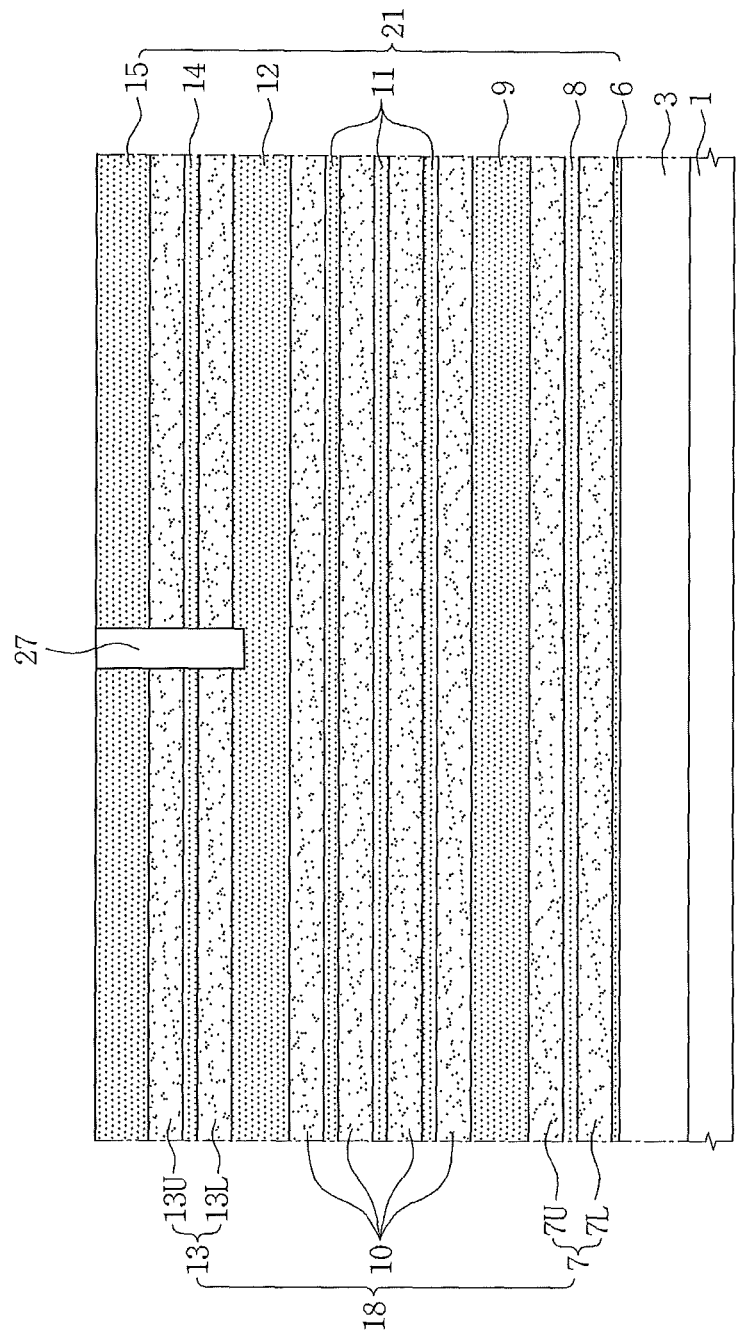
Figure 10B:
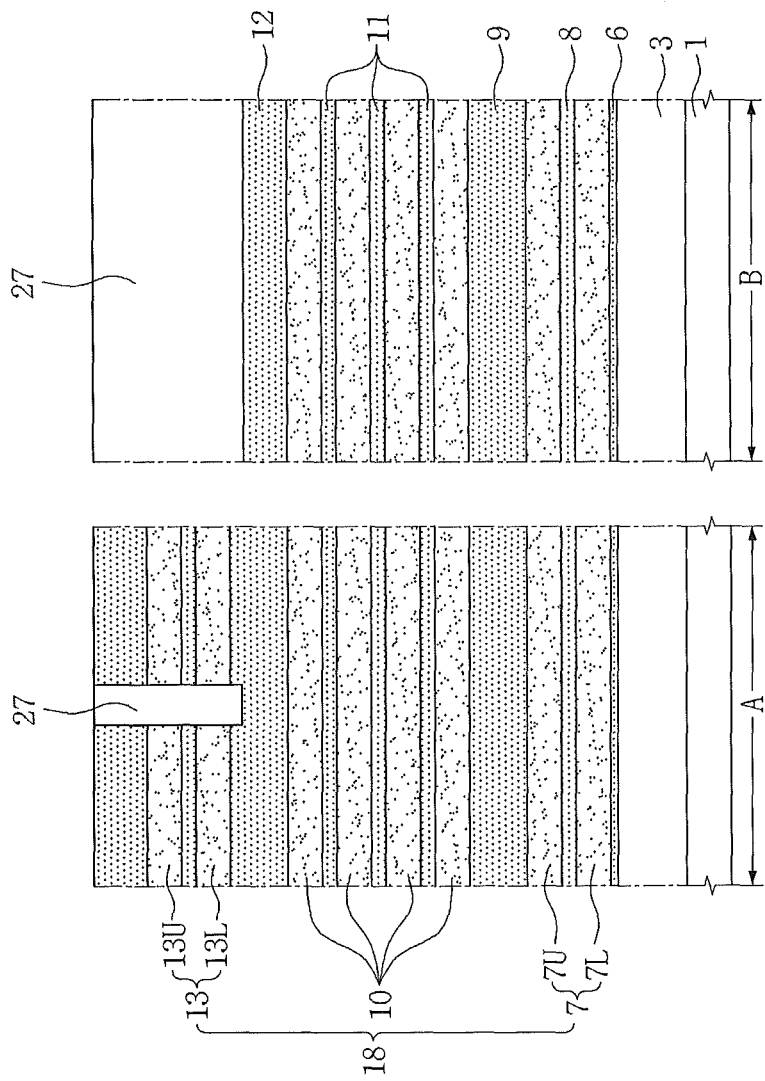

Referring to FIGS. 1, 10A, and 10B, an isolation pattern 27 filling the trench 24 may be formed. The formation of the isolation pattern 27 may include forming a material layer which fills the trench 24 and covers the uppermost insulating layer 15 on the substrate having the trench 24, and planarizing the material layer.

The isolation pattern 27 may be formed of a material layer having etch selectivity with respect to the sacrificial layers 18. For example, the sacrificial layers 18 may be formed of silicon nitride, and the isolation pattern 27 may be formed of an insulating layer such as silicon oxide.

Figure 11B:
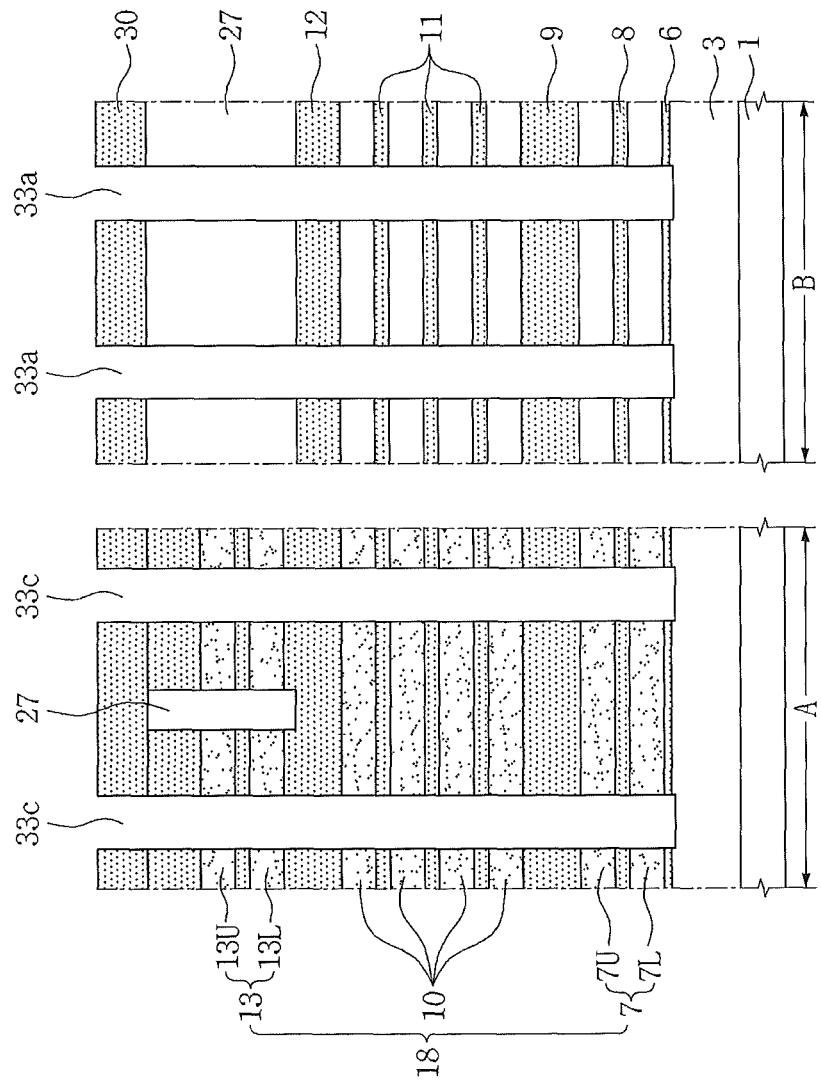

Referring to FIGS. 1, 11A, and 11B, a first capping layer 30 may be formed on the substrate having the isolation pattern 27. The first capping layer 30 may be formed of an insulating material such as silicon oxide, having etch selectivity with respect to the sacrificial layers 18.

First holes 33c which pass through the first capping layer 30 and the horizontal layers 18 and 21 and expose the substrate 1 may be formed, and second holes 33a which pass through the first capping layer 30, the isolation pattern 27, and the horizontal layers 18 and 21 and expose the substrate 1 may be formed. The first and second holes 33c and 33a may be formed at the same time.

The first holes 33c may be spaced apart from the isolation pattern 27. The second holes 33a may overlap the isolation pattern 27. Two or more holes among the second holes 33a may pass through a single isolation pattern 27, and may be spaced apart from each other.

Figure 12A:
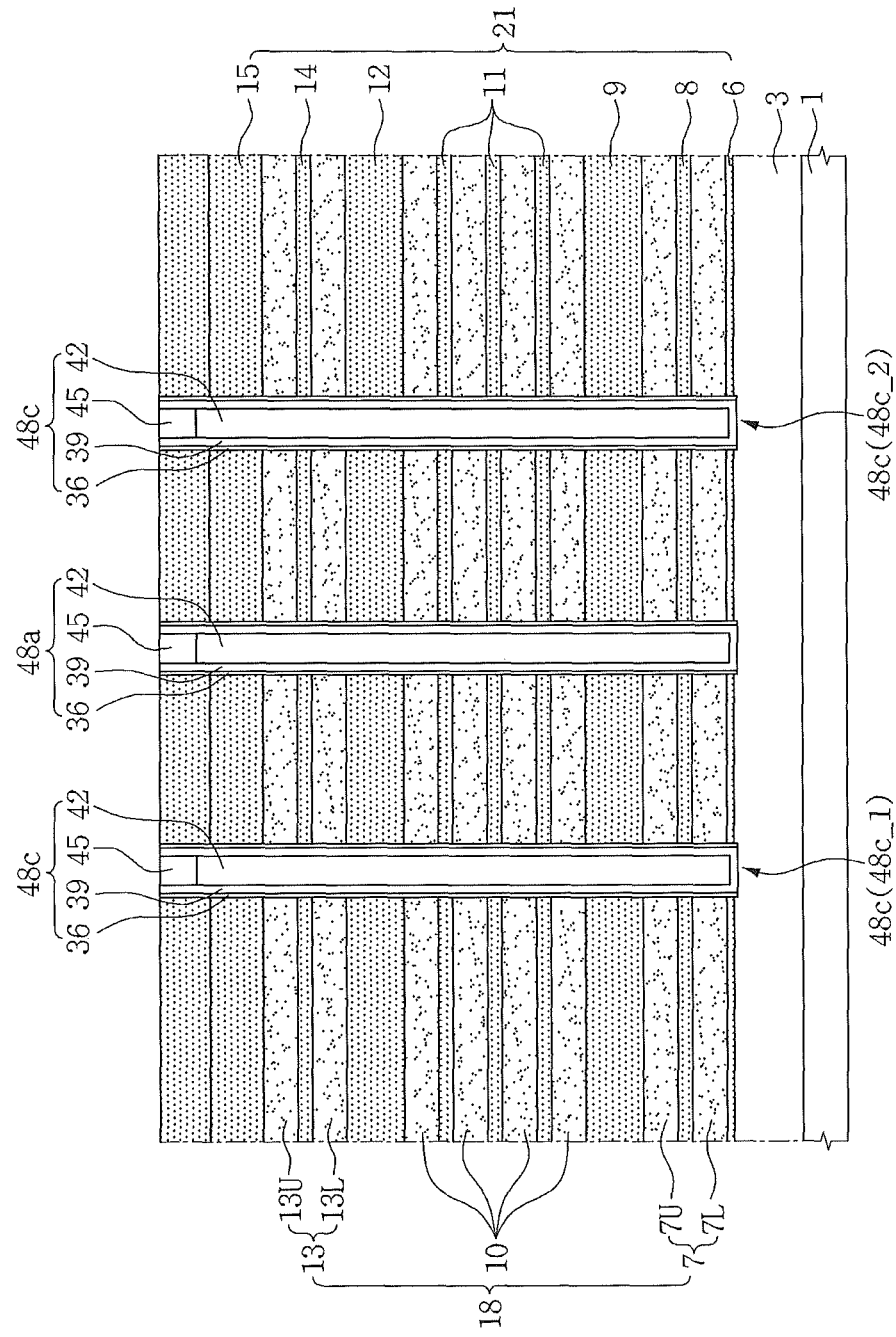
Figure 12B:
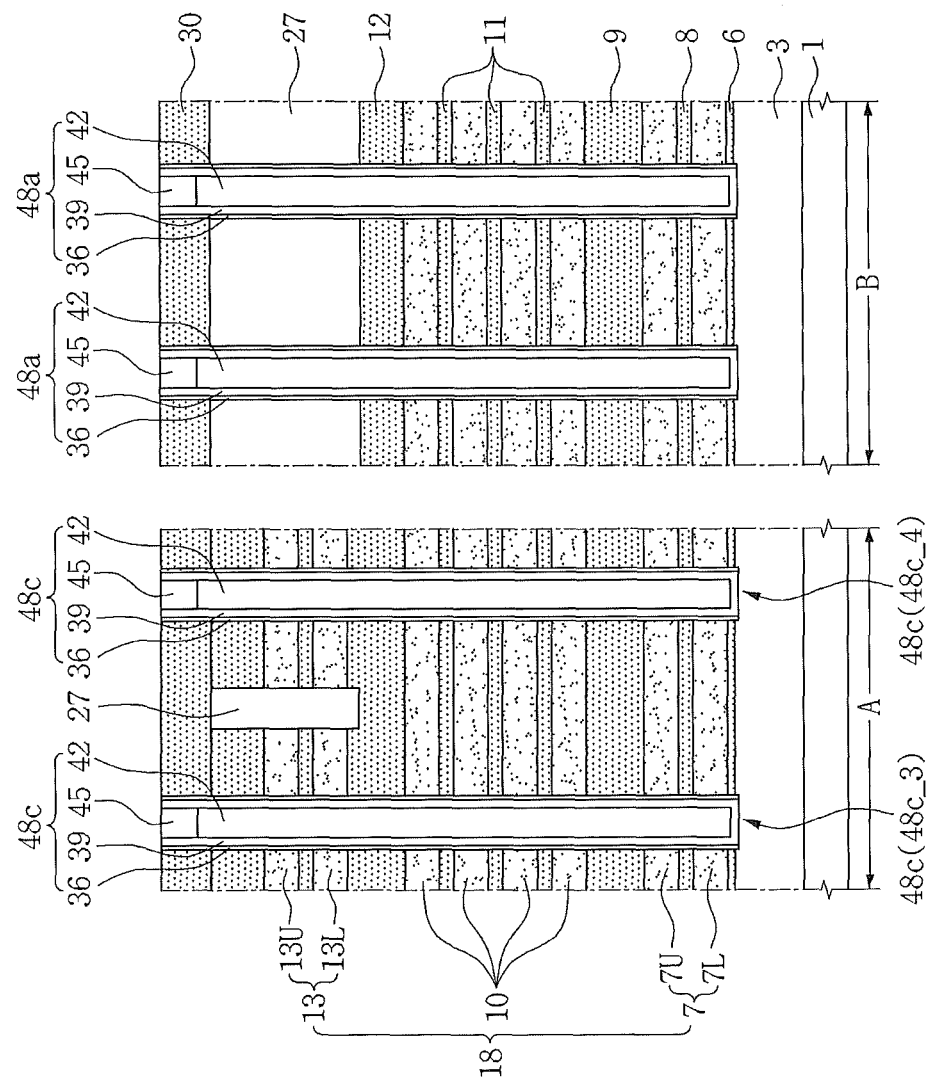

Referring to FIGS. 1, 12A, and 12B, vertical structures 48c may be formed in the first holes 33c, and auxiliary patterns 48a may be formed in the second holes 33a. The vertical structures 48c and the auxiliary patterns 48a may be formed at the same time, and formed of the same material.

Each of the vertical structures 48c and the auxiliary patterns 48a may be formed to include a semiconductor pattern. For example, the vertical structures 48c and the auxiliary patterns 48a may be formed to include a semiconductor material such as crystalline silicon.

In some embodiments, the formation of the vertical structures 48c and auxiliary patterns 48a may include forming a semiconductor layer on the substrate having the first and second holes 33c and 33a, forming core insulating patterns 42 partially filling the first and second holes 33c and 33a on the semiconductor layer, forming a pad layer on the substrate having the core insulating patterns 42, and planarizing the pad layer and the semiconductor layer until the uppermost insulating layer 15 is exposed. The planarization may be performed by a chemical mechanical planarization (CMP) process or an etchback process. The semiconductor layer remaining in the first and second holes 33c and 33a by the planarization may be defined as semiconductor patterns 39, and the pad layer remaining in the first and second holes 33c and 33a may be defined as pad patterns 45. The semiconductor layer may be formed by a CVD method or an ALD method. The semiconductor patterns 39 may be formed of a crystalline semiconductor material such as crystalline silicon. The core insulating patterns 42 may be formed of an insulating material such as silicon oxide, etc. The pad patterns 45 may be formed of a crystalline semiconductor material such as crystalline silicon. The core insulating patterns 42 and the pad patterns 45 may be sequentially stacked. The semiconductor patterns 39 may cover inner walls of the first and second holes 33c and 33a. The semiconductor patterns 39 may be interposed between a bottom of the core insulating patterns 42 and the substrate 1, and cover sides of the core insulating patterns 42 and sides of the pad patterns 45. Accordingly, the vertical structures 48c and auxiliary patterns 48a as described in FIGS. 2A and 2B may be formed.

In other embodiments, a vertical dielectric 36 may be formed on the sidewalls of the first and second holes 33c and 33a before the semiconductor layer is formed. Accordingly, each of the vertical structures 48c and auxiliary patterns 48a may include the vertical dielectric 36 and the semiconductor pattern 39. Accordingly, the vertical structures 48c and auxiliary patterns 48a as described in FIGS. 4A and 4B may be formed.

Impurity regions may be formed by implanting impurities to upper portions of the semiconductor patterns 39 and to the pad patterns 45 in the vertical structures 48c and the auxiliary patterns 48a.

Figure 13A:
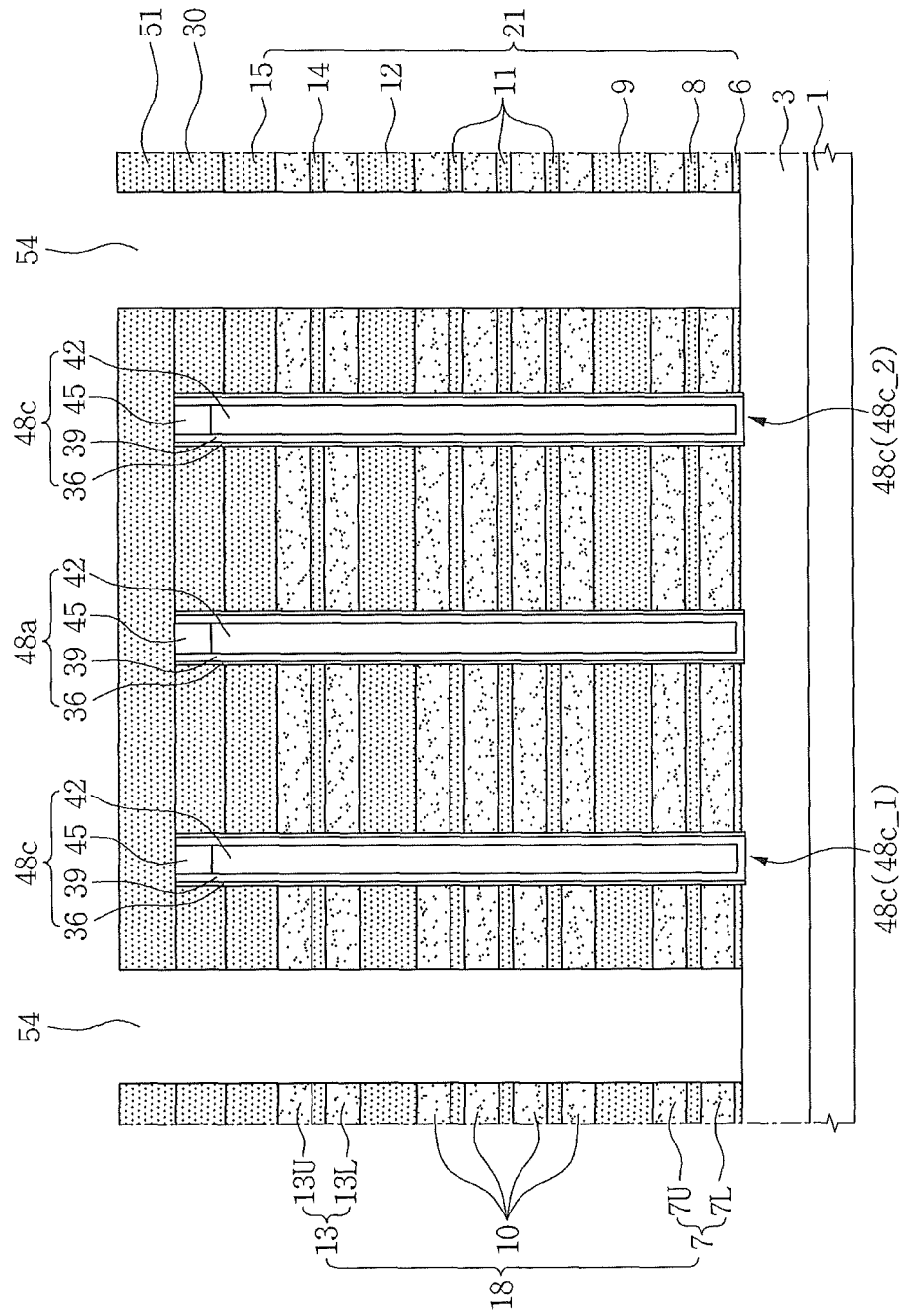
Figure 13B:
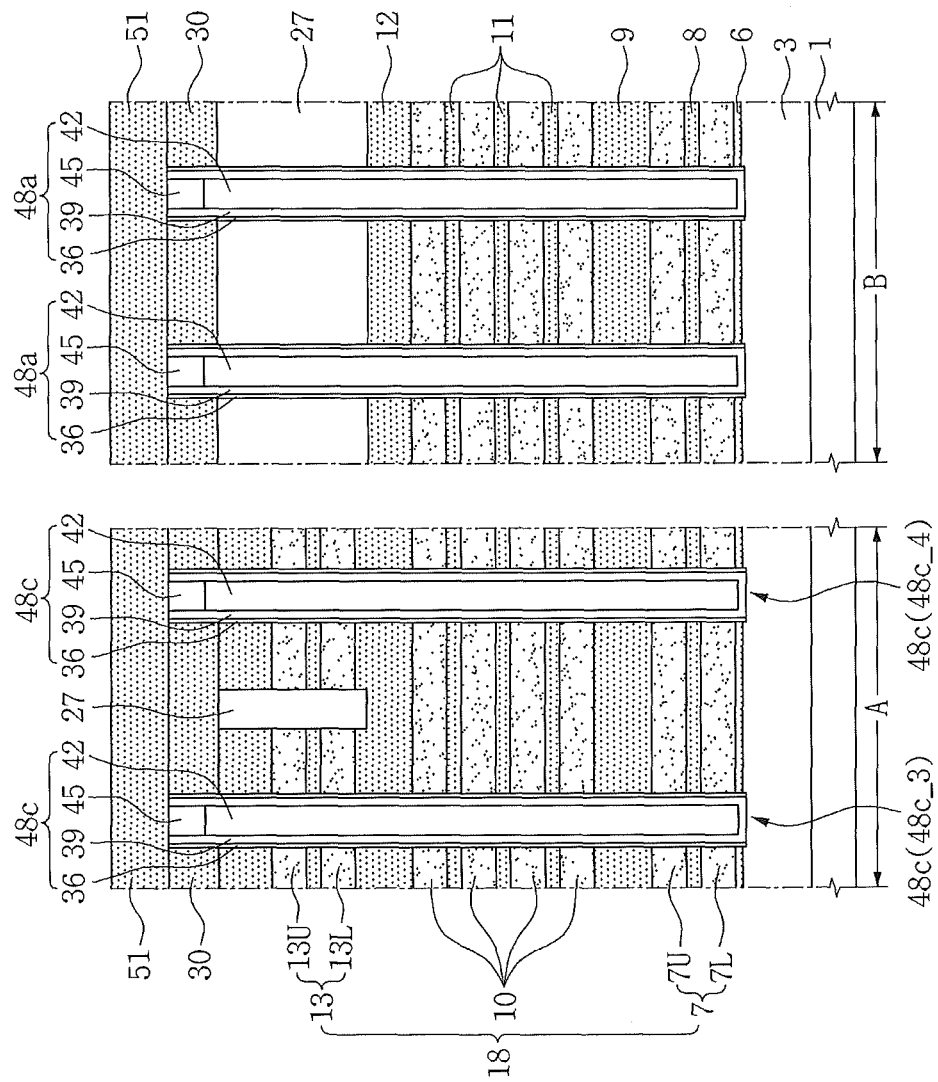

Referring to FIGS. 1, 13A, and 13B, a second capping layer 51 may be formed on the substrate having the vertical structures 48c and the auxiliary patterns 48a. The second capping layer 51 may be formed of a material such as silicon oxide, having etch selectivity with respect to the sacrificial layers 18.

Device isolation trenches 54 passing through the second capping layer 51, the first capping layer 30, and the horizontal layers 18 and 21 and exposing the substrate 1 may be formed. The device isolation trenches 54 may have line shapes.

The isolation pattern 27 may be located between a pair of the device isolation trenches 54 adjacent to each other. The vertical structures 48c may be located between the isolation pattern 27 and the device isolation trenches 54. The sacrificial layers 18 may be exposed by the device isolation trenches 54. The device isolation trenches 54 may be formed to have a greater width than the isolation pattern 27.

Figure 14A:
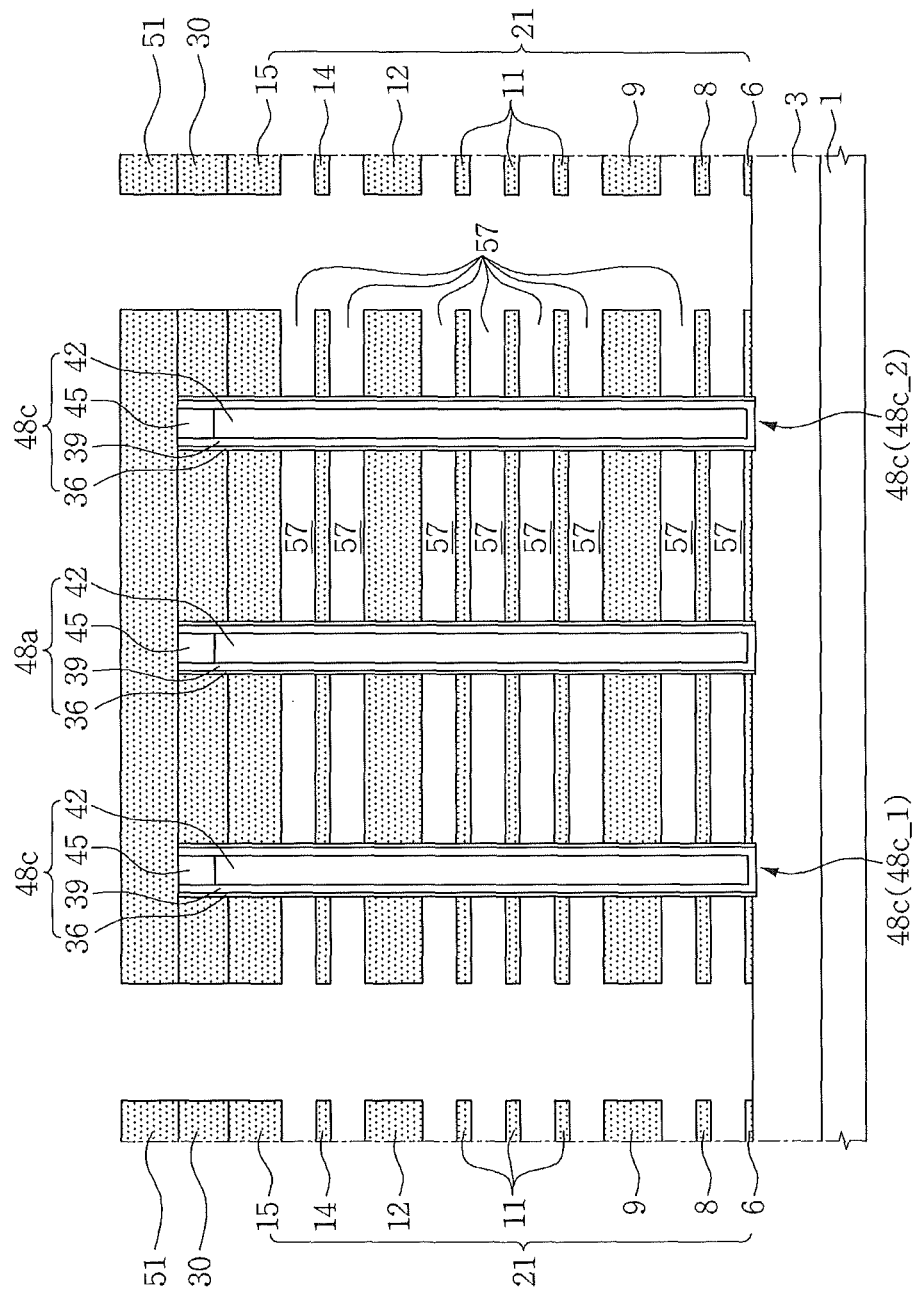
Figure 14B:
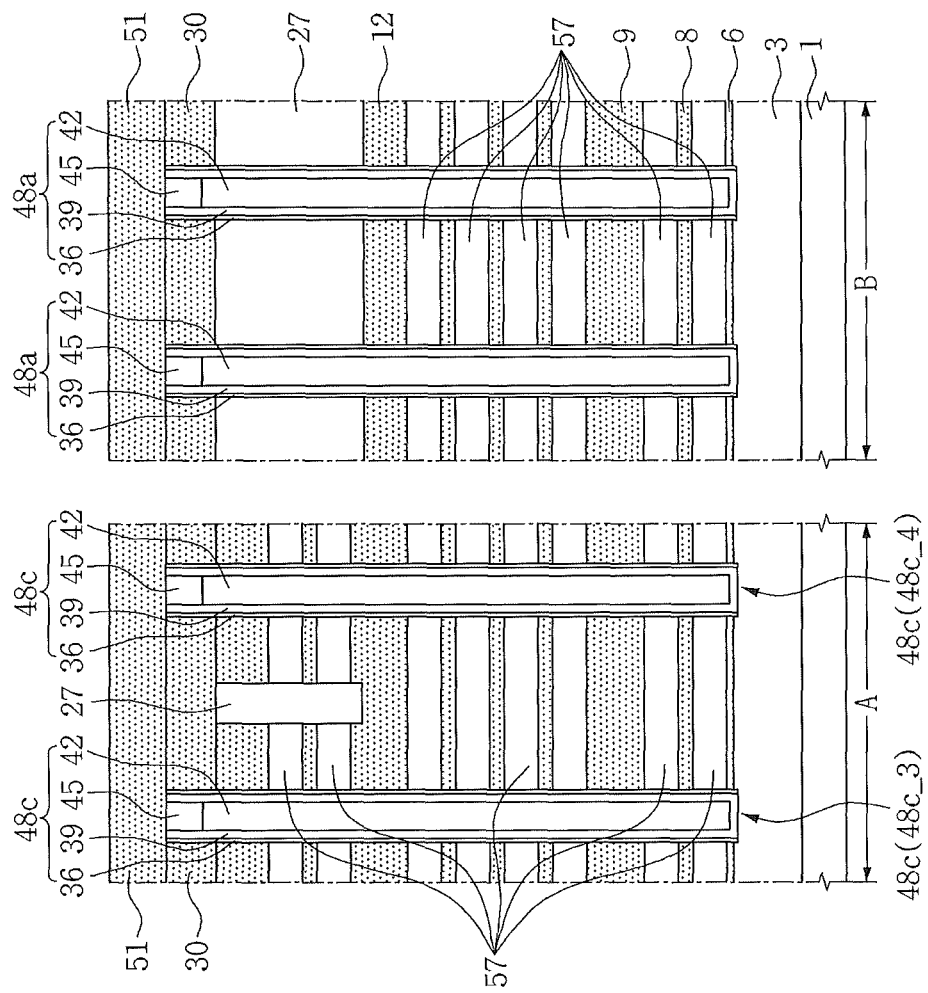

Referring to FIGS. 1, 14A, and 14B, the sacrificial layers 18 exposed by the device isolation trenches 54 may be selectively etched to be removed. Accordingly, the sacrificial layers 18 may be removed to form empty spaces 57. Due to the empty spaces 57, some parts of sides of the vertical structures 48c_1 and 48c_2 and auxiliary patterns 48a.

The auxiliary patterns 48a may function to support the interlayer insulating layers 21. The interlayer insulating layers 21 may be supported by the auxiliary patterns 48a as well as the vertical structures 48c. Since the auxiliary patterns 48a pass through parts of the interlayer insulating layers 21 located between the first and second vertical structures 48c_1 and 48c_2 which have a relatively great distance therebetween, and support the interlayer insulating layers 21, the interlayer insulating layers 21 may be prevented from being deformed or damaged.

Figure 15A:
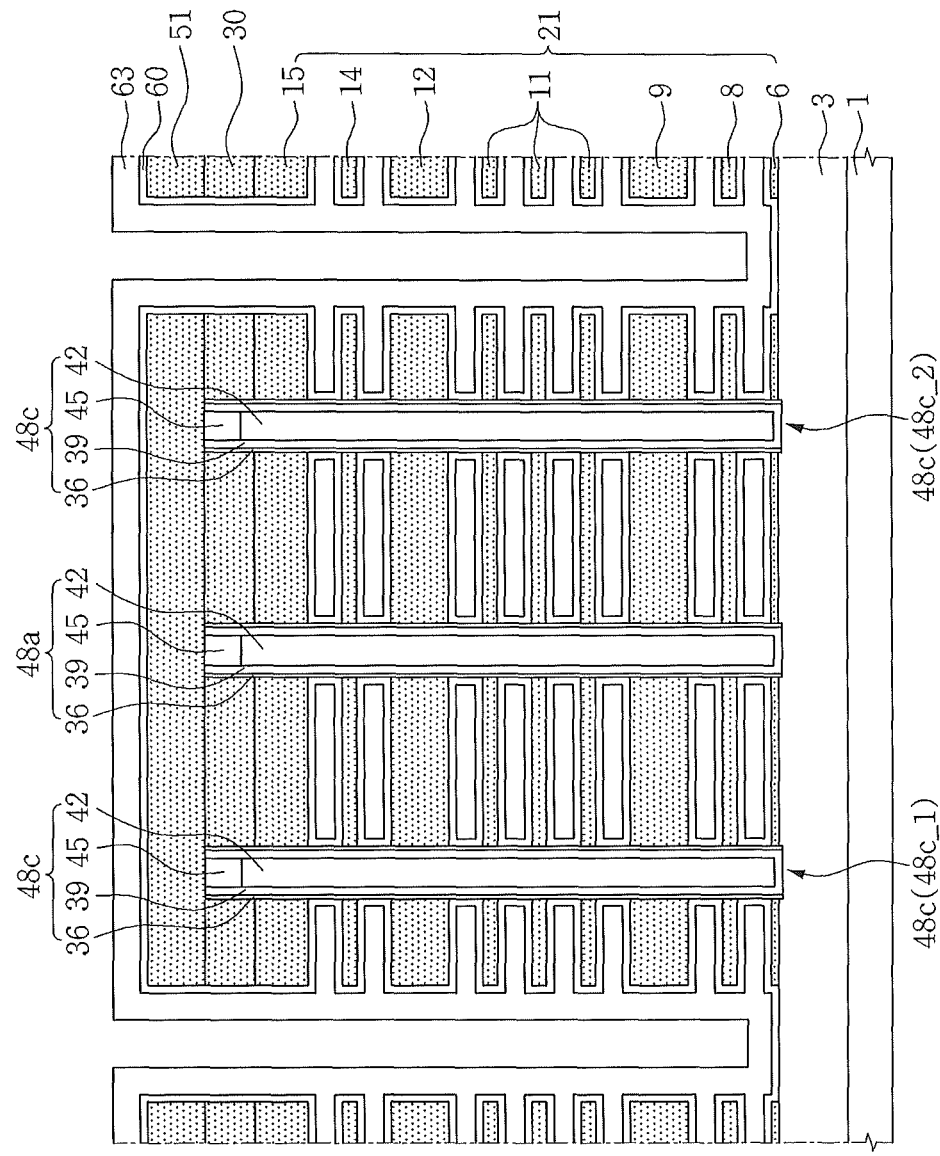

Referring to FIGS. 1, 15A, and 15B, a conductive layer 63 may be formed on the substrate having the empty spaces 57. The conductive layer 63 may be formed as an open-type in which the empty spaces 57 are filled and the device isolation trenches 54 are not fully filled.

The conductive layer 63 may be formed to include at least one of a doped semiconductor such as a doped silicon, a metal such as tungsten, copper or aluminum, a conductive metal nitride such as titanium nitride, tantalum nitride, or tungsten nitride, a conductive metal-semiconductor compound such as a metal silicide, and a transition metal such as titanium or tantalum. For example, the formation of the conductive layer 63 may include conformally forming a metal nitride layer, and forming a metal layer filling the rest of the empty spaces 57 on the substrate having the metal nitride layer.

In some embodiments, a dielectric 60 may be conformally formed on the substrate having the empty spaces 57 before the conductive layer 63 is formed.

The dielectric 60 and the conductive layer 63 may be formed by a deposition process, such as a CVD process or an ALD process, using a processing gas. The auxiliary patterns 48a may function to uniformly distribute the processing gas to form the conductive layer 63 in the empty spaces 57, and, as a result, the conductive layer 63 can be uniformly formed without any defect. In addition, the auxiliary patterns 48a may function to prevent occurring of defect such as a crack, in the interlayer insulating layers 21. For example, the auxiliary patterns 48a may function to prevent the interlayer insulating layers 21 from being bent or being cracked by supporting the interlayer insulating layers 21.

Figure 16A:
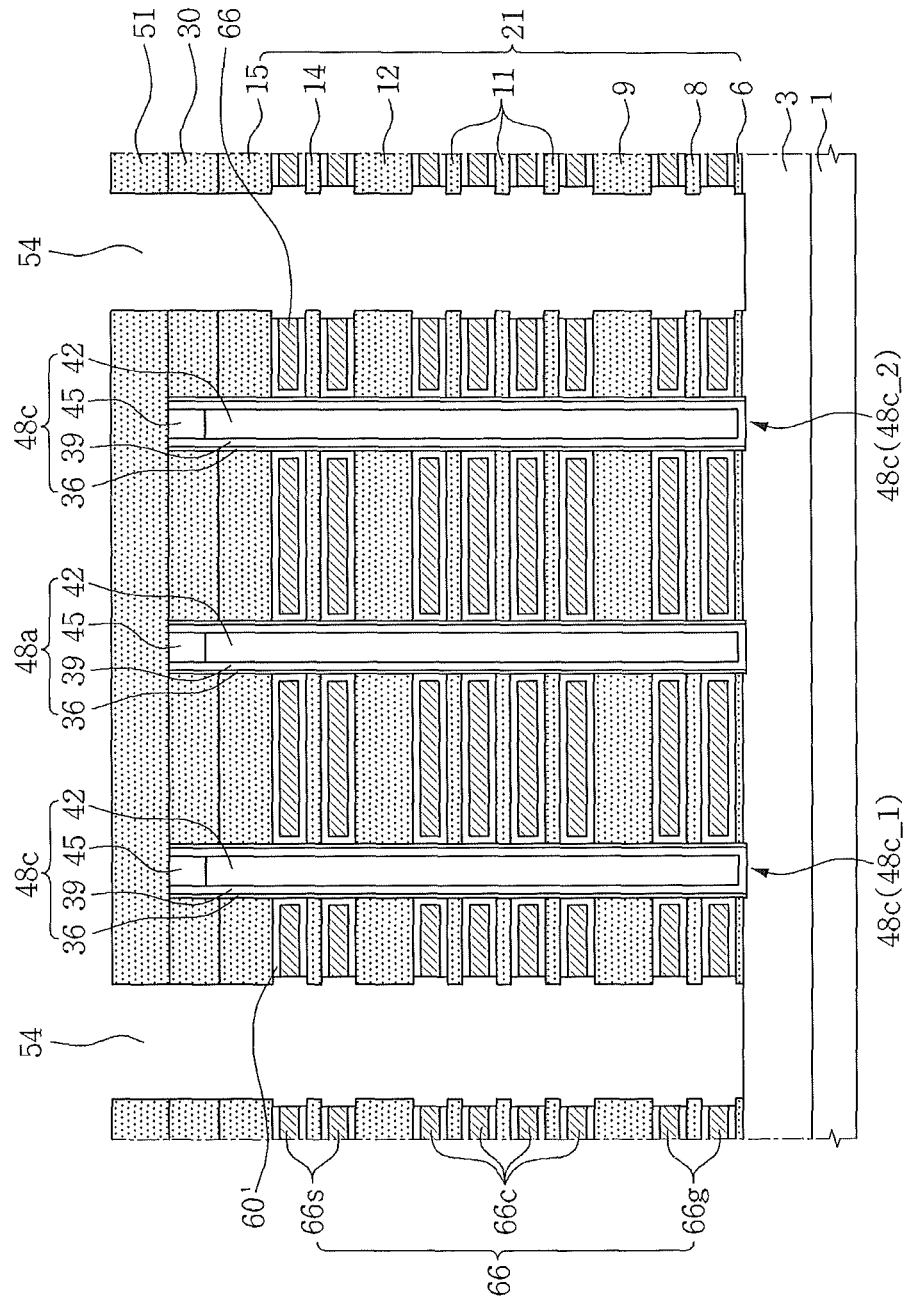
Figure 16B:
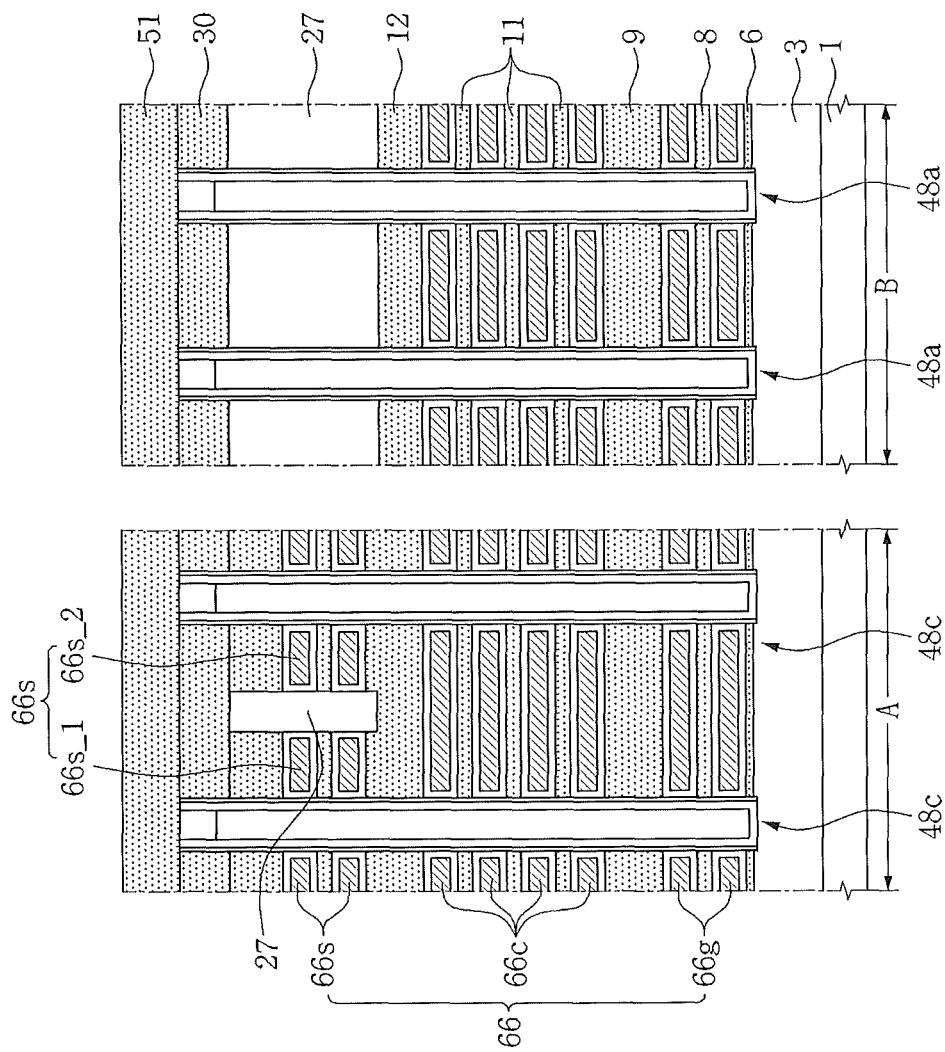

Referring to FIGS. 1, 16A, and 16B, conductive patterns 66 remaining in the empty spaces 57 may be formed by partially etching the conductive layer 63. The conductive patterns 66 may be spaced apart from each other by the interlayer insulating layers 21 and stacked vertically. The conductive patterns 66 may include one or more lower conductive patterns 66g, a plurality of intermediate conductive patterns 66c, and one or more upper conductive patterns 66s. The intermediate conductive patterns 66c may be located at a higher level than the lower conductive patterns 66g, and the upper conductive patterns 66s may be located at a higher level than the intermediate conductive patterns 66c. The upper conductive patterns 66s may include first and second conductive lines $66s\_1$ and $66s\_2$ spaced apart from each other in a plan view.

The dielectric layer 60 may be etched to expose the substrate 1 disposed under the device isolation trench 54.

Figure 17A:
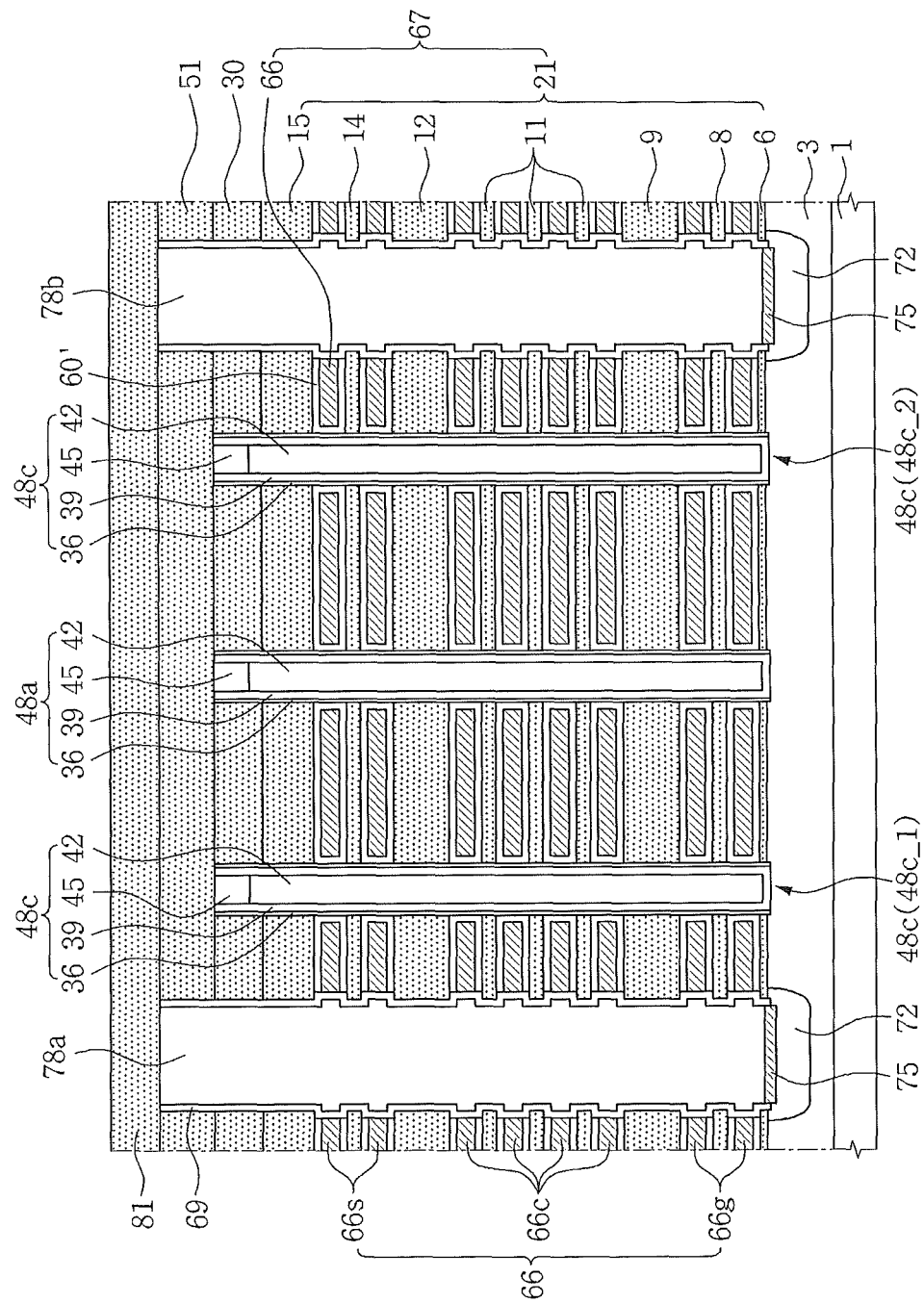
Figure 17B:
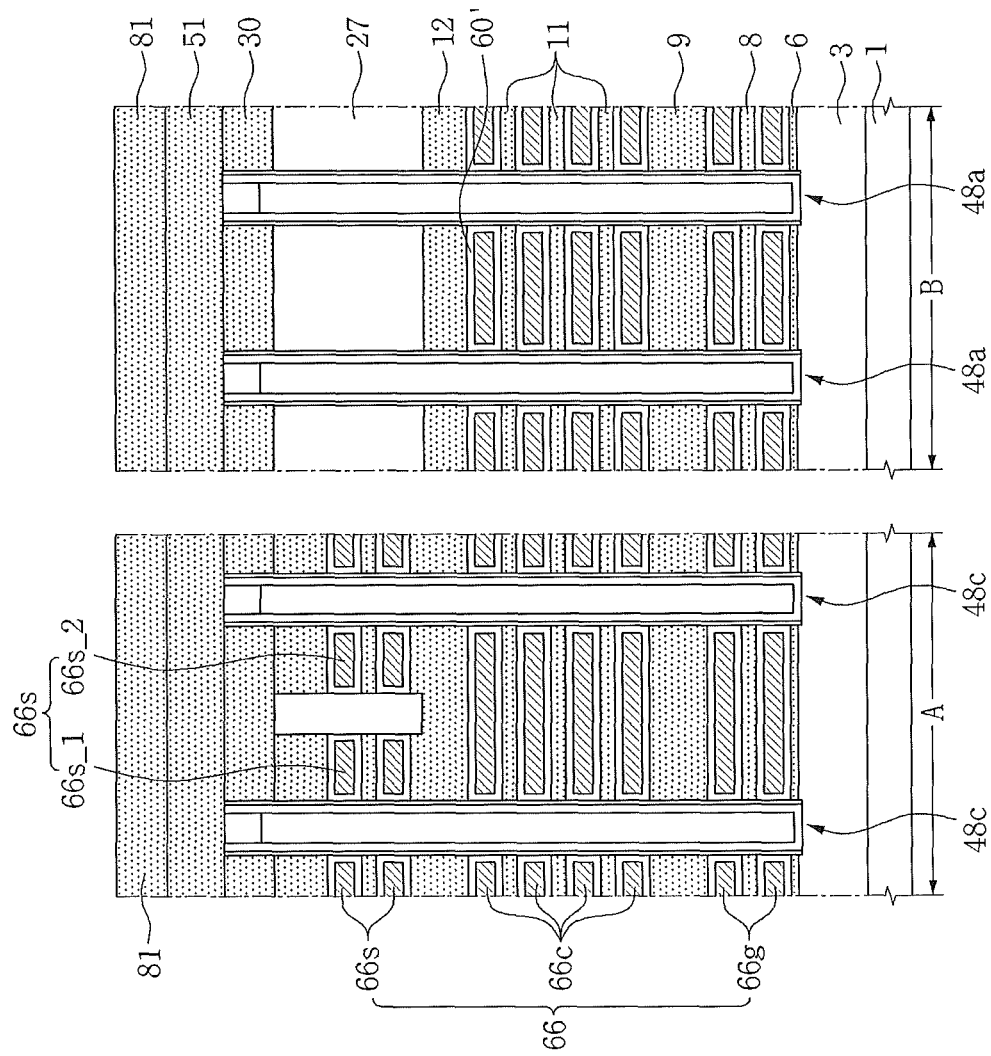

Referring to FIGS. 1, 17A, and 17B, insulating spacers 69 may be formed on sidewalls of the device isolation trenches 54. The insulating spacers 69 may be formed of an insulating material such as silicon nitride and/or silicon oxide.

Impurity regions 72 may be formed in the well region 3 of the substrate 1 disposed under the device isolation trenches 54. The impurity regions 72 may have a different conductivity type from the well region 3. For example, the well region 3 may have p-type conductivity, and the impurity regions 72 may have n-type conductivity. The impurity regions 72 may be used as common source lines in the non-volatile memory device such as a flash memory device. A metal-semiconductor compound 75 such as a metal silicide may be formed on the impurity regions 72.

Insulating vertical patterns 78a and 78b filling the device isolation trenches may be formed on the substrate having the metal-semiconductor compound 75. The formation of the insulating vertical patterns 78a and 78b may include forming an insulating material layer on the substrate having the metal-semiconductor compound 75, and planarizing the insulating material layer until the second capping layer 51 is exposed. The insulating vertical patterns 78a and 78b may be formed of an insulating material such as silicon oxide.

A capping interlayer insulating layer 81 may be formed on the substrate having the insulating vertical patterns 78a and 78b. The capping interlayer insulating layer 81 may be formed of silicon oxide.

Referring again to FIGS. 2A and 2B, contact structures 90 passing through the capping interlayer insulating layer 81, the second capping layer 51, and the first capping layer 30 and electrically connected to the vertical structures 48c, may be formed. Bit lines 93 may be formed on the contact structures 90. The bit lines 93 may be formed in a direction intersecting the first and second conductive lines $66s\_1$ and $66s\_2$.

Figure 18A:
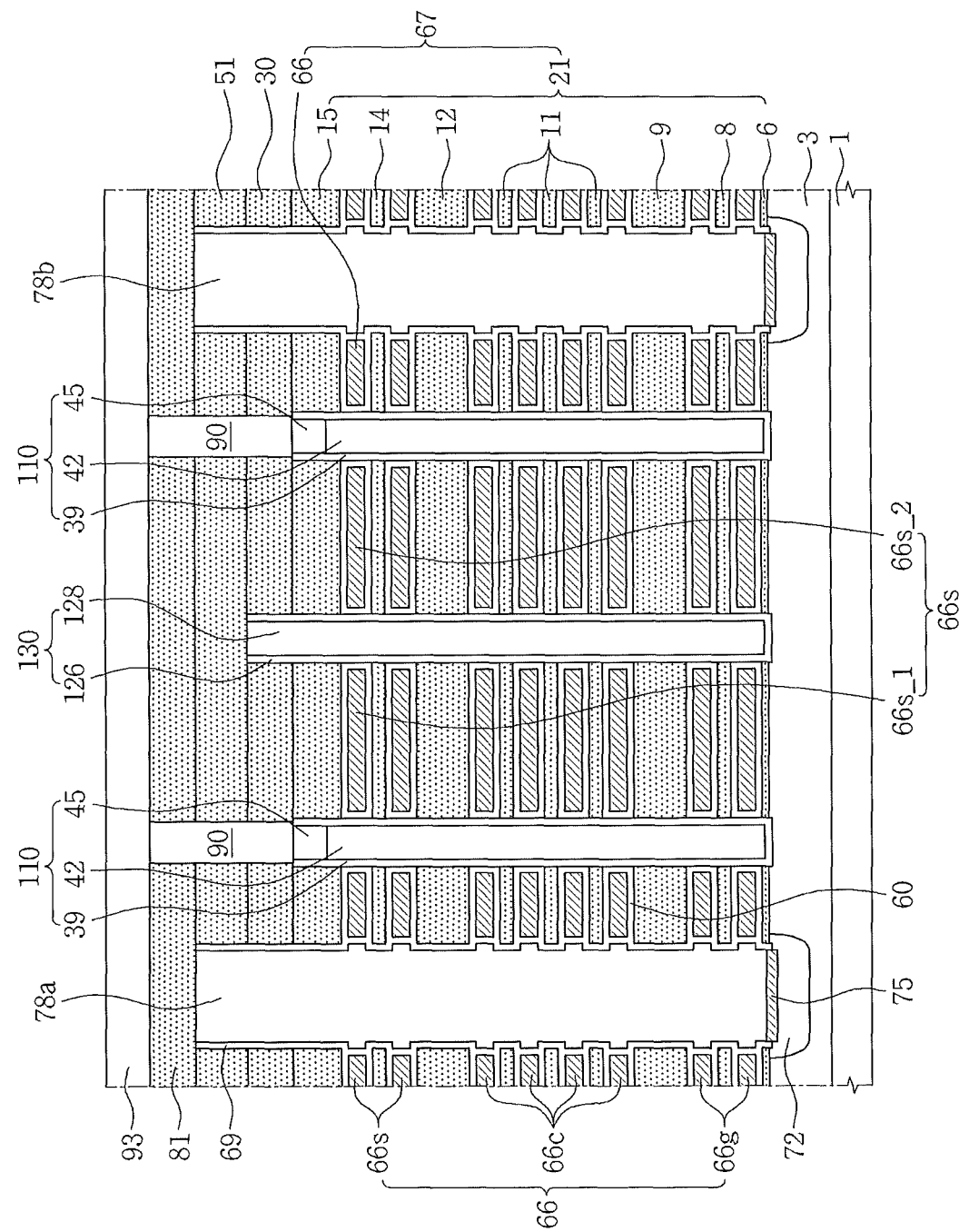
FIGS. 18A and 18B are cross-sectional views showing still another modified example of the semiconductor device in accordance with the embodiment of the inventive concept.
Figure 18B:
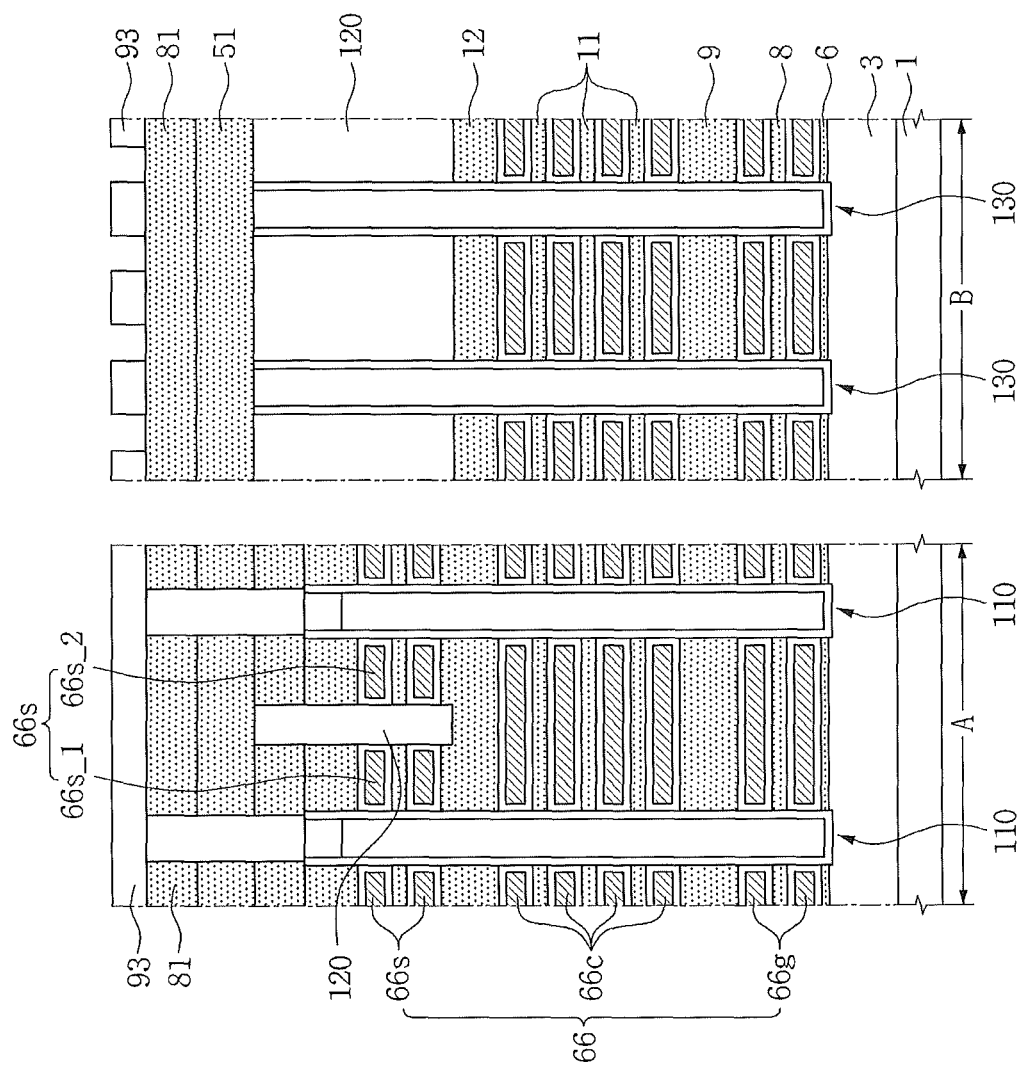

Next, a modified example of the semiconductor device in accordance with an embodiment of the inventive concept will be described with reference to FIGS. 18A and 18B. FIG. 18A shows a cross-sectional view taken along line I-I' in FIG. 1. In FIG. 18B, a part denoted by character A shows a region taken along line II-II' in FIG. 1, and a part denoted by character B shows a region taken along line III-III' in FIG. 1.

Referring to FIGS. 1, 18A, and 18B, as described with reference to FIGS. 2A and 2B, first and second insulating vertical patterns 78a and 78b may be disposed in the semiconductor substrate 1. As described in FIGS. 2A and 2B, the stacked structures 67 including the interlayer insulating layers 21 and conductive patterns 66 which are alternately and repeatedly stacked, may be disposed on the semiconductor substrate 1 between the first and second insulating vertical patterns 78a and 78b. As described in FIGS. 2A and 2B, the conductive patterns 66 may include first and second conductive lines $66s\_1$ and $66s\_2$ located at the same level, and spaced apart from each other.

Vertical structures 110 passing through the conductive patterns 66 and interlayer insulating layers 21 may be disposed. The vertical structures 110 may include semiconductor patterns 39. For example, the vertical structures 110 may be formed of the same material and have the same cross-sectional structure as the vertical structures 48c described in FIGS. 2A and 2B. On the other hand, the vertical structures 110 may include a vertical dielectric and semiconductor pattern, like the vertical structures 48c' described in FIGS. 4A and 4B.

A first capping layer 30 may be disposed on the stacked structure 67. An isolation pattern 120 interposed between the first and second conductive lines $66s\_1$ and $66s\_2$ and passing through the first capping layer 30, uppermost insulating layer 15, and upper insulating layer 14, may be disposed. The isolation pattern 120 may be formed of an insulating material such as silicon oxide.

Auxiliary patterns 130 passing through the isolation pattern 120 and passing through the interlayer insulating layers 21 and conductive patterns 66 may be disposed. The auxiliary patterns 130 may be in direct contact with the isolation pattern 120. The auxiliary patterns 130 may be formed as a single layer and a multi layer. For example, the auxiliary patterns 130 may be formed as a single material layer such as a silicon oxide layer. In contrast, the auxiliary patterns 130 may include a first auxiliary pattern 126 and a second auxiliary pattern 128. The second auxiliary pattern 128 may be a pillar shape, and the first auxiliary pattern 126 may cover bottom and side surfaces of the second auxiliary pattern 128. The first auxiliary pattern 126 may be formed of an insulating material such as silicon oxide, and the second auxiliary pattern 128 may be formed of an insulating material such as silicon nitride or a conductive material such as silicon.

The auxiliary patterns 130 and the isolation pattern 120 may have upper surfaces located at a higher level than the vertical structures 110.

A capping interlayer insulating layer 81 covering the stacked structure 67 and the insulating vertical patterns 78a and 78b may be provided.

Contact structures 90 passing through the capping interlayer insulating layer 81, second capping layer 52, and first capping layer 30, and electrically connected to the vertical structures 110 may be provided. The bit lines 93 as described in FIGS. 2A and 2B may be provided on the contact structures 90.

Figure 19A:
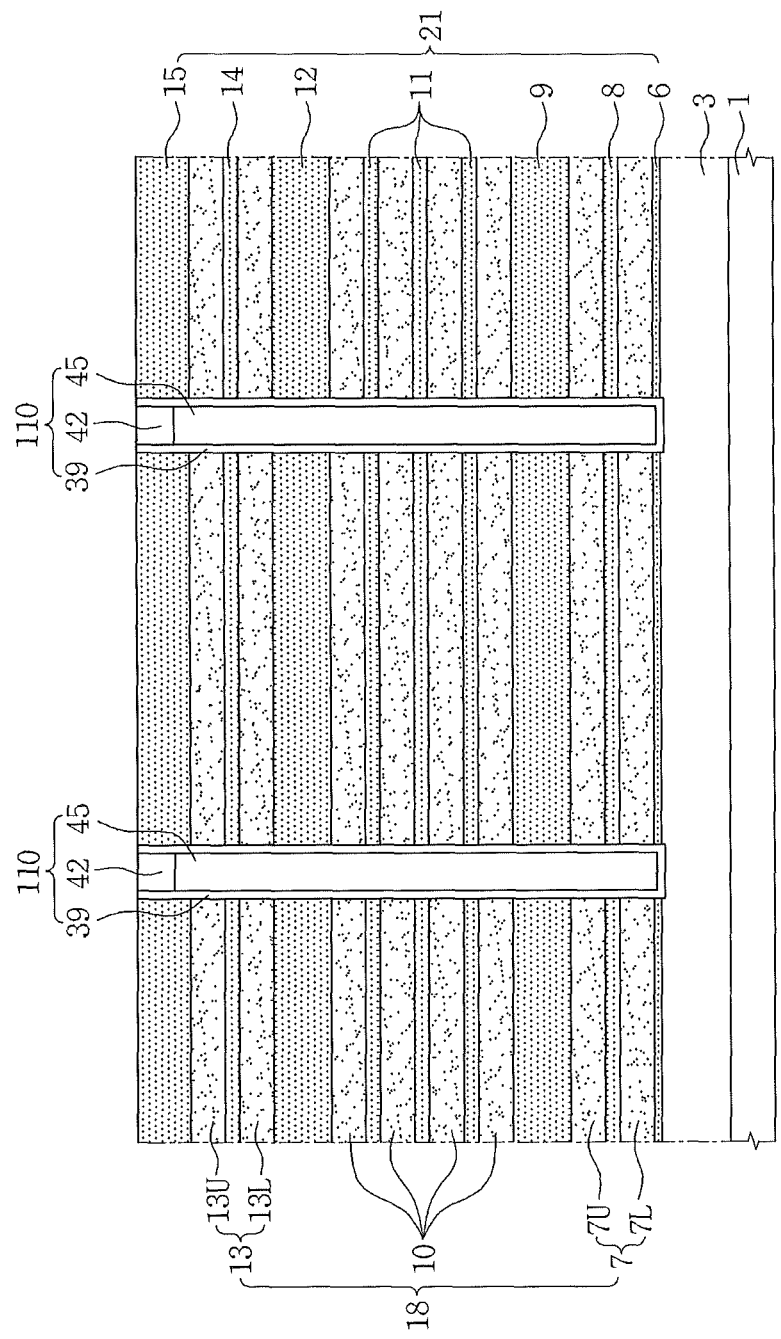
FIGS. 19A to 21B are cross-sectional views showing a method of fabricating still another modified example of the semiconductor device in accordance with the embodiment of the inventive concept.
Figure 19B:
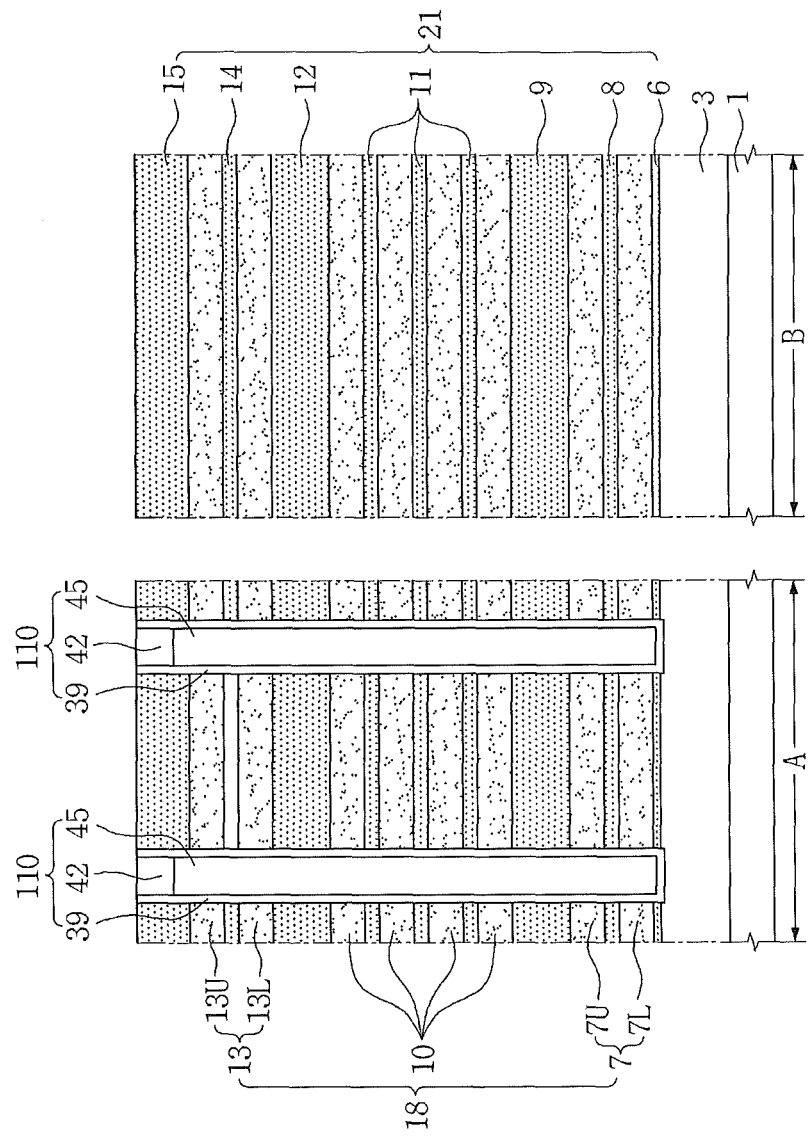
Figure 20A:
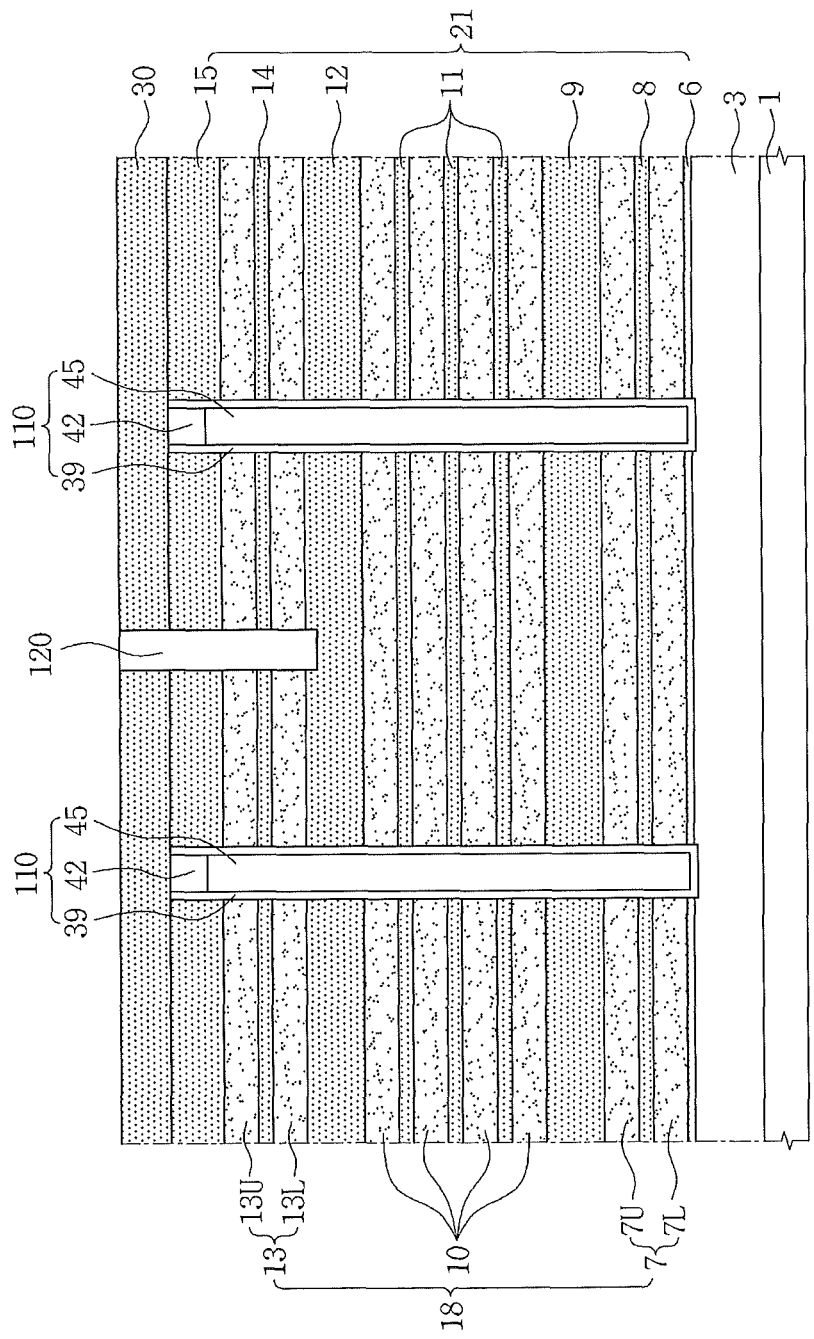
Figure 20B:
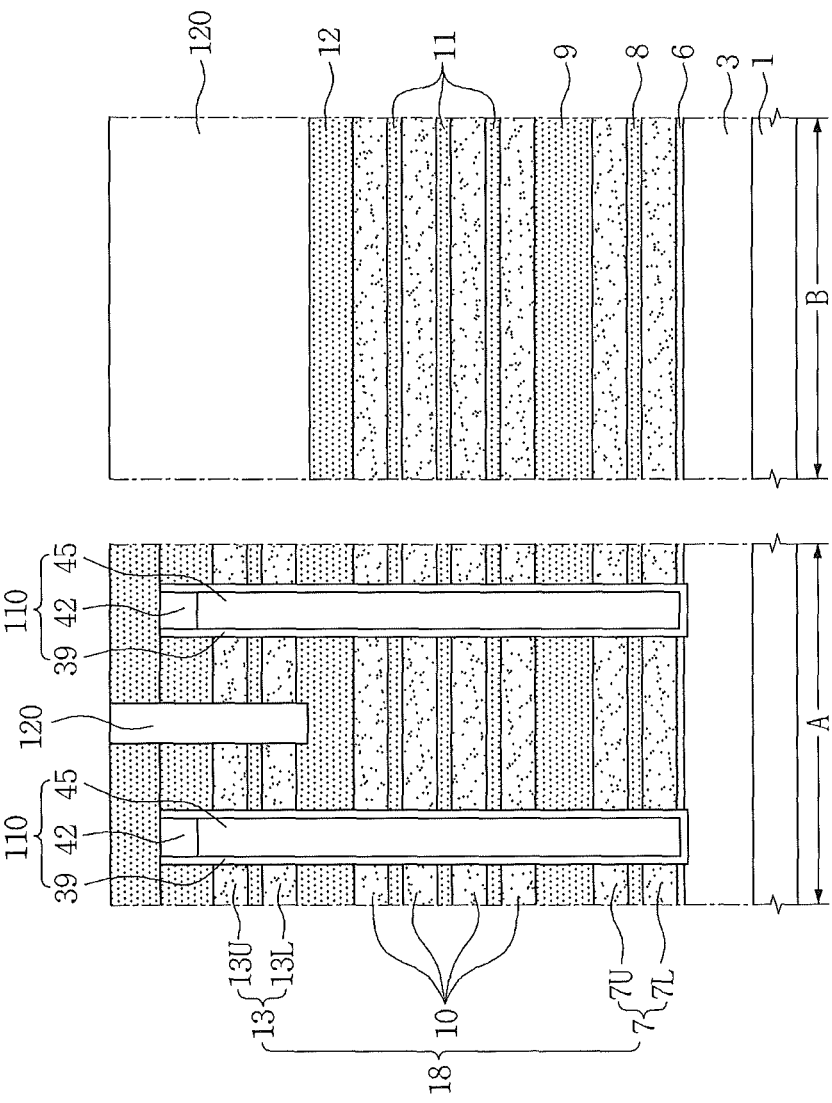
Figure 21A:
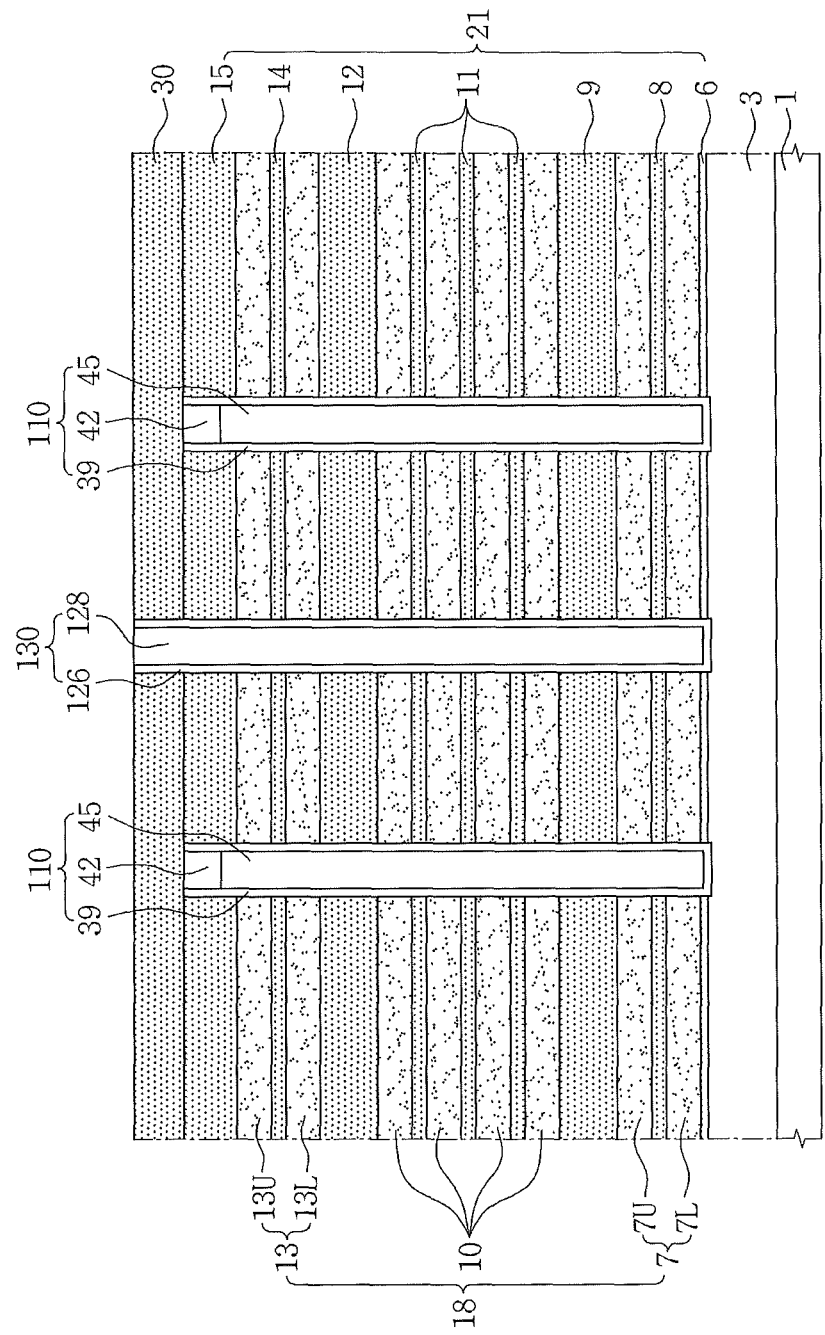
Figure 21B:
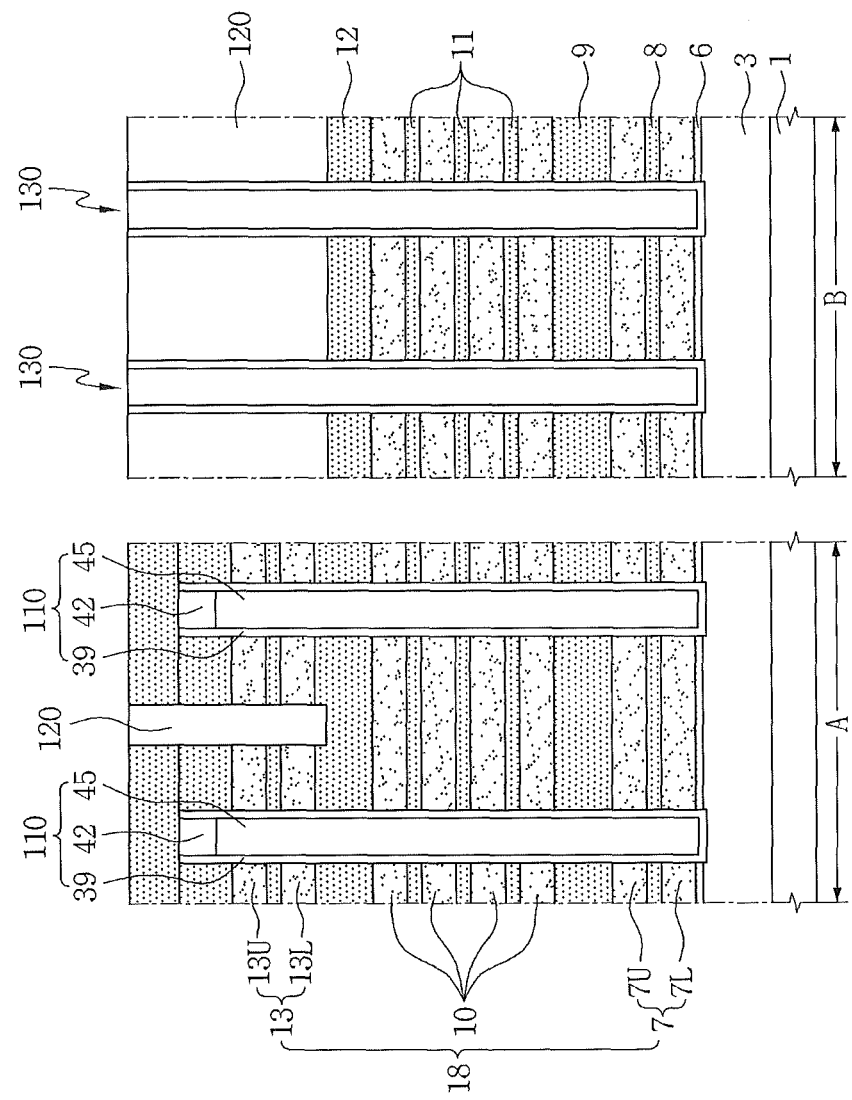

With reference to FIGS. 19A to 21B, a method of fabricating the semiconductor device described in FIGS. 18A and 18B will be described. FIGS. 19A to 21B are cross-sectional views describing the method of fabricating the semiconductor device described with reference to FIGS. 18A and 18B. In FIGS. 19A to 21B, FIGS. 19A, 20A, and 21A are cross-sectional views taken along line I-I' in FIG. 1. In FIGS. 19B, 20B, and 21B, a part denoted by character A shows an area taken along line II-II' in FIG. 1, and a part denoted by character B shows an area taken along line III-III' in FIG. 1.

Referring to FIGS. 1, 19A, and 19B, a substrate 1 in which horizontal layers 18 and 21 as described in FIGS. 8A and 8B are formed, may be provided. The horizontal layers 18 and 21 may include interlayer insulating layers 21 and sacrificial layers 18 which are alternately, repeatedly, and vertically stacked. Vertical structures 110 passing through the horizontal layers 18 and 21 may be disposed. Each of the vertical structures 110 may include a semiconductor pattern. The vertical structures 110 may be formed by substantially the same method as the method of forming the vertical structures 48c as described in FIGS. 12A and 12B.

Referring to FIGS. 1, 20A, and 20B, a first capping layer 30 may be formed on the substrate having the vertical structures 110.

A line isolation trench passing through the first capping layer 30, uppermost sacrificial layer 13, and upper insulating layer 14 may be formed. An isolation pattern 120 filling the line isolation trench may be formed. The isolation pattern 120 may intersect and pass through the upper sacrificial layers 13. The isolation pattern 120 may be formed of silicon oxide.

Referring to FIGS. 1, 21A, and 21B, auxiliary holes passing through the isolation pattern 120 and horizontal layers 18 and 21 may be formed. Auxiliary patterns 130 may be formed in the auxiliary holes. The auxiliary patterns 130 may be formed as a single layer or a multi layer. The auxiliary patterns 130 may be formed of an insulating material, such as silicon oxide, having etch selectivity with respect to the sacrificial layers 18. The formation of the auxiliary patterns 130 may include forming a first material layer 126 such as silicon oxide on inner walls of the auxiliary holes, forming a second material layer 128 filling the auxiliary holes on the first material layer 126, and planarizing the first and second material layers 126 and 128 until the first capping layer 30 is exposed. The second material layer 128 may be formed of an insulating material layer such as silicon nitride, or a conductive layer such as a polysilicon layer.

Referring again to FIGS. 18A and 18B, a second capping layer 51 may be formed on the substrate having the auxiliary patterns 130. A process of forming the device isolation trench 54 described in FIGS. 13A and 13B on the substrate having the second capping layer 51, a process of removing the sacrificial layers 18 described in FIGS. 14A and 14B, a process of forming the dielectric 60 and the conductive patterns 66 described in FIGS. 15A, 15B, 16A, and 16B, and a process of forming the insulating vertical patterns 78a and 78b and process of forming the capping interlayer insulating layer 81 which are described in FIGS. 17A and 17B, may be sequentially processed. Next, the contact structures 90 and the bit lines 93 may be formed.

Figure 22A:
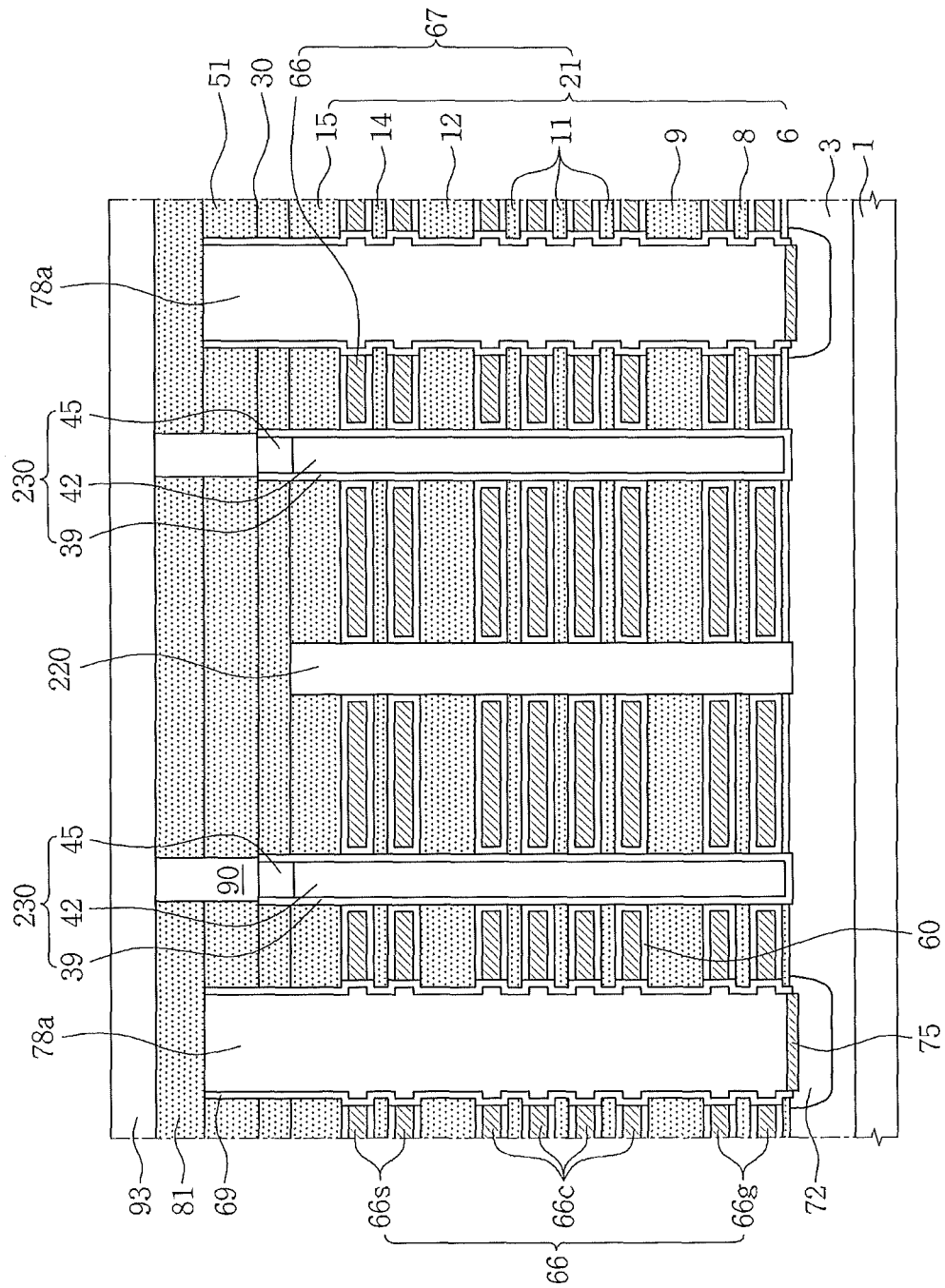
FIGS. 22A and 22B are cross-sectional views showing still another modified example of the semiconductor device in accordance with the embodiment of the inventive concept.
Figure 22B:
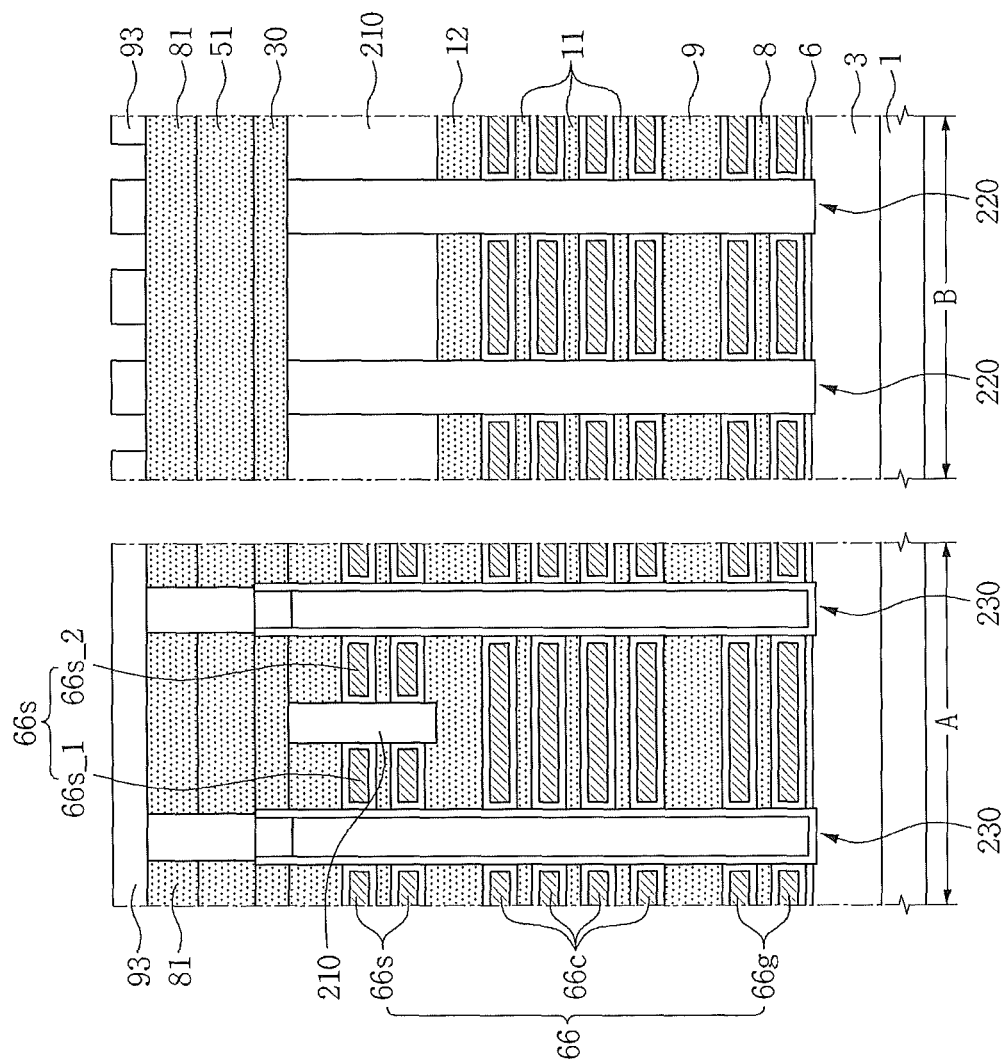

Next, another modified example of the semiconductor device in accordance with the embodiment of the inventive concept will be described with reference to FIGS. 22A and 22B. FIG. 22A shows a cross-sectional view taken along line I-I' in FIG. 1. In FIG. 22B, a part denoted by character A shows an area taken along line II-II' in FIG. 1, and a part denoted by character B shows an area taken along line III-III' in FIG. 1.

Referring to FIGS. 1, 22A, and 22B, as described with reference to FIGS. 2A and 2B, first and second insulating vertical patterns 78a and 78b may be disposed on a semiconductor substrate 1. As described in FIGS. 2A and 2B, the stacked structure 67 including the alternatively and repeatedly stacked interlayer insulating layers 21 and conductive patterns 66, may be disposed on the semiconductor substrate 1 between the first and second insulating vertical patterns 78a and 78b. As described in FIGS. 2A and 2B, the conductive patterns 66 may include first and second conductive lines 66s_1 and 66s_2 located at the same level and spaced apart from each other.

Isolation pattern 210 interposed the first and second conductive lines 66s_1 and 66s_2, and intersecting and passing through the uppermost insulating layer 15 and the upper insulating layer 14, may be disposed. The isolation pattern 210 may have a bottom located at a lower level than the first and second conductive lines 66s_1 and 66s_2.

Auxiliary patterns 220 located between the first and second conductive lines 66s_1 and 66s_2, and passing through the isolation pattern 210, the interlayer insulating layers 21, and the conductive patterns 66. The auxiliary patterns 220 may be formed of a single layer or a multi layer.

A first capping layer 30 located between the insulating vertical patterns 78a and 78b, and, at the same time, located on the auxiliary patterns 220, isolation pattern 210, and stacked structure 67, may be formed.

Vertical structures 230 passing through the first capping layer 30 and stacked structure 67 may be disposed. The vertical structures 230 may include a semiconductor pattern. The vertical structures 230 may be formed of the same material and have the same cross-sectional structure as the vertical structures 48c described in FIGS. 2A and 2B, or the vertical structures 48c' described in FIGS. 4A and 4B. The vertical structures 230 may be disposed between the isolation pattern 210 and the insulating vertical patterns 78a and 78b. The vertical structures 230 may have an upper surface located at a higher level than the auxiliary patterns 220 and the isolation pattern 210.

A second capping layer 51 located between the insulating vertical patterns 78a and 78b and covering the first capping layer 30 and vertical structures 230 may be disposed.

A capping interlayer insulating layer 81 covering the second capping layer 51 and insulating vertical patterns 78a and 78b, may be provided.

Contact structures 90 passing through the capping interlayer insulating layer 81 and second capping layer 51, and electrically connected to the vertical structures 230, may be provided. Bit lines 93 may be provided on the contact structures 90.

Figure 23A:
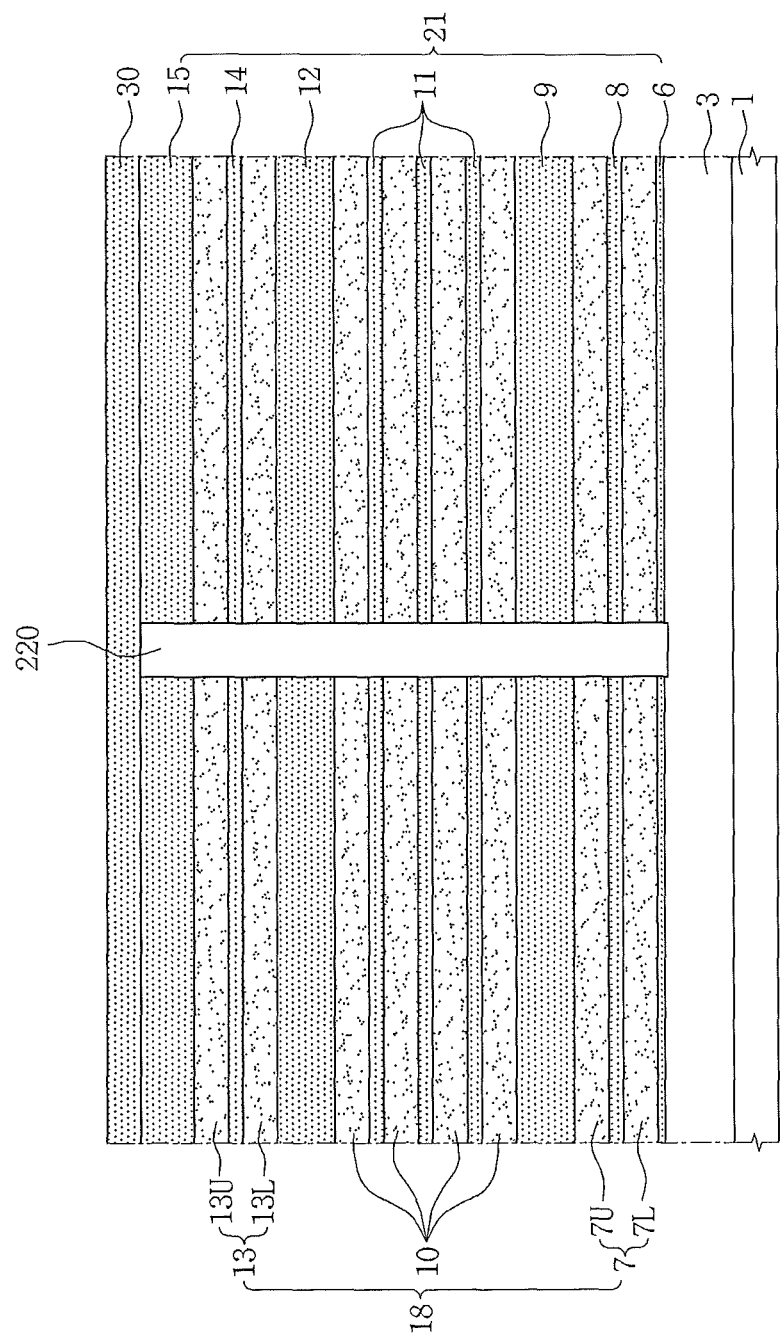
FIGS. 23A to 24B are cross-sectional views showing a method of fabricating still another modified example of the semiconductor device in accordance with the embodiment of the inventive concept.
Figure 23B:
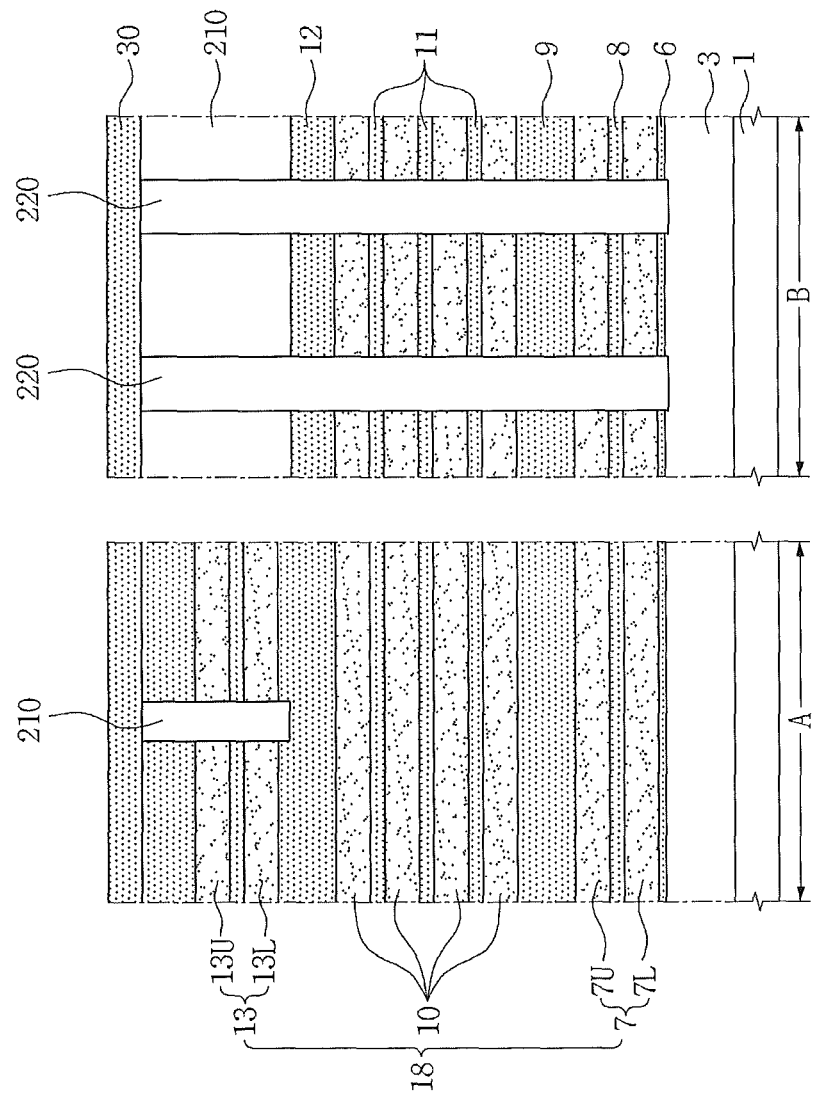
Figure 24A:
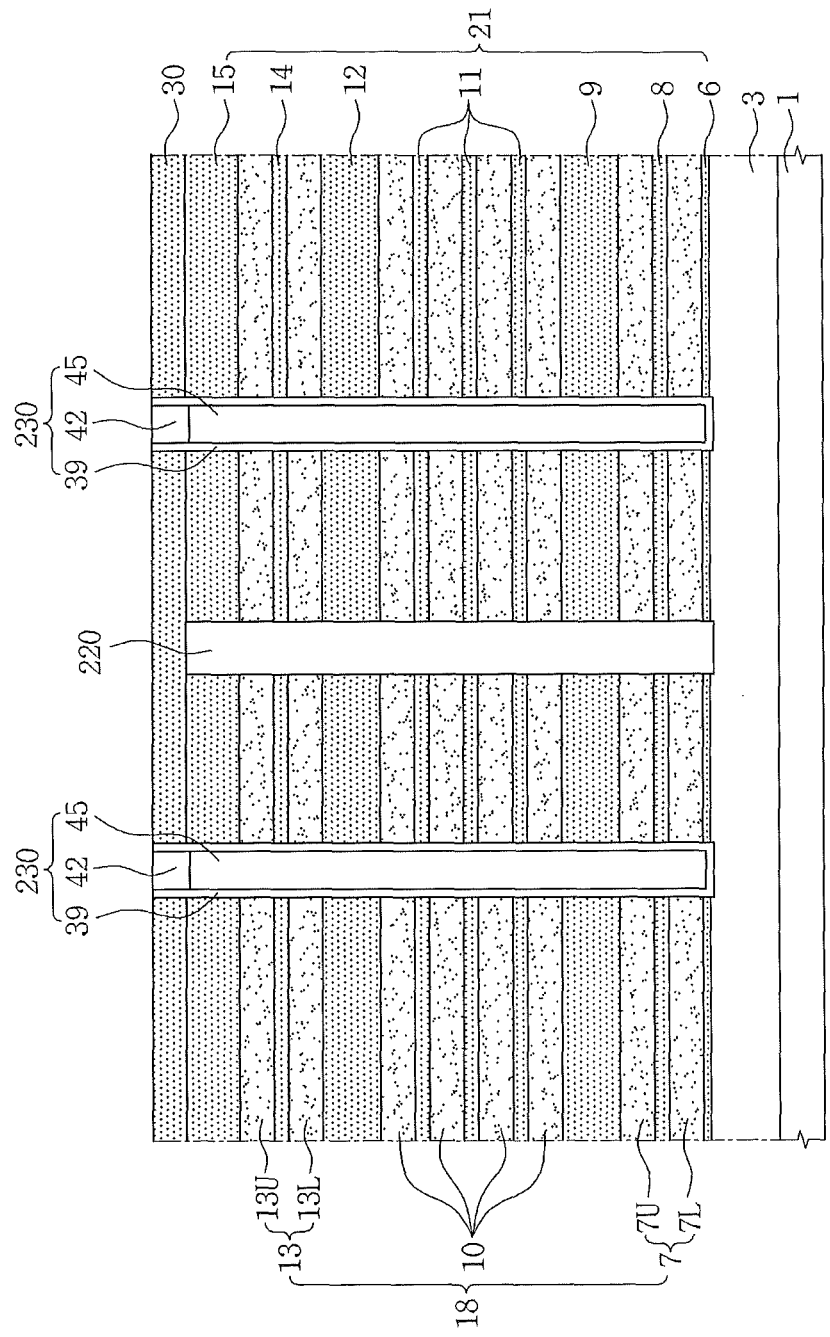
Figure 24B:
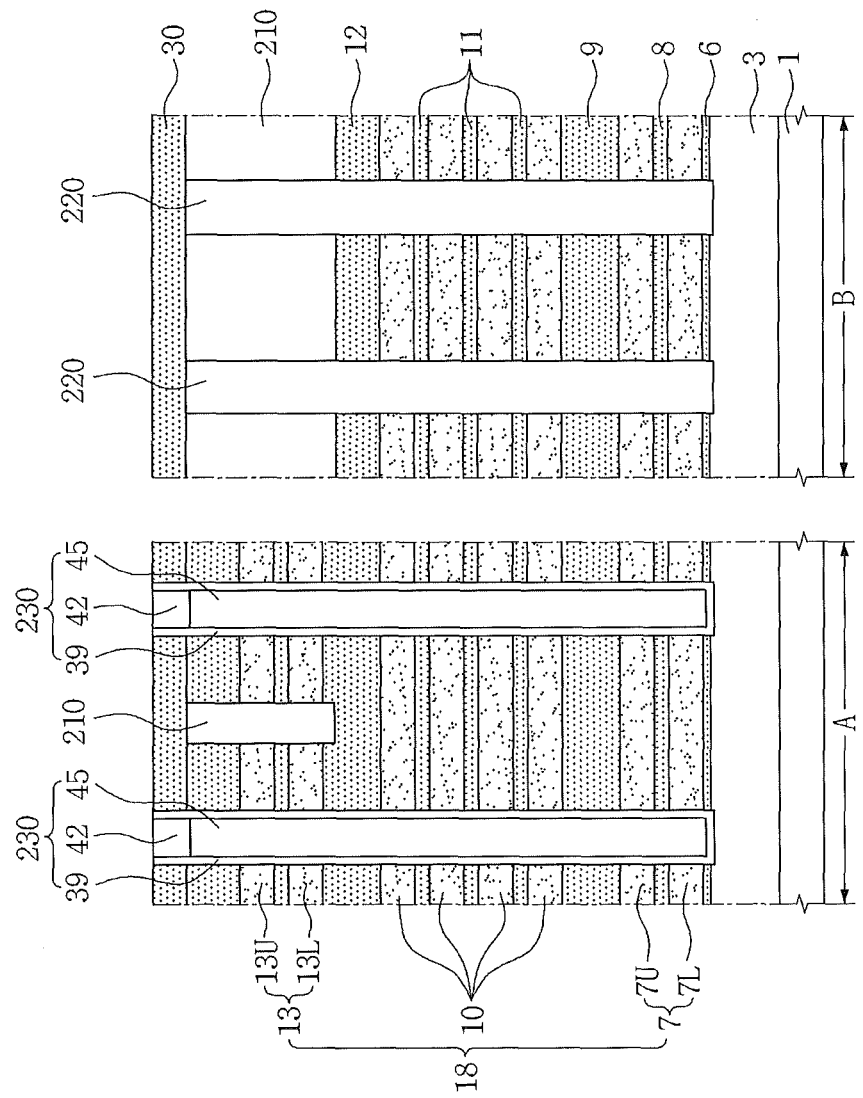

FIGS. 23A, 23B, 24A, and 24B are cross-sectional views describing a method of fabricating the semiconductor device described in FIGS. 22A and 22B. In FIGS. 23A to 24B, FIGS. 23A and 24A are cross-sectional views taken along line I-I' of FIG. 1. In FIGS. 23B and 24B, a part denoted by character A shows an area taken along line II-II' in FIG. 1, and a part denoted by character B shows an area taken along line III-III' in FIG. 1.

Referring to FIGS. 1, 23A, and 23B, a substrate 1 in which horizontal layers 18 and 21 as described in FIGS. 8A and 8B are formed, may be provided. The horizontal layers 18 and 21 may include the alternately and repeatedly stacked interlayer insulating layers 21 and sacrificial layers 18.

An isolation pattern 210 intersecting and passing through at least the upper sacrificial layers 13 may be formed. The isolation pattern 210 may pass through the uppermost insulating layer 15 located on the upper sacrificial layers 13, and the upper insulating layer 14 located between the uppermost insulating layer 15 and the upper sacrificial layers 13. Auxiliary patterns 220 passing through the isolation pattern 210 and horizontal layers 18 and 21 may be formed. A first capping layer 30 may be formed on the substrate having the auxiliary patterns 220 and the isolation pattern 210.

Referring to FIGS. 1, 24A, and 24B, vertical structures 230 passing through the first capping layer 30 and horizontal layers 18 and 21 may be formed. The vertical structures 230 may be formed at both sides of the isolation pattern 210. The vertical structures 230 may include a semiconductor pattern. The vertical structures 230 may be formed by substantially the same method as the method of forming the vertical structures 48c as described in FIGS. 12A and 12B.

Referring again to FIGS. 22A and 22B, a second capping layer 51 may be formed on the substrate having the vertical structures 230. A process of forming the device isolation trench 54 described in FIGS. 13A and 13B on the substrate having the second capping layer 51, a process of removing the sacrificial layers 18 described in FIGS. 14A and 14B, a process of forming the dielectric 60 and the conductive patterns 66 described in FIGS. 15A, 15B, 16A, and 16B, and a process of forming the insulating vertical patterns 78a and 78b and process of forming the capping interlayer insulating layer 81 which are described in FIGS. 17A and 17B, may be sequentially processed. Next, the contact structures 90 and the bit lines 93 may be formed.

Figure 25:
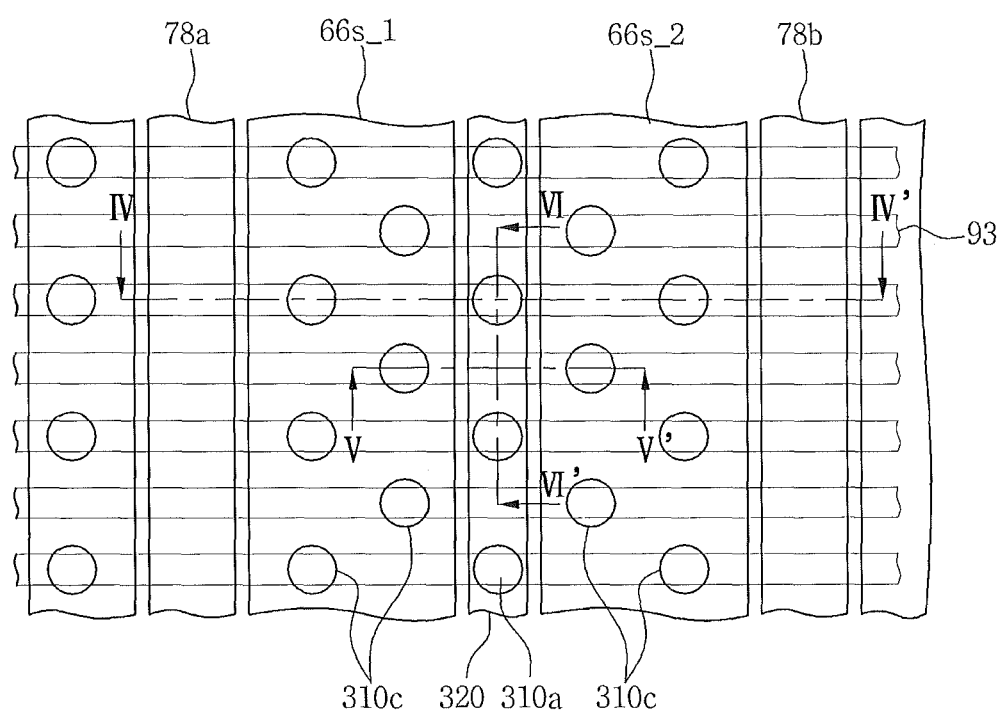
FIG. 25 is a plan view showing still another modified example of the semiconductor device in accordance with the embodiment of the inventive concept.
Figure 26A:
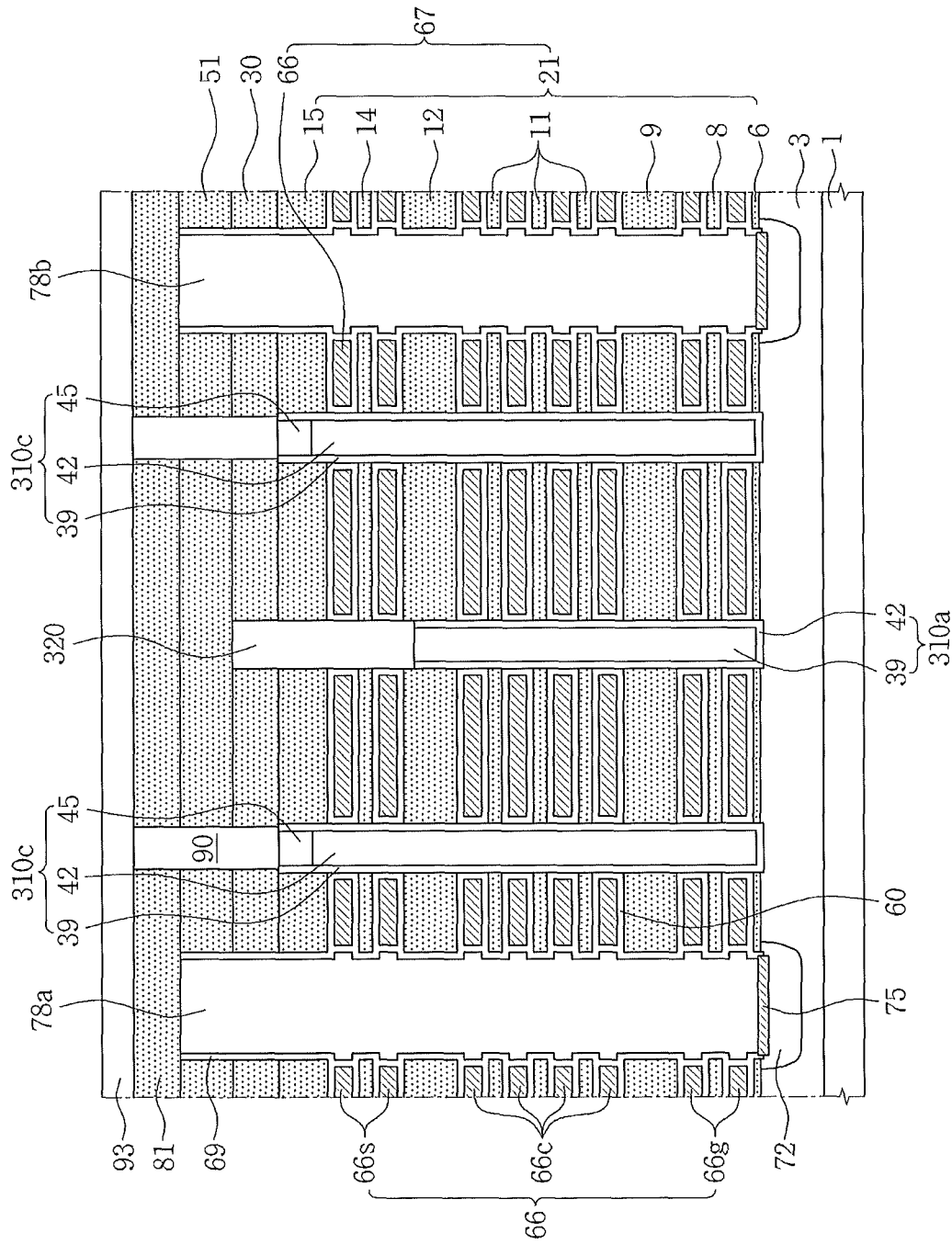
FIGS. 26A and 26B are cross-sectional views showing still another modified example of the semiconductor device in accordance with the embodiment of the inventive concept.
Figure 26B:
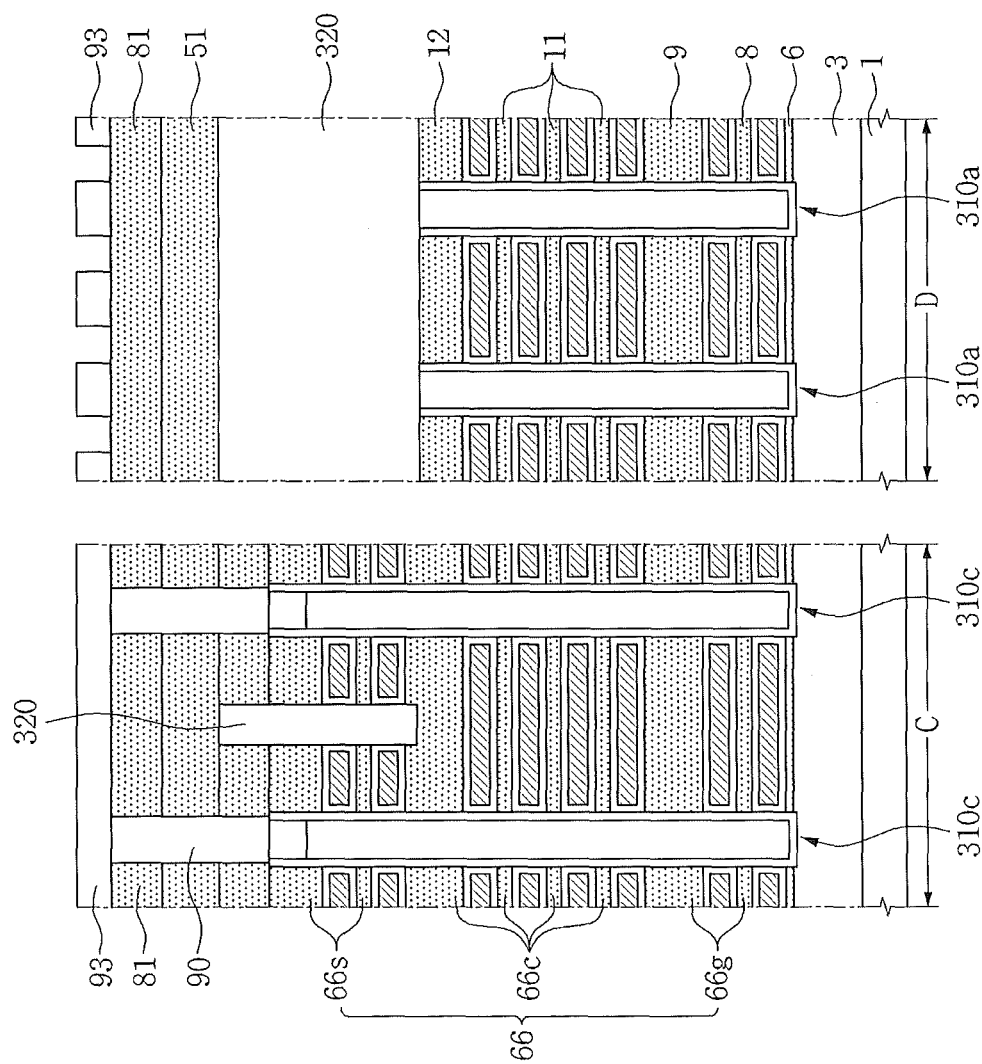

FIG. 25 is a plan view showing still another modified example of the semiconductor device in accordance with the embodiment of the inventive concept. FIGS. 26A and 26B are cross-sectional views showing still another modified example of the semiconductor in accordance with the embodiment of the inventive concept. In FIGS. 26A and 26B, FIG. 26A shows a cross-sectional view taken along line IV-IV' in FIG. 25. In FIG. 26B, a part denoted by character C shows an area taken along line V-V' in FIG. 25, and a part denoted by character D shows an area taken along line VI-VI' in FIG. 25.

Referring to FIGS. 25, 26A, and 26B, as described in FIGS. 2A and 2B, a semiconductor substrate 1 having a well region 3 may be provided. Insulating vertical patterns 78a and 78b spaced apart from each other may be disposed on the semiconductor substrate 1. A stacked structure 67 including the alternately and repeatedly stacked interlayer insulating layers 21 and conductive patterns 66, may be disposed on the substrate 1 between the insulating vertical patterns 78a and 78b. The conductive patterns 66 may include first and second conductive lines 66s_1 and 66s_2 which are located at the same level and spaced apart from each other.

Vertical structures 310c passing through the stacked structure 67 may be disposed. The vertical structures 310c may be formed of the same material and have the same structure as the vertical structures 48c described in FIGS. 2A and 2B, or the vertical structures 48c' described in FIGS. 4A and 4B.

An isolation pattern 320 may be disposed between the first and second conductive lines 66s_1 and 66s_2. The isolation pattern 320 may have a line shape. The isolation pattern 320 may be located between the first and second conductive lines 66s_1 and 66s_2, and pass through the first capping layer 30, the upper interlayer insulating layers 12, and the upper insulating layer 14. The isolation pattern 320 may be formed of an insulating material. The isolation pattern 320 may have an upper surface located at a higher level than the vertical structures 310c. The isolation pattern 320 may have a lower surface located at a lower level than the first and second conductive patterns 66s_1 and 66s_2.

Auxiliary patterns 310a passing through the intermediate conductive patterns 48c and lower conductive patterns 48g and passing through the interlayer insulating layers 6, 8, 9, 11, and 12 adjacent to the intermediate and lower conductive patterns 66c and 66g, may be disposed. The auxiliary patterns 310a may pass through the lowermost insulating layer 6, the lower insulating layer 8, the lower interlayer insulating layer 9, the intermediate insulating layers 11, and the upper interlayer insulating layer 12.

The auxiliary patterns 310a may overlap the isolation pattern 320, and be in direct contact with the isolation pattern 320. The auxiliary patterns 310a may be located under the isolation pattern 320.

A second capping layer 51 located between the insulating vertical patterns 78a and 78b and disposed on the first capping layer 30, may be provided.

A capping interlayer insulating layer 81 covering the first and second insulating vertical patterns 78a and 78b and second capping layer 51, may be disposed. Conductive contact structures 90 passing through the capping interlayer insulating layer 81 and second capping layer 51 and electrically connected to the vertical structures 310c, may be disposed. Bit lines 93 electrically connected to the contact structures 90 may be disposed on the capping interlayer insulating layer 81.

Figure 27A:
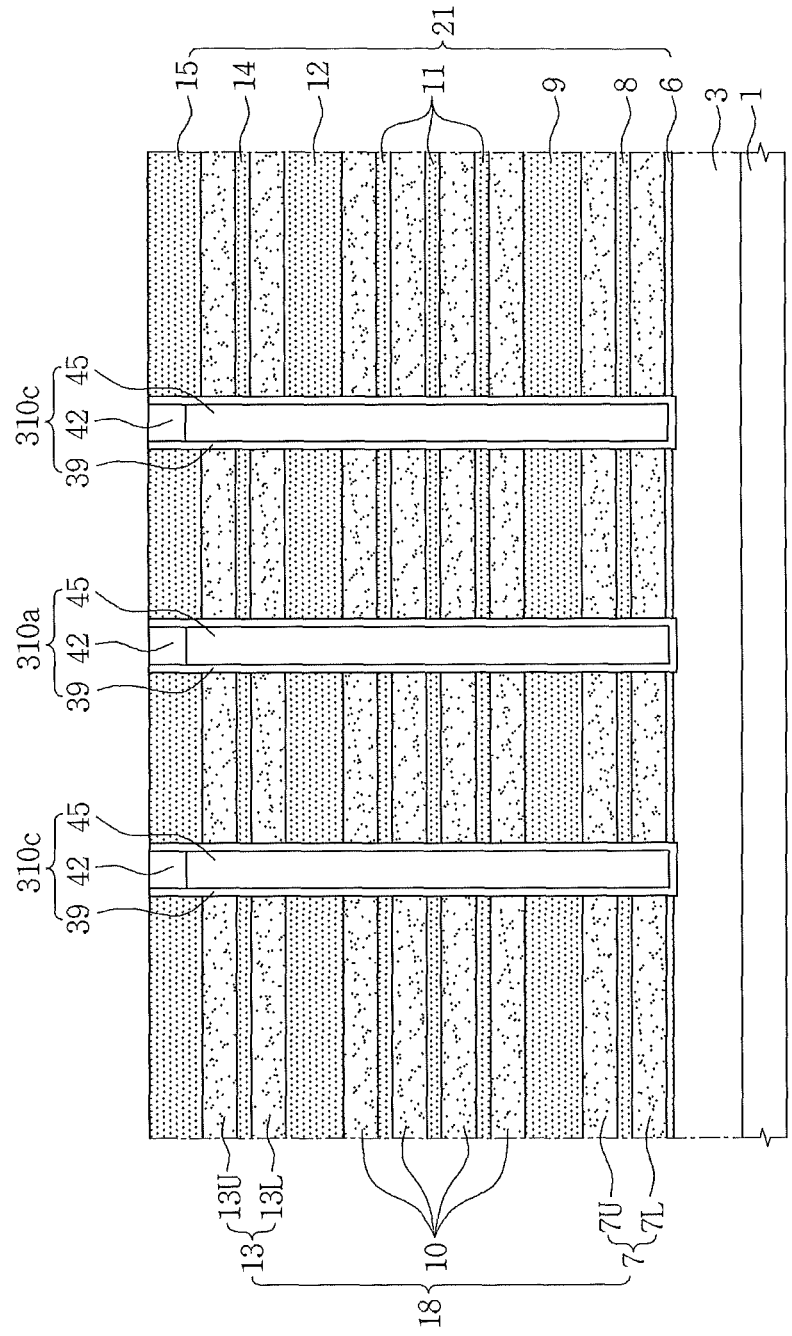
FIGS. 27A to 29B are cross-sectional views showing a method of fabricating still another modified example of the semiconductor device in accordance with the embodiment of the inventive concept.
Figure 27B:
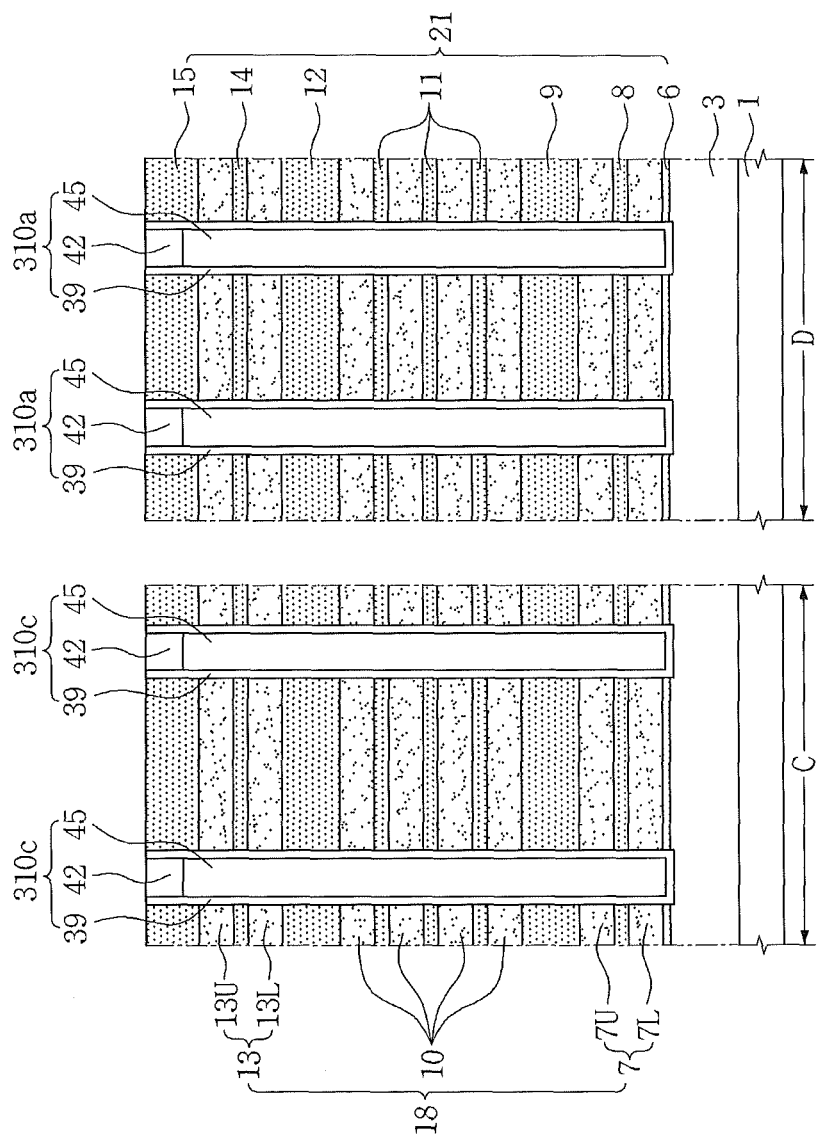
Figure 28A:
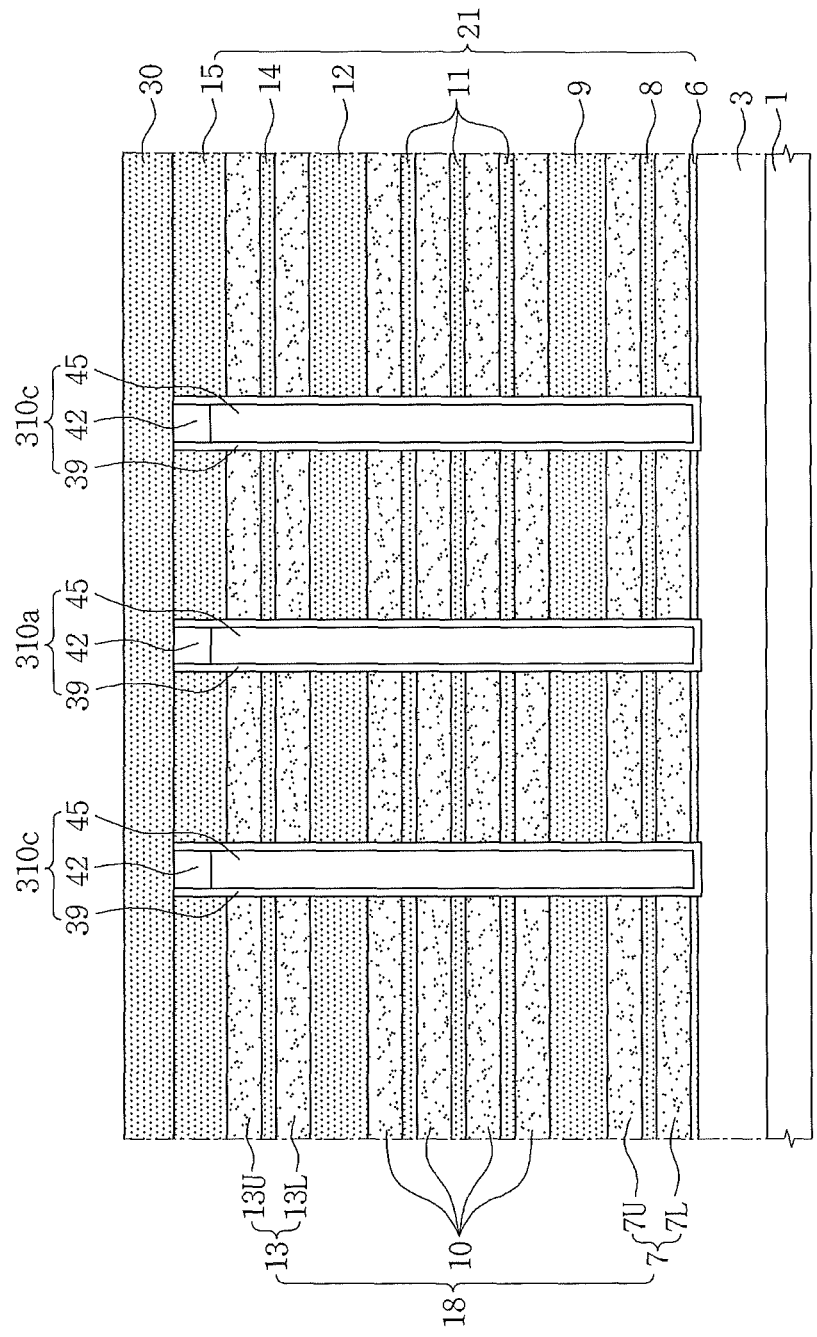
Figure 28B:
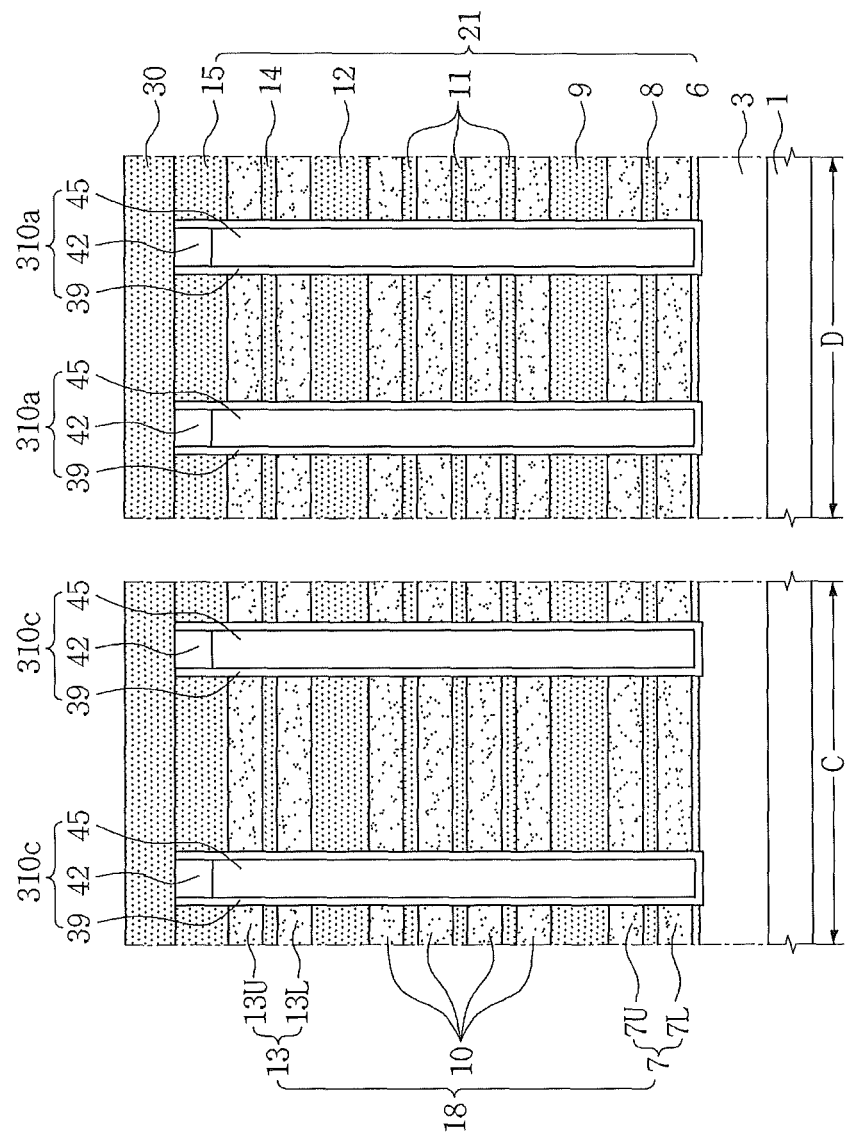
Figure 29A:
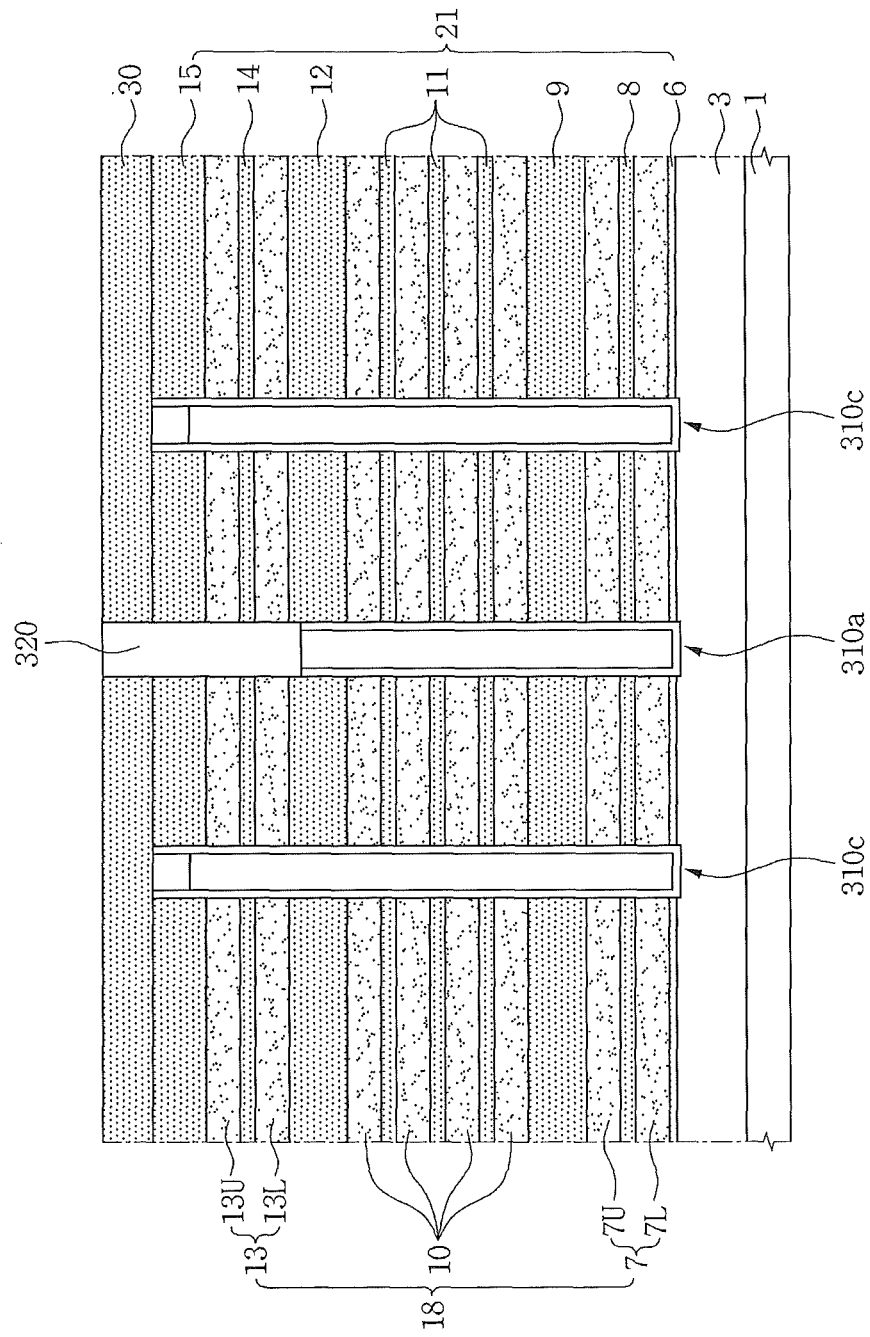
Figure 29B:
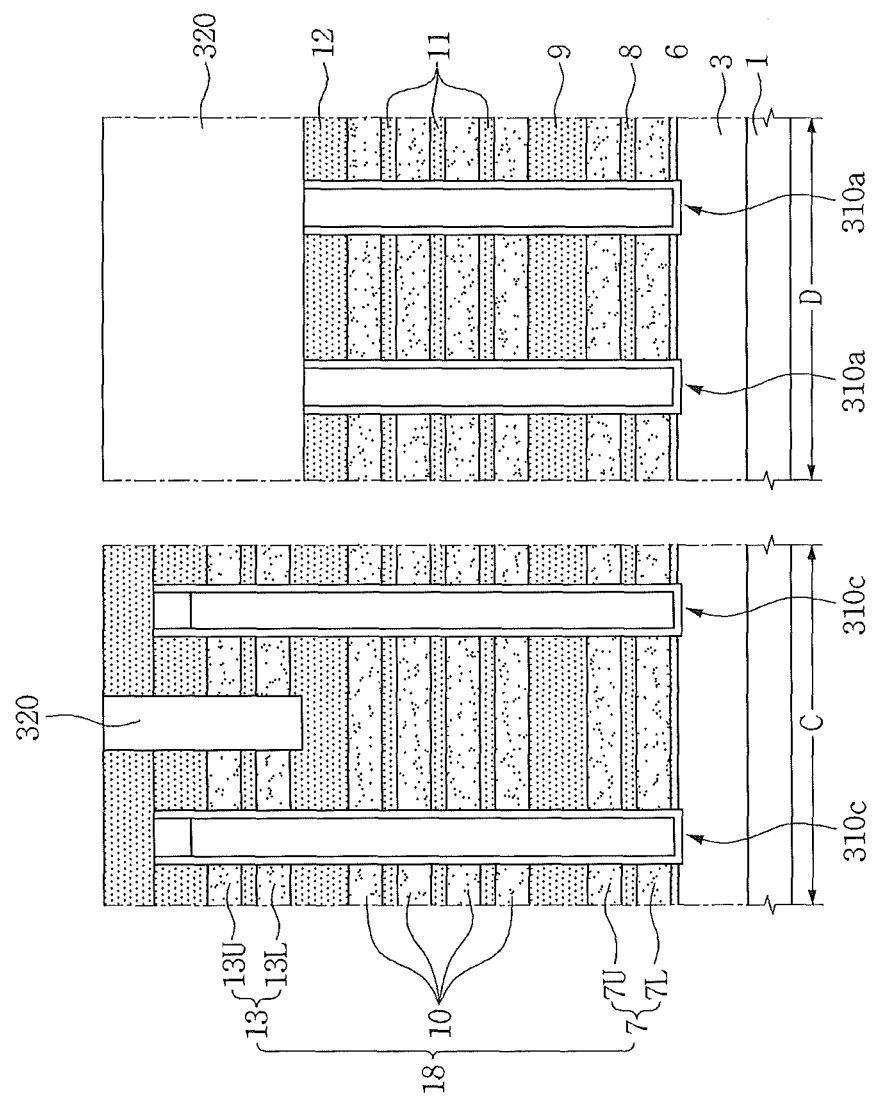

Next, a method of fabricating the semiconductor device described in FIGS. 26A and 26B will be explained with reference to FIGS. 27A to 29B, In FIGS. 27A to 29B, FIGS. 27A, 28A, and 29A show cross-sectional views taken along line IV-IV' in FIG. 25. In FIGS. 27B, 28B, and 29B, a part denoted by character C shows an area taken along line V-V' in FIG. 25, and a part denoted by character D shows an area taken along line VI-VI' in FIG. 25.

Referring to FIGS. 25, 27A, and 27B, horizontal layers including the sacrificial layers 18 and interlayer insulating layers 21 may be formed on a semiconductor substrate 1, as described in FIGS. 8A and 8B.

Vertical structures 310c and auxiliary patterns 310a passing through the horizontal layers 18 and 21 and electrically connected to the semiconductor substrate 1 may be formed simultaneously. The vertical structures 310c and auxiliary patterns 310a may be formed of the same material and have the same structure as the vertical structures 48c and auxiliary patterns 48a described in FIGS. 12A and 12B.

Referring to FIGS. 25, 28A, and 28B, a first capping layer 30 may be formed on the substrate having the vertical structures 310c and the auxiliary patterns 310a. The first capping layer 30 may be formed of silicon oxide.

Referring to FIGS. 25, 29A, and 29B, a trench intersecting and passing through the first capping layer 30, uppermost insulating layer 15, upper sacrificial layers 13, and upper insulating layer 14, may be formed. The trench may be formed to pass through the auxiliary patterns 310a. An isolation pattern 320 filling the trench may be formed. The isolation pattern 320 may be formed to overlap the auxiliary patterns 310a. The isolation pattern 320 may be formed of silicon oxide, etc.

Referring again to FIGS. 26A and 26B, a second capping layer 51 may be formed on the substrate having the isolation pattern 320. A process of forming the device isolation trench 54 described in FIGS. 13A and 13B, a process of removing the sacrificial layers 18 described in FIGS. 14A and 14B, a process of forming the dielectric 60 and the conductive patterns 66 described in FIGS. 15A, 15B, 16A, and 16B, and a process of forming the insulating vertical patterns 78a and 78b and process of forming the capping interlayer insulating layer 81 which are described in FIGS. 17A and 17B, may be sequentially processed. Next, the contact structures 90 and the bit lines 93 may be formed.

Figure 30:
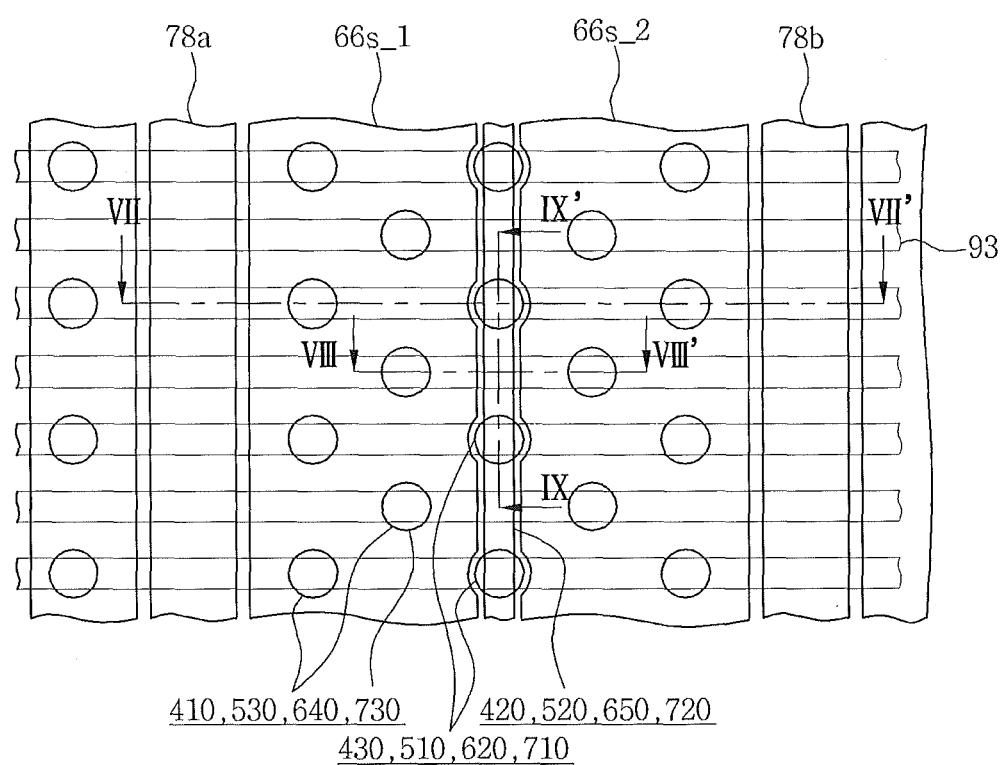
FIG. 30 is a plan view showing still another modified example of the semiconductor device in accordance with the embodiment of the inventive concept.
Figure 31A:
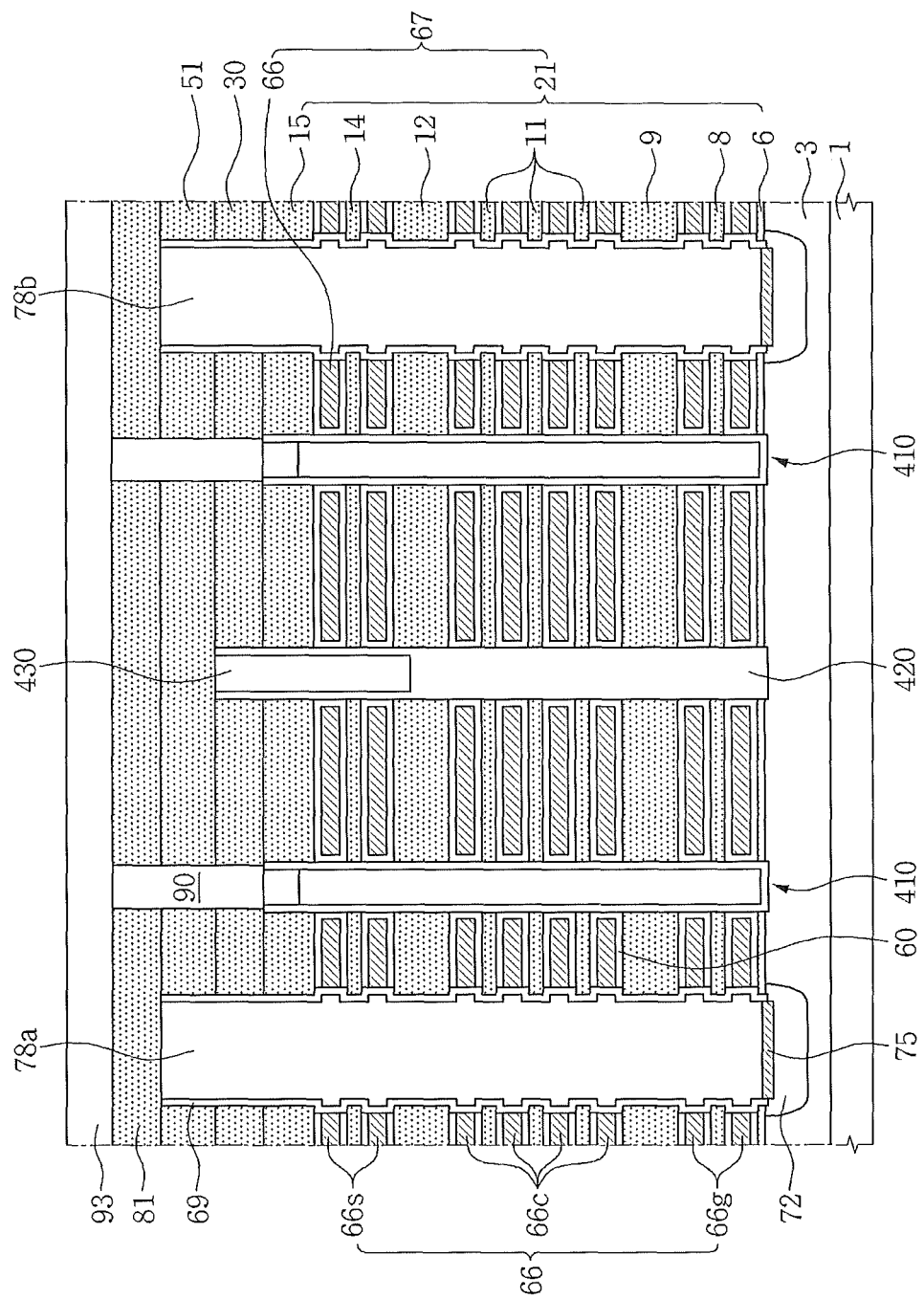

FIG. 30 is a plan view showing still another modified example of the semiconductor device in accordance with the embodiment of the inventive concept. FIGS. 31A and 31B are cross-sectional views showing still another modified example of the semiconductor in accordance with the embodiment of the inventive concept. In FIGS. 31A and 31B, FIG. 31A shows a cross-sectional views taken along line VII-VII' in FIG. 31. In FIG. 31B, a part denoted by character E shows an area taken along line VIII-VIII' in FIG. 30, and a part denoted by character F shows an area taken along line IX-IX' in FIG. 30.

Referring to FIGS. 30, 31A, and 31B, as described with reference to FIGS. 2A and 2B, first and second insulating vertical patterns 78a and 78b may be disposed on a semiconductor substrate 1. As described in FIGS. 2A and 2B, a stacked structure 67 including the alternately and repeatedly stacked interlayer insulating layers 21 and conductive patterns 66, may be formed on the substrate 1 between the first and second insulating vertical patterns 78a and 78b. As described in FIGS. 2A and 2B, the conductive patterns 66 may include first and second conductive lines 66s_1 and 66s_2 which are located at the same level and spaced apart from each other.

Vertical structures 410 passing through the conductive patterns 66 and interlayer insulating layers 21 may be disposed. The vertical structures 410 may be formed of the same material and have the same cross-sectional structure as the vertical structures 48c described in FIGS. 2A and 2B or the vertical structures 48c' described in FIGS. 4A and 4B.

A first capping layer 30 may be disposed on the stacked structure 67 and the vertical structures 410.

Auxiliary patterns 430 located between the first and second conductive lines 66s_1 and 66s_2 and passing through the first capping layer 30, interlayer insulating layers 21, and conductive patterns 66 may be disposed. The auxiliary patterns 430 may be formed of a single layer or a multi layer.

An isolation pattern 420 interposed between the first and second conductive lines 66s_1 and 66s_2, and passing through the first capping layer 30, uppermost insulating layer 15, and upper insulating layer 14, may be disposed. The isolation pattern 420 may have a bottom surface located at a lower level than the first and second conductive lines 66s_1 and 66s_2. The isolation pattern 420 may overlap and be in direct contact with the auxiliary patterns 430. The isolation pattern 420 may have a smaller width than the auxiliary patterns 430. The isolation pattern 420 may have a shape inserted into the upper portion of the auxiliary patterns 430. The isolation pattern 420 may be formed of an insulating material such as silicon oxide.

A second capping layer 51 may be disposed on the first capping layer 30. The first and second capping layers 30 and 51 may be disposed between the insulating vertical patterns 78a and 78b.

A capping interlayer insulating layer 81 covering the second capping layer 51 and insulating vertical patterns 78a and 78b may be provided. Contact structures 90 passing through the capping interlayer insulating layer 81, second capping layer 51, and first capping layers 30 and electrically connected to the vertical structures 410, may be provided. Bit lines 93 may be provided on the contact structures 90.

Next, a method of fabricating the semiconductor device described in FIGS. 31A and 31B will be explained with reference to FIGS. 32A to 33B. FIGS. 32A to 33B are cross-sectional views describing a method of fabricating the semiconductor device described with reference to FIGS. 31A and 31B. In FIGS. 32A to 33B, FIGS. 32A and 33A are cross-sectional views taken along line VII-VII' in FIG. 30. In FIGS. 32B and 33B, a part denoted by character E shows an area taken along line VIII-VIII' in FIG. 30, and a part denoted by character F shows an area taken along line IX-IX' in FIG. 30.

Figure 32A:
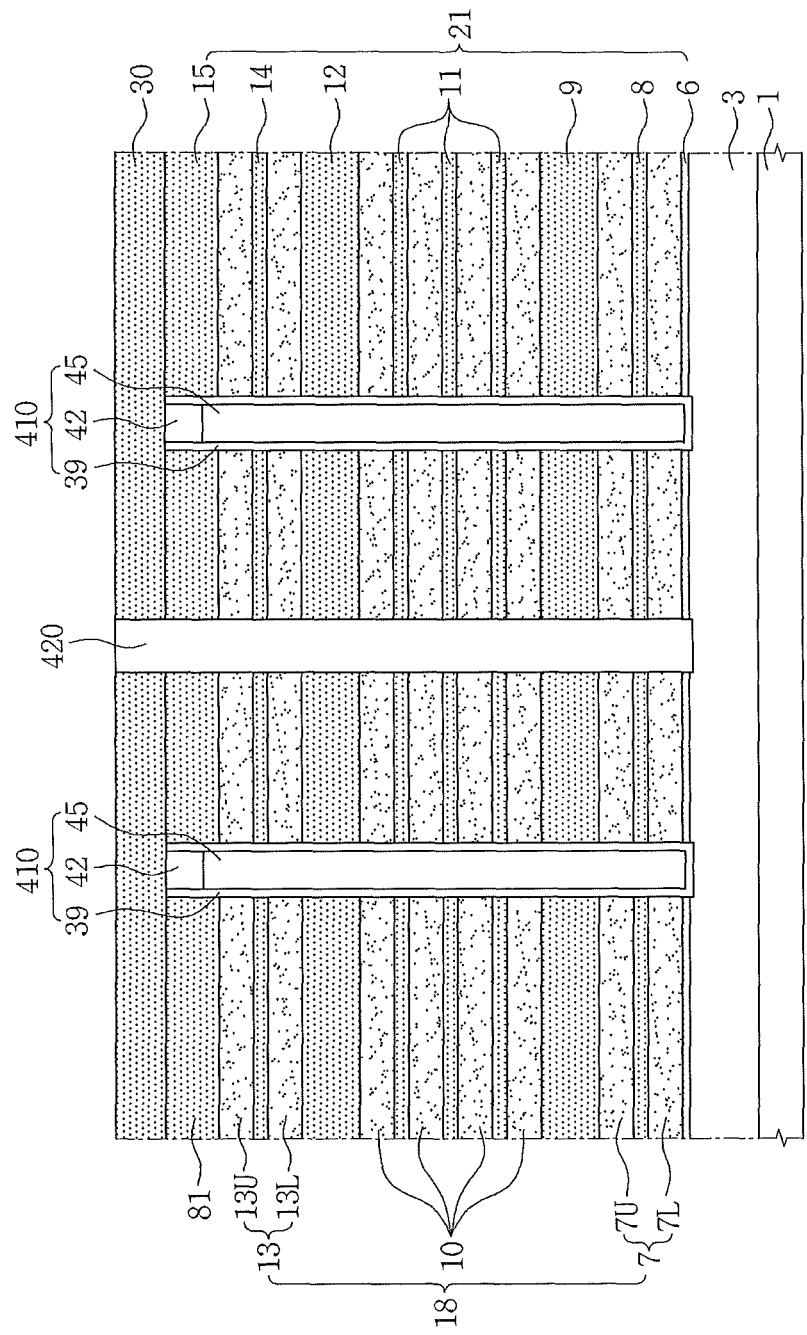
FIGS. 32A to 33B are cross-sectional views showing a method of fabricating still another modified example of the semiconductor device in accordance with the embodiment of the inventive concept.
Figure 32B:
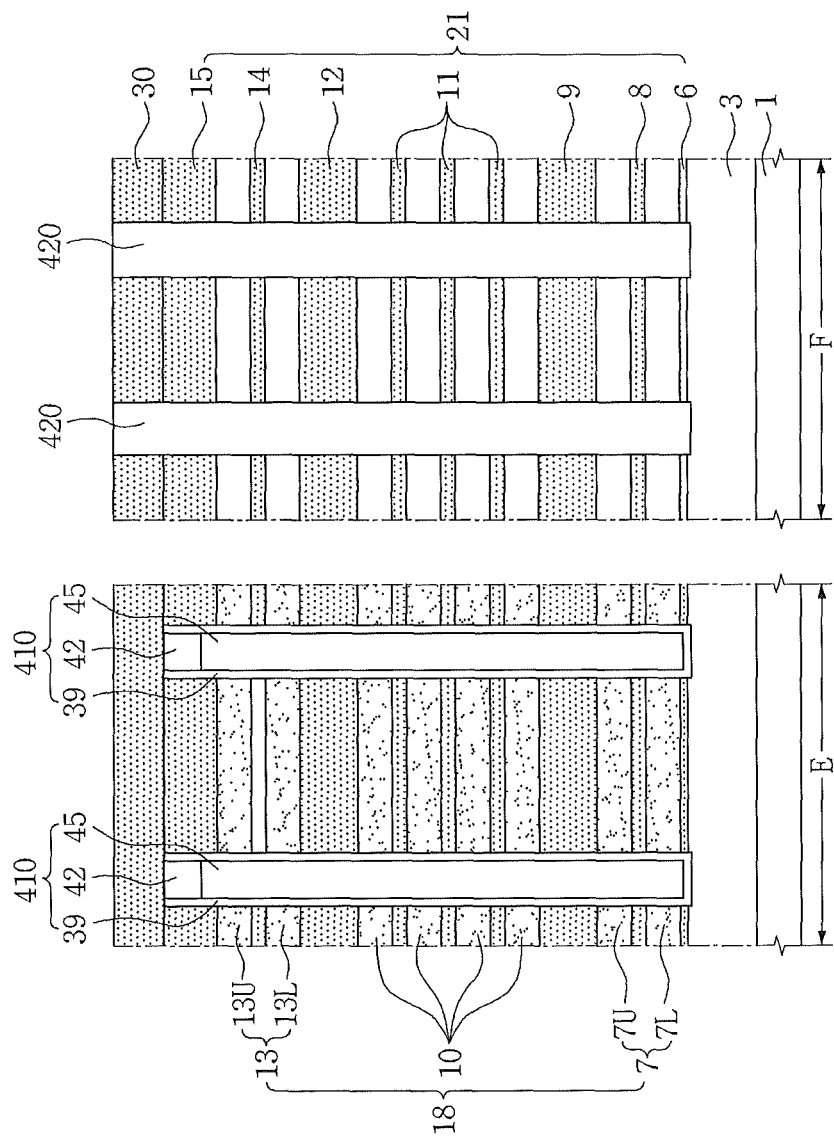

Referring to FIGS. 30, 32A, and 32B, a substrate 1 in which horizontal layers 18 and 21 as described in FIGS. 8A and 8B are formed, may be provided. The horizontal layers 18 and 21 may include alternatively, repeatedly, and vertically stacked interlayer insulating layers 21 and sacrificial layers 18.

Vertical structures 410 passing through the horizontal layers 18 and 21 may be formed. The vertical structures 410 may include a semiconductor pattern 39.

A first capping layer 30 may be formed on the substrate having the vertical structures 410.

Auxiliary patterns 430 passing through the first capping layer 30 and horizontal layers 18 and 21 may be formed.

The auxiliary patterns 430 may be formed as a single layer or a multi layer. For example, the auxiliary patterns 430 may be formed of a silicon oxide layer. On the other hand, each of the auxiliary patterns 430 may include a pillar-shaped first pattern formed of a conductive material such as polysilicon, and a second pattern formed of an insulating material such as silicon oxide and covering bottom and side surfaces of the first pattern.

Figure 33A:
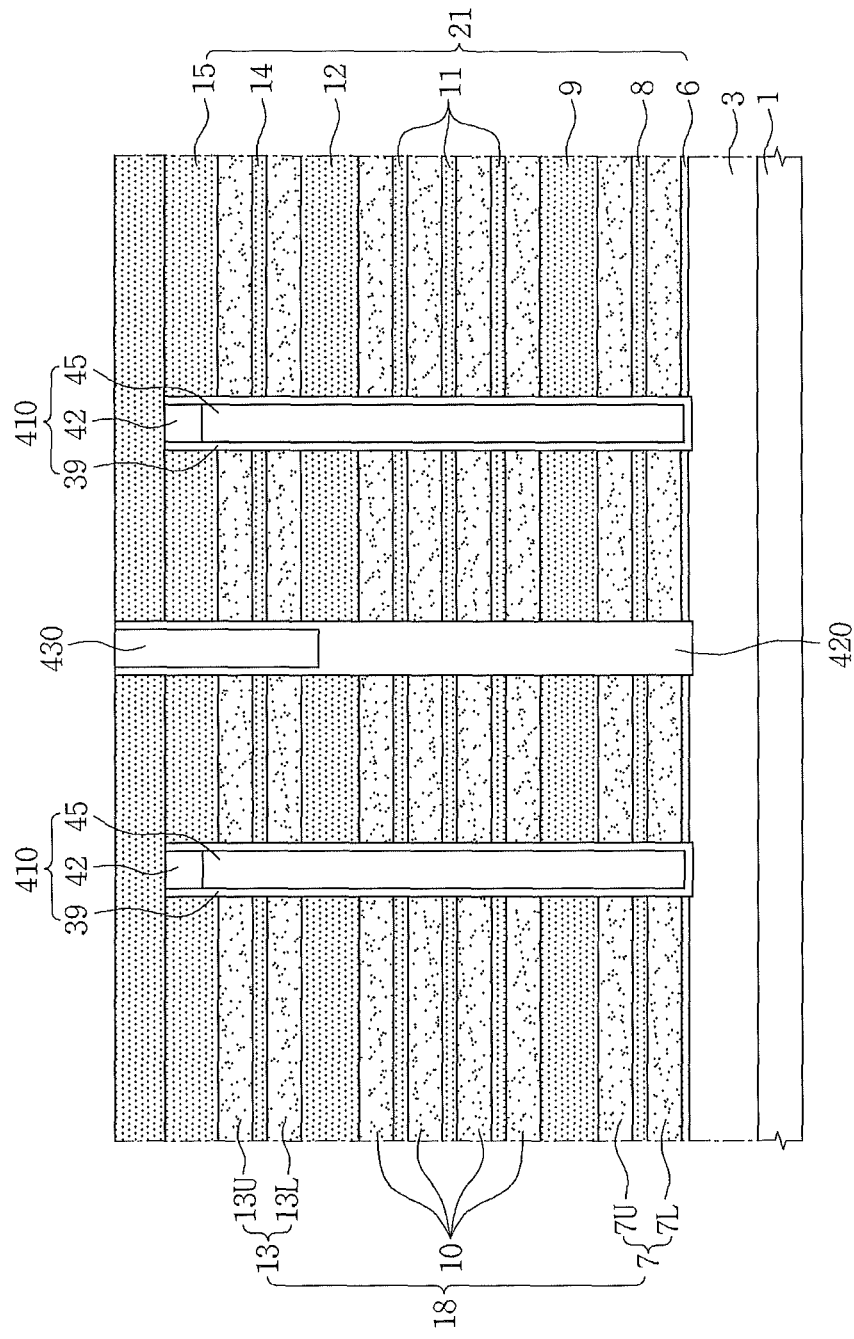
Figure 33B:
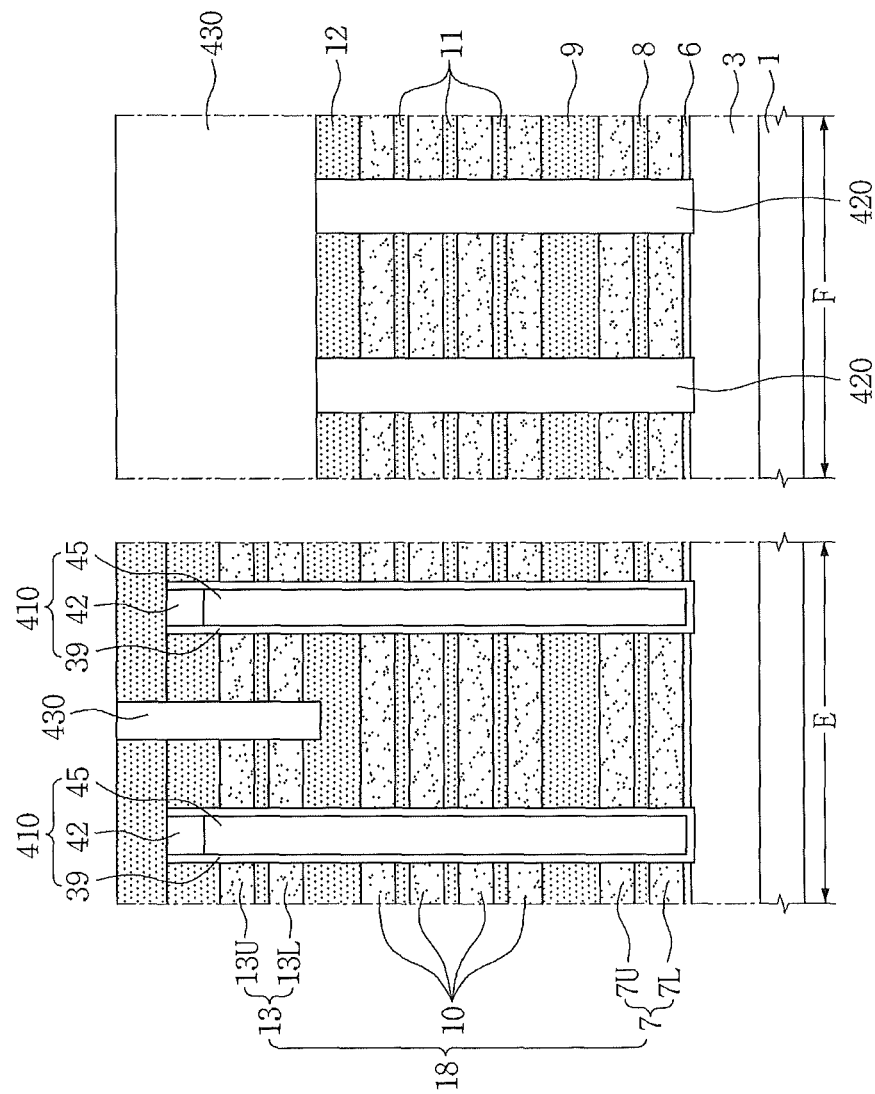

Referring to FIGS. 30, 33A, and 33B, an isolation pattern 430 which overlaps the auxiliary patterns 420 and intersects and separates the upper sacrificial layers 13 among the horizontal layers 18 and 21, may be formed.

The isolation pattern 430 may pass through the uppermost insulating layer 15 and first capping layer 30 located on the upper sacrificial layers 13, and pass through the upper insulating layer 14 located between the upper sacrificial layers 13.

The isolation pattern 430 may have a smaller width than the auxiliary patterns 430. The isolation pattern 430 may be formed to intersect upper portion of the auxiliary patterns 420.

Referring again to FIGS. 31A and 31B, a second capping layer 51 may be formed on the substrate having the isolation pattern 420. A process of forming the device isolation trench 54 described in FIGS. 13A and 13B on the substrate having the second capping layer 51, a process of removing the sacrificial layers 18 described in FIGS. 14A and 14B, a process of forming the dielectric 60 and the conductive patterns 66 described in FIGS. 15A, 15B, 16A, and 16B, and a process of forming the insulating vertical patterns 78a and 78b and process of forming the capping interlayer insulating layer 81 which are described in FIGS. 17A and 17B, may be sequentially processed. Next, the contact structures 90 and the bit lines 93 may be formed.

Figure 34A:
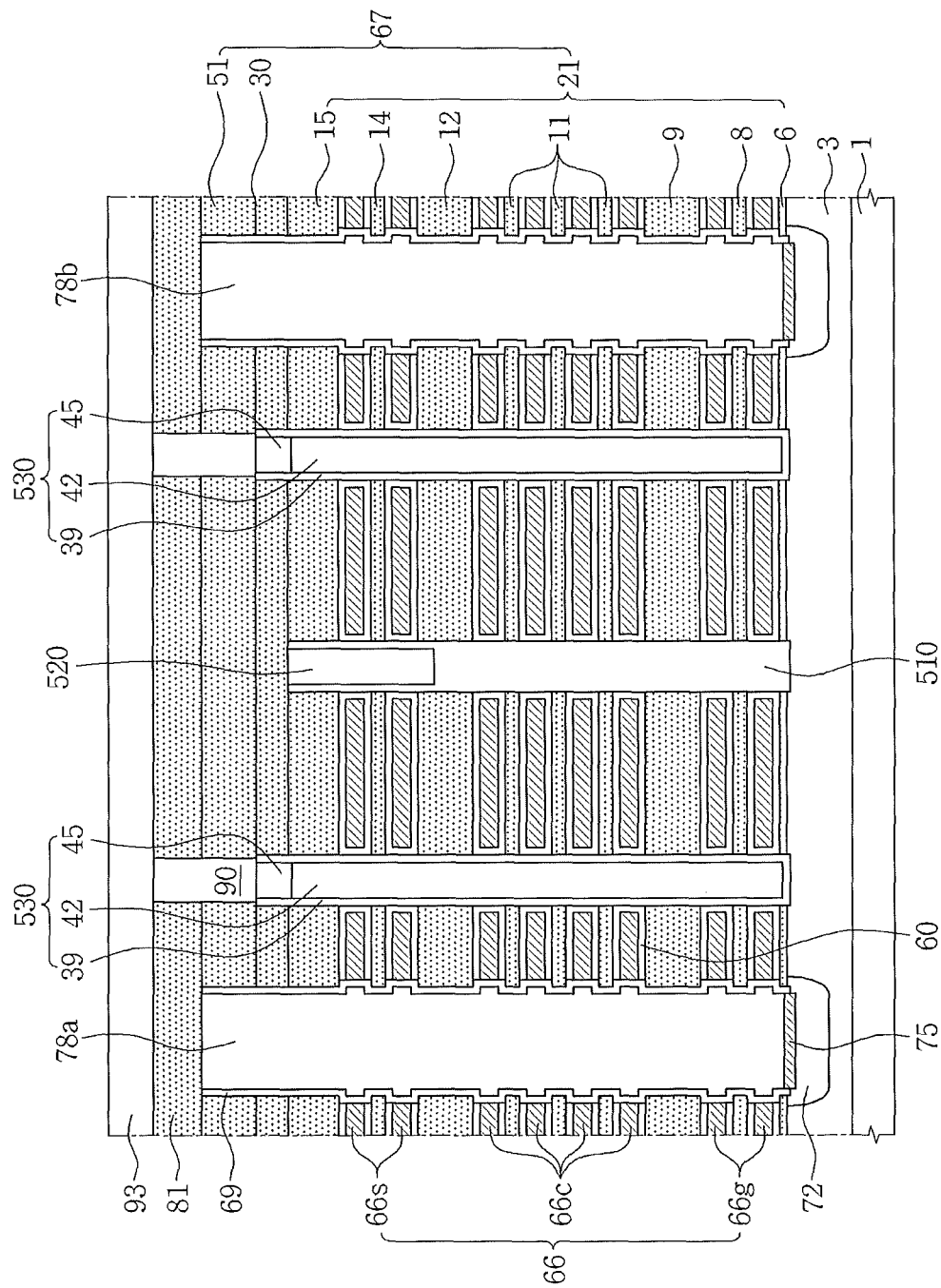
FIGS. 34A and 34B are cross-sectional views showing still another modified example of the semiconductor device in accordance with the embodiment of the inventive concept.
Figure 34B:
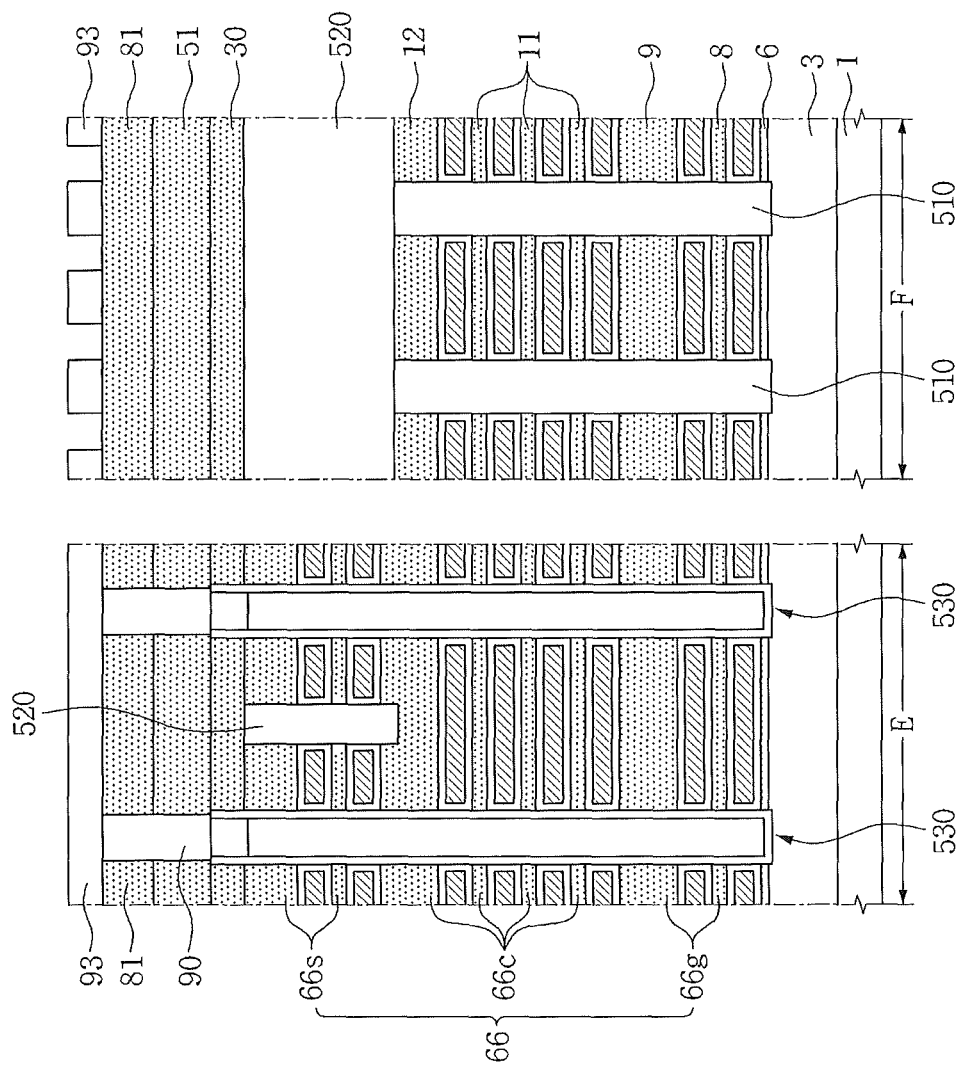

FIGS. 34A and 34B are cross-sectional views showing still another modified example of the semiconductor device in accordance with the embodiment of the inventive concept. In FIGS. 34A and 34B, FIG. 34A shows a cross-sectional view taken along line VII-VII' in FIG. 30. In FIG. 34B, a part denoted by character E shows an area taken along line VIII-VIII' in FIG. 30, and a part denoted by character F shows an area taken along line IX-IX' in FIG. 30.

Referring to FIGS. 30, 34A, and 34B, as described with reference to FIGS. 2A and 2B, first and second insulating vertical patterns 78a and 78b may be disposed on a semiconductor substrate 1. As described in FIGS. 2A and 2B, the stacked structure 67 including the alternately and repeatedly stacked interlayer insulating layers 21 and conductive patterns 66, may be disposed on the substrate 1 between the first and second insulating vertical patterns 78a and 78b. As described in FIGS. 2A and 2B, the conductive patterns 66 may include first and second conductive lines 66s_1 and 66s_2 located at the same level and spaced apart from each other.

Auxiliary patterns 510 located between the first and second conductive lines 66s_1 and 66s_2 and passing through the stacked structure 67 may be disposed.

An isolation pattern 520 interposed between the first and second conductive lines 66s_1 and 66s_2, and intersecting and passing through the uppermost insulating layer 15 and upper insulating layer 14, may be disposed. In addition, the isolation pattern 520 may intersect the auxiliary patterns 510 located between the first and second conductive lines 66s_1 and 66s_2, and be in contact with the auxiliary patterns 510.

A first capping layer 30 located between the insulating vertical patterns 78a and 78b and covering the stacked structure 67 and isolation pattern 520 may be disposed.

Vertical structures 530 passing through the first capping layer 30 and stacked structure 67 may be disposed.

A second capping layer 51 located between the insulating vertical patterns 78a and 78b and covering the first capping layer 30 and vertical structures 530 may be disposed.

A capping interlayer insulating layer 81 covering the second capping layer 51 and insulating vertical patterns 78a and 78b, may be provided.

Contact structures 90 passing through the capping interlayer insulating layer 81 and second capping layer 51 and electrically connected to the vertical structures 530, may be provided. Bit lines 93 may be provided on the contact structures 90.

Figure 35A:
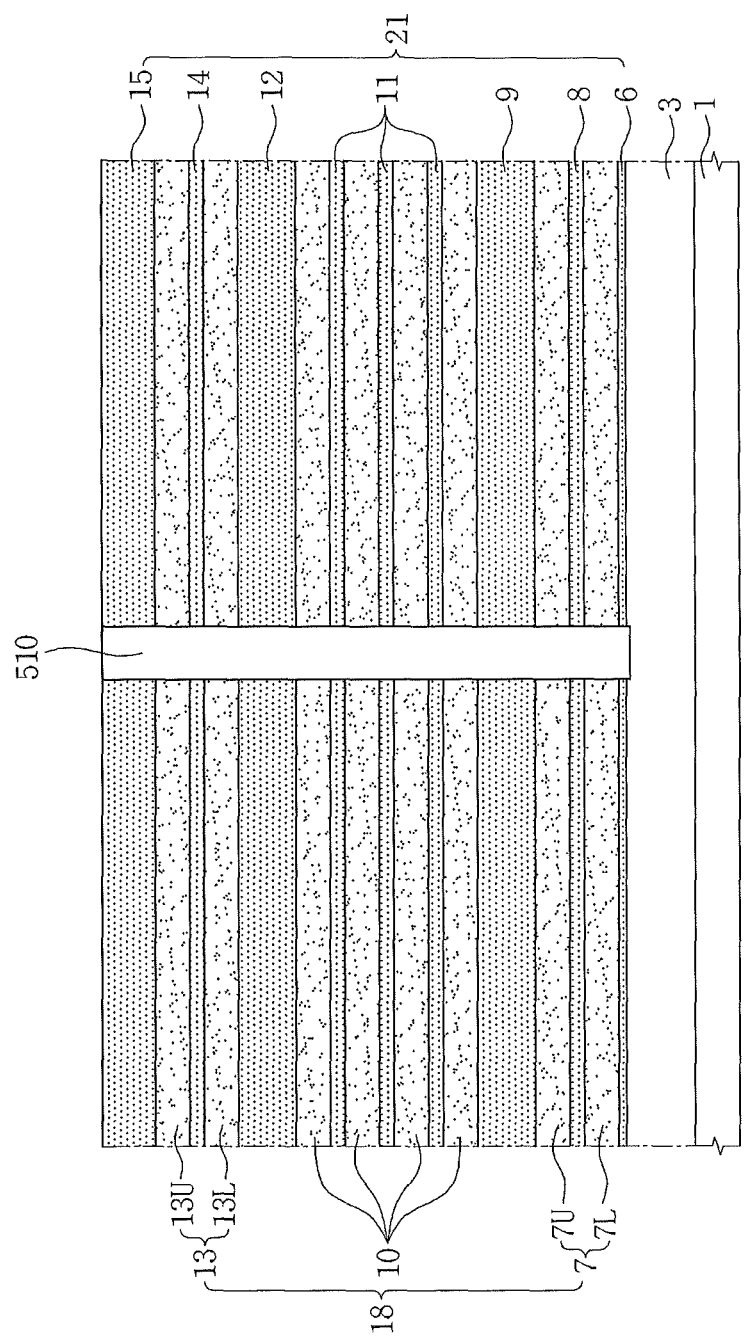
FIGS. 35A to 37B are cross-sectional views showing a method of fabricating still another modified example of the semiconductor device in accordance with the embodiment of the inventive concept.
Figure 35B:
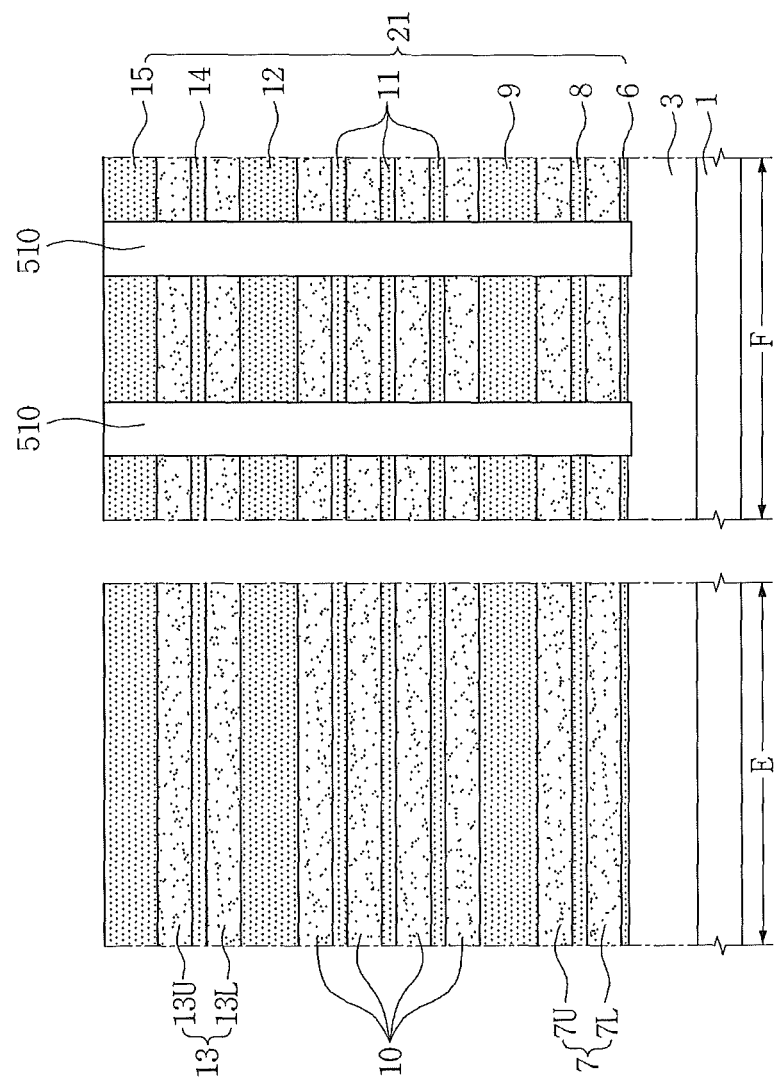
Figure 36A:
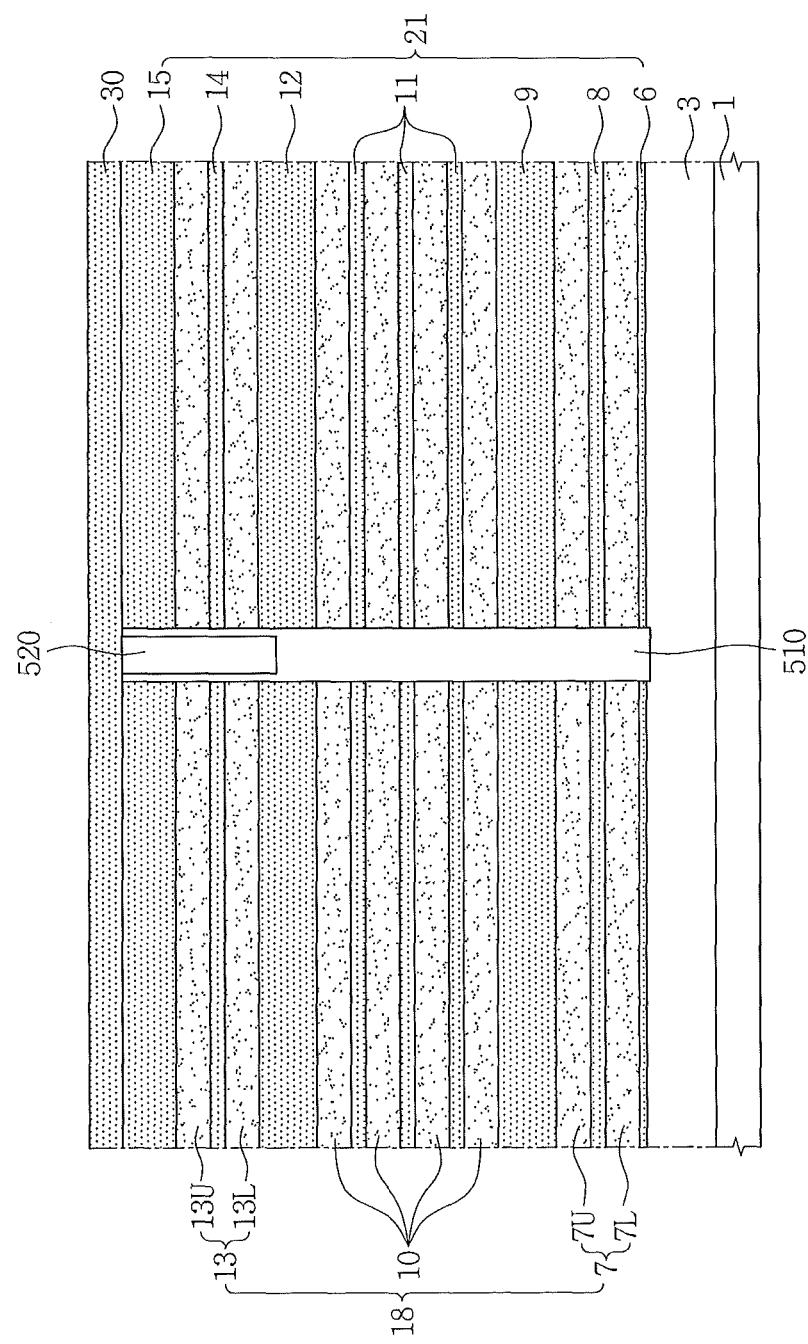
Figure 36B:
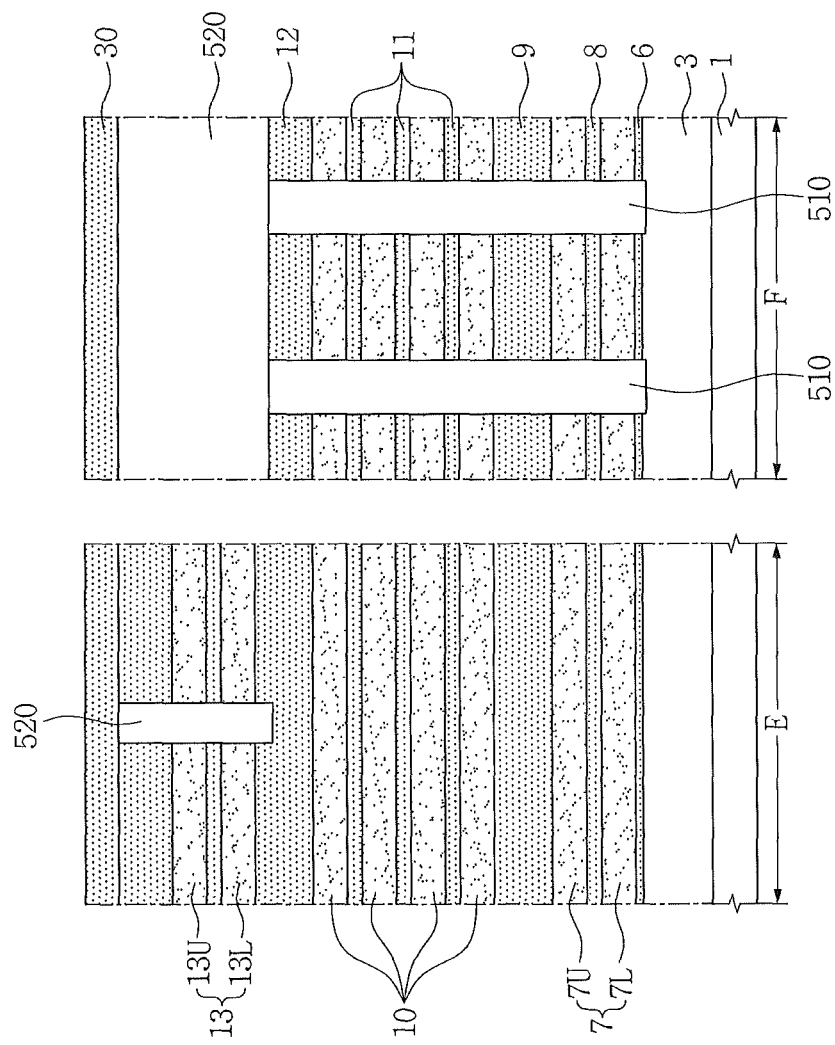
Figure 37A:
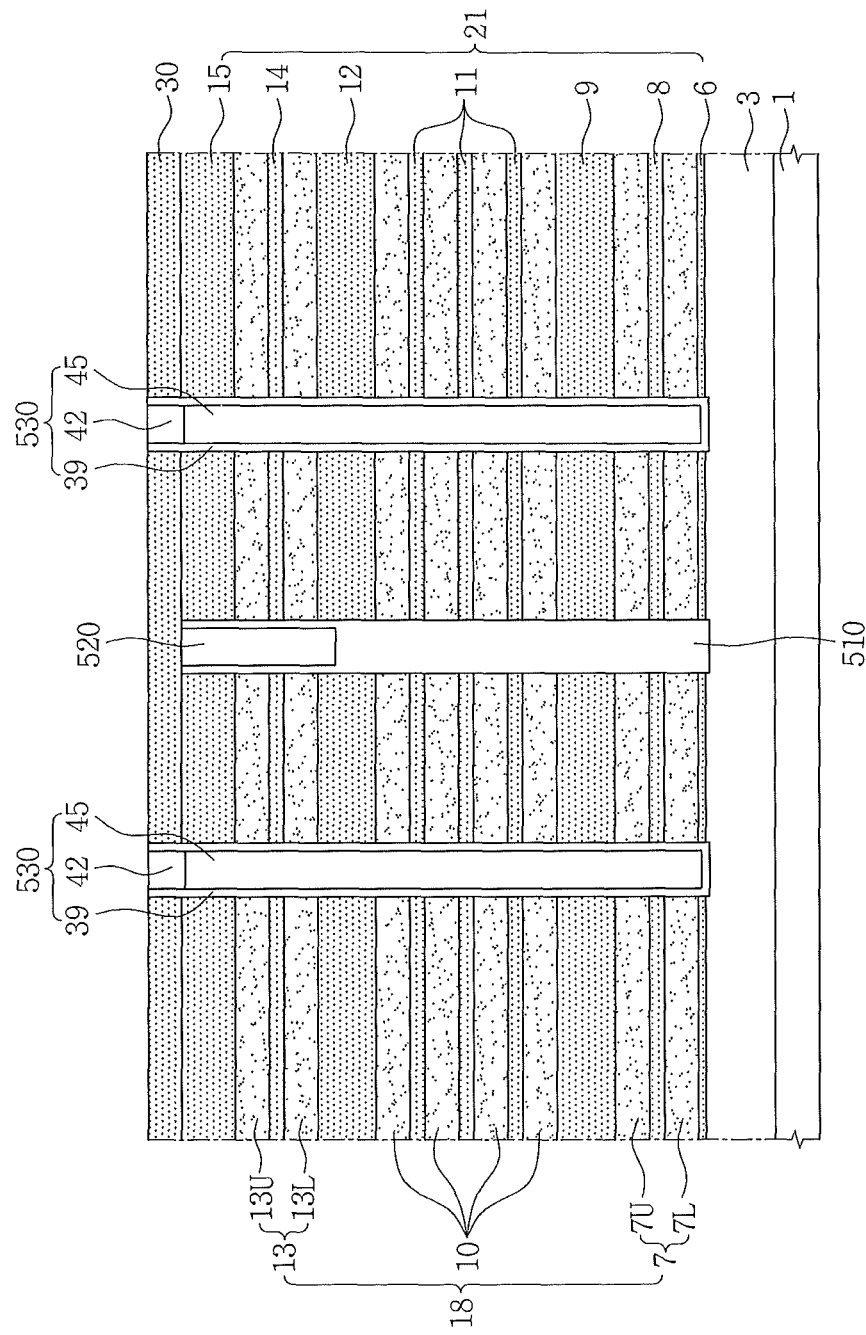
Figure 37B:
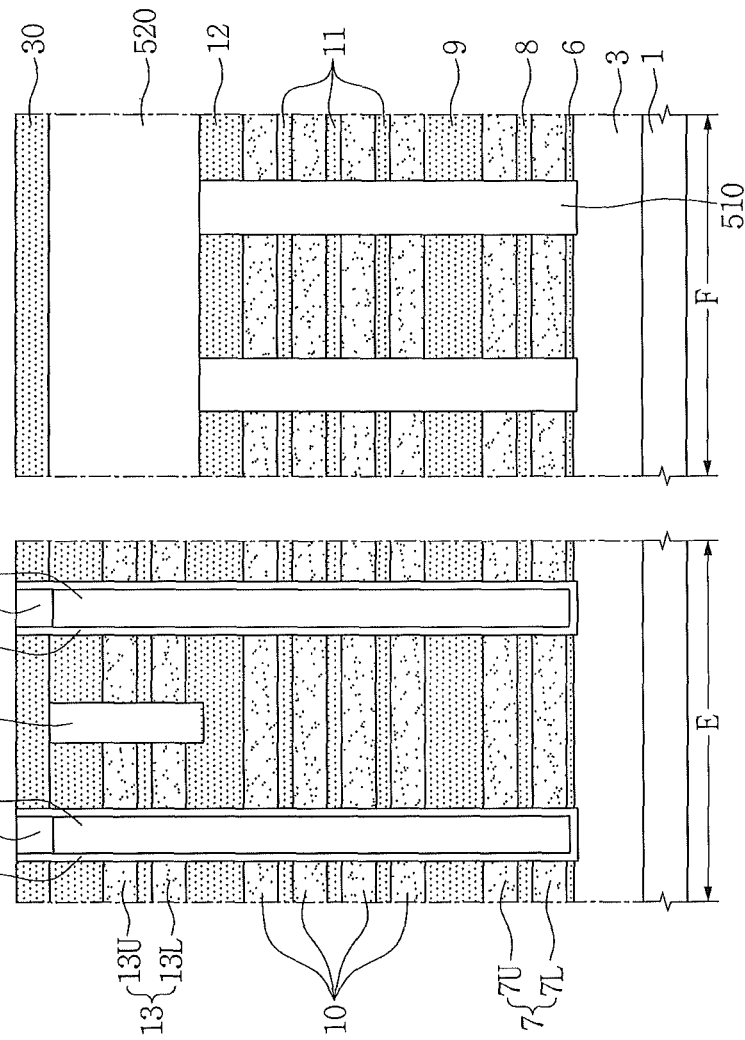

FIGS. 35A, 35B, 36A, 36B, 37A, and 37B are cross-sectional views describing a method of fabricating the semiconductor device described in FIGS. 34A and 34B. In FIGS. 35A to 37B, FIGS. 35A, 36A, and 37A show cross-sectional views taken along line VII-VII' in FIG. 30. In FIGS. 35B, 36B, and 37B, a part denoted by character E shows an area taken along line VIII-VIII' in FIG. 30, and a part denoted by character F shows an area taken along line IX-IX' in FIG. 30.

Referring to FIGS. 30, 35A, and 35B, a substrate 1 in which horizontal layers 18 and 21 as described in FIGS. 8A and 8B are formed, may be provided. The horizontal layers 18 and 21 may include the alternatively, repeatedly, and vertically stacked interlayer insulating layers 21 and sacrificial layers 18.

Auxiliary patterns 510 passing through the horizontal layers 18 and 21 and spaced apart from each other may be formed.

Referring to FIGS. 30, 36A, and 36B, an isolation pattern 520 intersecting and passing through at least the upper sacrificial layers 13, may be formed on the substrate having the auxiliary patterns 510. The isolation pattern 520 may pass through the uppermost insulating layer 15 located on the upper sacrificial layers 13, and the upper insulating layer 14 located between the upper sacrificial layers 13. The isolation pattern 520 may intersect the auxiliary patterns 510 and be in contact with the auxiliary patterns 510.

A first capping layer 30 may be formed on the substrate having the auxiliary patterns 510 and the isolation pattern 520.

Referring to FIGS. 30, 37A, and 37B, vertical structures 530 passing through the first capping layer 30 and horizontal layers 18 and 21 may be formed. The vertical structures 530 may be formed at both sides of the isolation pattern 510.

Referring again to FIGS. 34A and 34B, a second capping layer 51 may be formed on the substrate having the isolation pattern 520. A process of forming the device isolation trench 54 described in FIGS. 13A and 13B on the substrate having the second capping layer 51, a process of removing the sacrificial layers 18 described in FIGS. 14A and 14B, a process of forming the dielectric 60 and the conductive patterns 66 described in FIGS. 15A, 15B, 16A, and 16B, and a process of forming the insulating vertical patterns 78a and 78b and process of forming the capping interlayer insulating layer 81 which are described in FIGS. 17A and 17B, may be sequentially processed. Next, the contact structures 90 and the bit lines 93 may be formed.

Figure 38A:
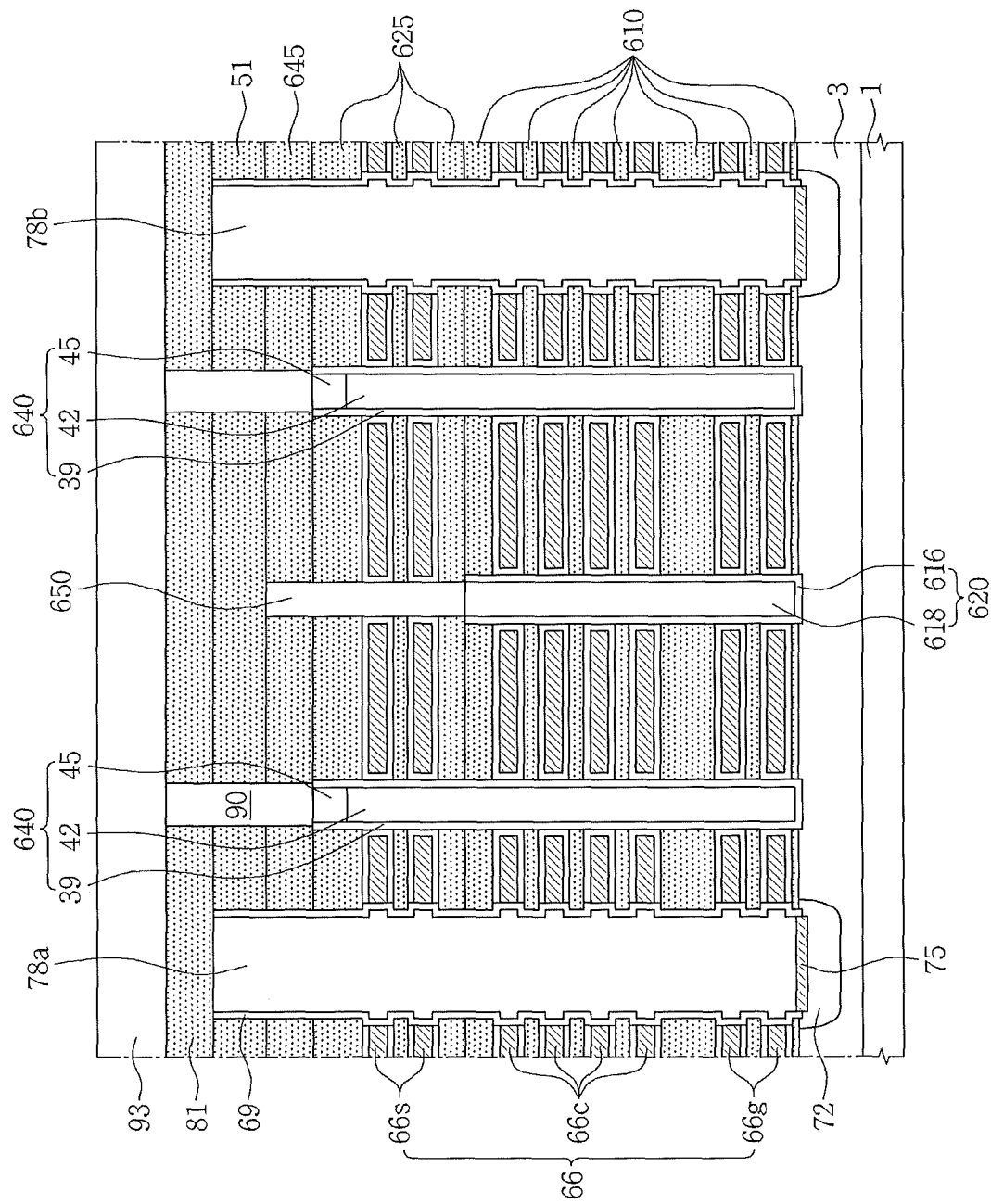
FIGS. 38A and 38B are cross-sectional views showing still another modified example of the semiconductor device in accordance with the embodiment of the inventive concept.
Figure 38B:
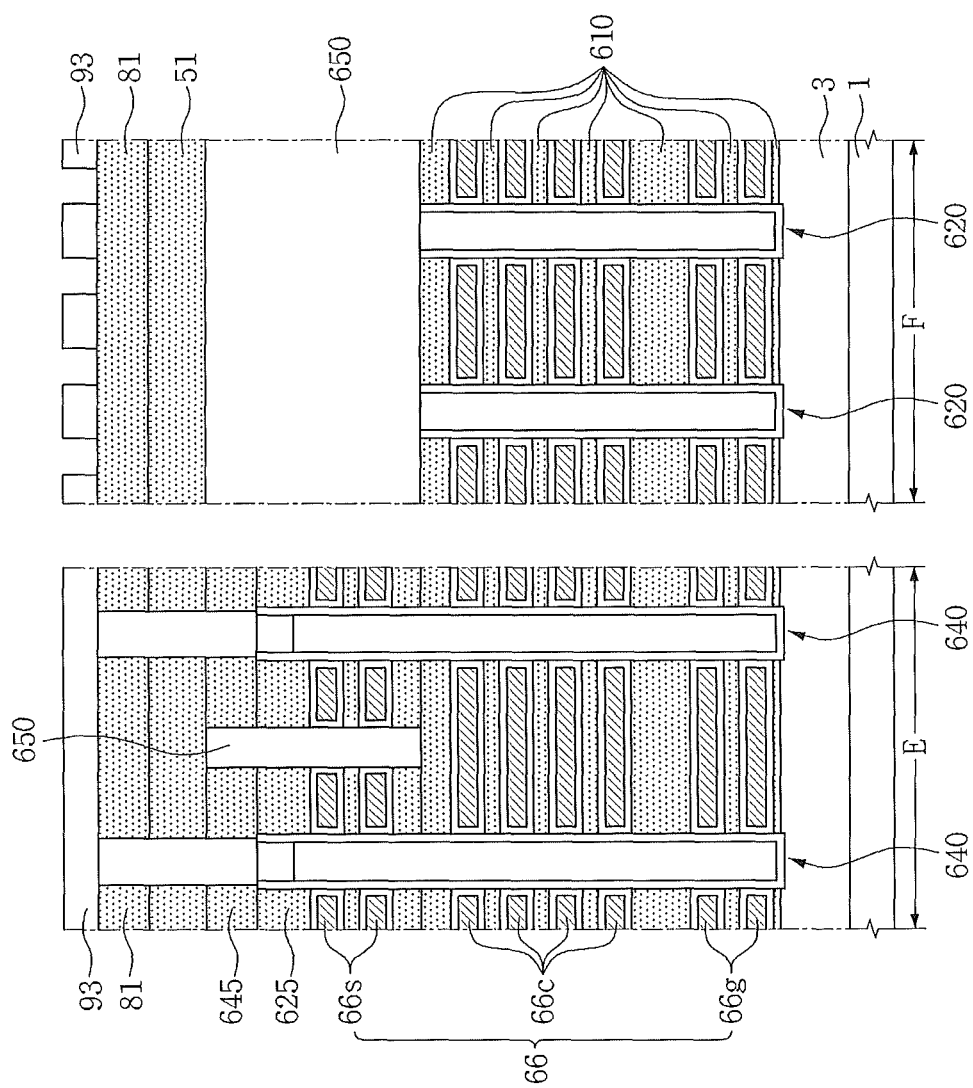

FIGS. 38A and 38B are cross-sectional views describing still another modified example of the semiconductor device in accordance with the embodiment of the inventive concept. In FIGS. 38A and 38B, FIG. 38A shows a cross-sectional view taken along line VII-VII' in FIG. 30. In FIG. 38B, a part denoted by character E shows an area taken along line VIII-VIII' in FIG. 30, and a part denoted by character F shows an area taken along line IX-IX' in FIG. 30.

Referring to FIGS. 30, 38A, and 38B, insulating vertical patterns 78a and 78b may be disposed on a semiconductor substrate 1. The insulating vertical patterns 78a and 78b may have line shapes, in a plan view.

First interlayer insulating layers 610 located between the insulating vertical patterns 78a and 78b and vertically arranged on the substrate 1, may be disposed. The first interlayer insulating layers 610 may be spaced apart from each other.

Lower and intermediate conductive patterns 66g and 66c located between the insulating vertical patterns 78a and 78b and between the first interlayer insulating layers 610, may be disposed. Accordingly, the first interlayer insulating material layers 610 and the lower and intermediate conductive patterns 66g and 66c may be alternatively, repeatedly, and vertically arranged.

Auxiliary patterns 620 passing through the first interlayer insulating layers 610 and lower and intermediate conductive patterns 66g and 66c may be disposed. The auxiliary patterns 620 may include a pillar-shaped first pattern 618, and an insulating second pattern 616 covering bottom and side surfaces of the first pattern 618.

In some embodiments, as illustrated in FIGS. 38A and 38B, pillar-shaped auxiliary patterns 620 may be disposed.

Figure 39:
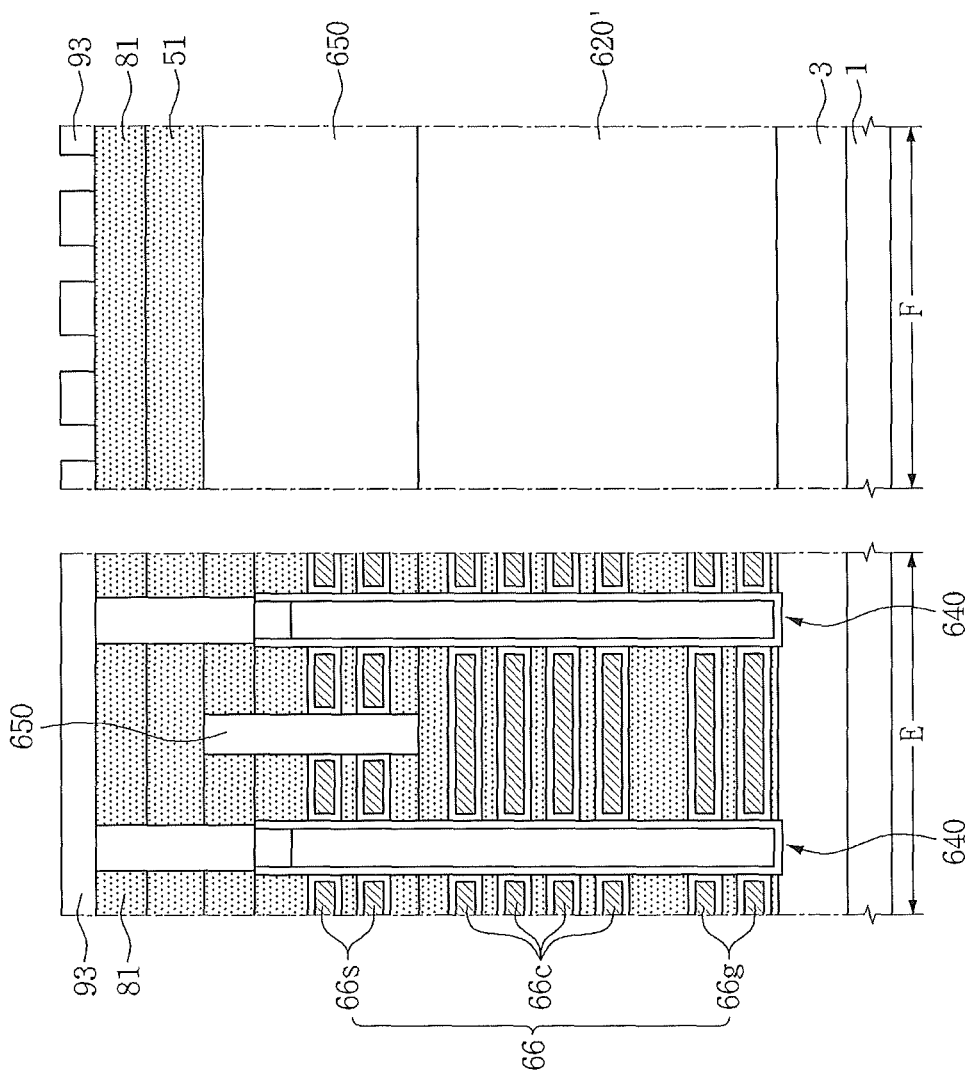
FIG. 39 is a cross-sectional view showing still another modified example of the semiconductor device in accordance with the embodiment of the inventive concept.

In other embodiments, as illustrated in FIG. 39, line-shaped auxiliary patterns 620' may be disposed.

Second interlayer insulating layers 625 located between the insulating vertical patterns 78a and 78b and vertically arranged on the first interlayer insulating layers 610, may be disposed. The second interlayer insulating layers 625 may be spaced apart from each other. Conductive lines 66s may be disposed between the second interlayer insulating layers 625. Accordingly, the second interlayer insulating layers 625 and the conductive lines 66s may be alternately, repeatedly, and vertically arranged. The conductive lines 66s may include a first conductive line 66s_1 and a second conductive line 66s_2 spaced apart from each other on the same plane.

The conductive lines 66s and the lower and intermediate conductive patterns 66c and 66g may configure conductive patterns 66.

Vertical structures 640 passing through the first and second interlayer insulating layers 610 and 625 and conductive patterns 66, may be disposed. Each of the vertical structures 640 may include a semiconductor pattern 39. Each of the vertical structures 640 may be substantially formed of the same material and have the same structure as the vertical structures 48c described in FIGS. 2A and 2B, or the vertical structures 48c' described in FIGS. 4A and 4B.

A first capping layer 645 located between the insulating vertical patterns 78a and 78b and on the second interlayer insulating layers 625, may be disposed.

Isolation pattern 650 located between the first and second conductive lines 66s_1 and 66s_2 and passing through the first capping layer 645 and second interlayer insulating layers 625 may be disposed. The isolation pattern 650 may be formed of an insulating material such as silicon oxide.

A second capping layer 51 located between the insulating vertical patterns 78a and 78b and covering the isolation pattern 650 and first capping layer 645 may be disposed.

A capping interlayer insulating layer 81 covering the insulating vertical patterns 78a and 78b and the second capping layer 51.

Conductive contact structures 90 passing through the capping interlayer insulating layer 81 and second capping layer 51 and electrically connected to the vertical structures 640, may be disposed. Bit lines 93 electrically connected to the contact structures 90 may be disposed on the capping interlayer insulating layer 81.

FIGS. 40A, 40B, 41A, 41B, 42A, 42B, 43A, and 43B are cross-sectional views describing a method of fabricating the semiconductor device described in FIGS. 38A and 38B. In FIGS. 40A to 43B, FIGS. 40A, 41A, 42A, and 43A show cross-sectional views taken along line VII-VII' in FIG. 30. In FIGS. 40B, 41B, 42B, and 43B, a part denoted by character E shows an area taken along line VIII-VIII' in FIG. 30, and a part denoted by character F shows an area taken along line IX-IX' in FIG. 30.

Figure 40A:
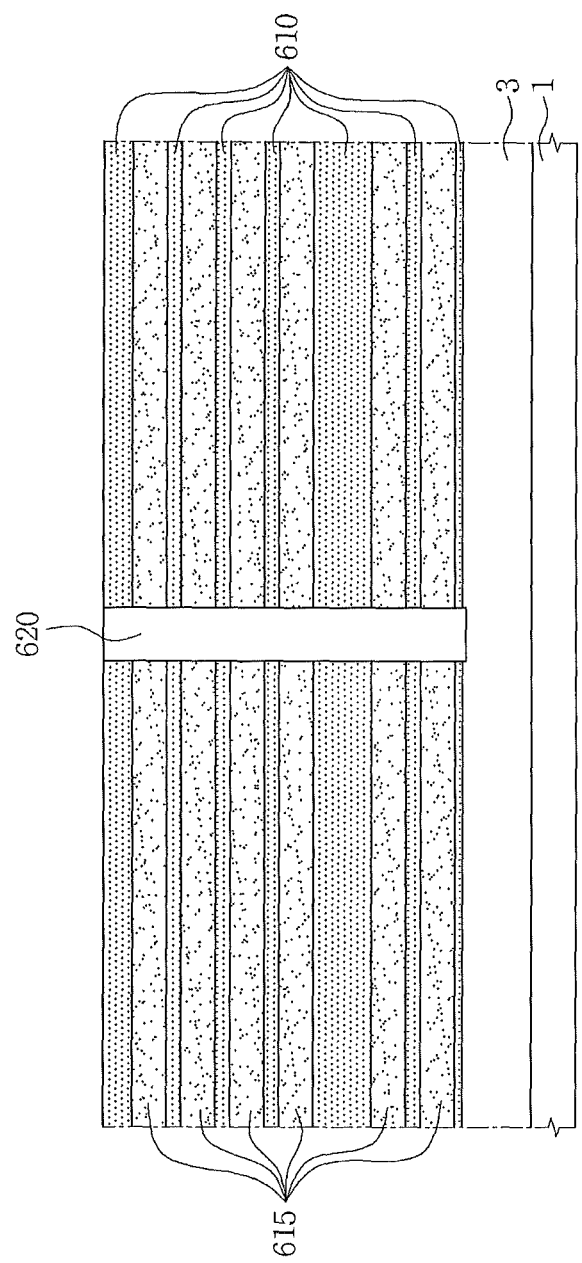
FIGS. 40A to 43B are cross-sectional views showing a method of fabricating still another modified example of the semiconductor device in accordance with the embodiment of the inventive concept.
Figure 40B:
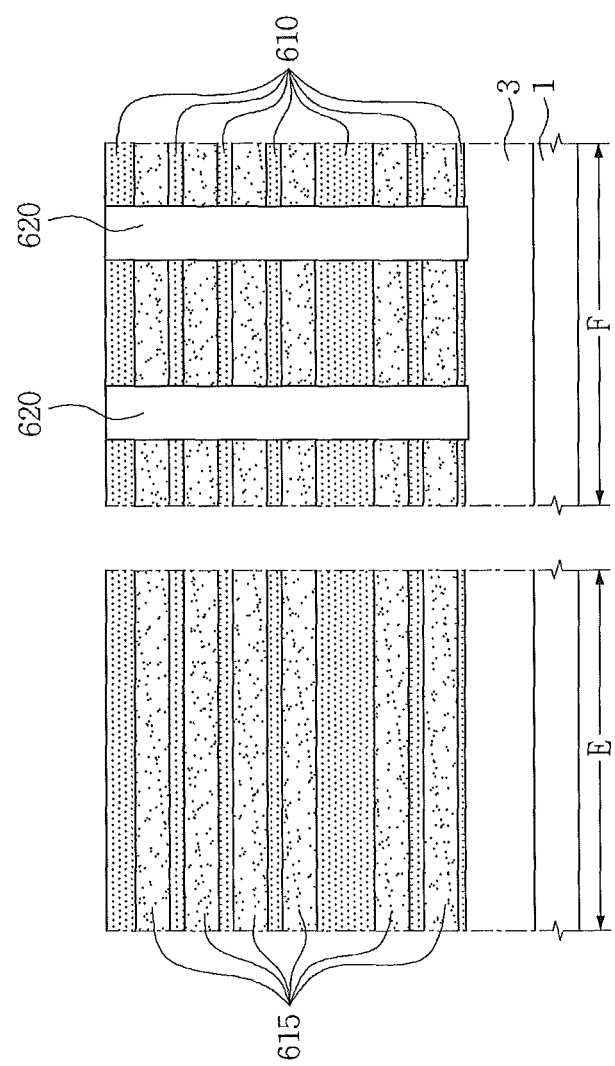

Referring to FIGS. 30, 40A, and 40B, alternately and repeatedly stacked first interlayer insulating layers 610 and first sacrificial layers 615 may be formed on a semiconductor substrate 1 having a well region 3. The first sacrificial layers 615 may be vertically spaced apart from each other by the first interlayer insulating layers 610. The lowermost layer of the first interlayer insulating layers 610 may be located at a lower level than the lowermost layer of the first sacrificial layers 615. The uppermost layer of the first interlayer insulating layers 610 may be located at a higher level than the uppermost layer of the first sacrificial layers 615.

Auxiliary patterns 620 passing through the first interlayer insulating layers 610 and first sacrificial layers 615 may be formed. The auxiliary patterns 620 may be formed to include a material having etch selectivity with respect to the first sacrificial layer 615 and a second sacrificial layer (see 630 of FIGS. 41A and 41B.) For example, the auxiliary patterns 620 may be formed of an insulating material such as silicon oxide. The auxiliary patterns 620 may be formed as a single layer or a multi layer. For example, the auxiliary patterns 620 may be formed of a pillar-shaped silicon oxide layer, or formed to include a pillar-shaped first pattern and a second pattern covering bottom and side surfaces of the first pattern. The first pattern may be formed of a conductive material such as polysilicon, and the second pattern may be formed of an insulating material such as silicon oxide.

In other embodiments, the auxiliary patterns 620 may be formed in line shapes in a plan view.

Figure 41A:
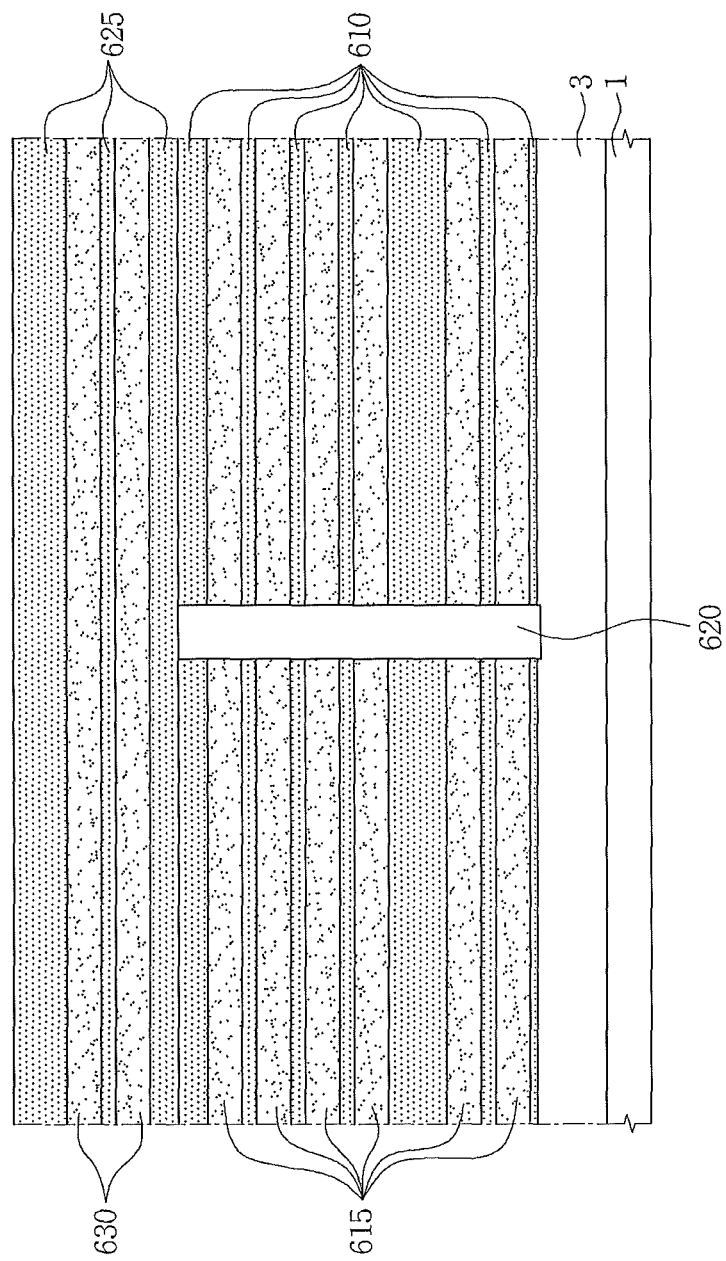
Figure 41B:
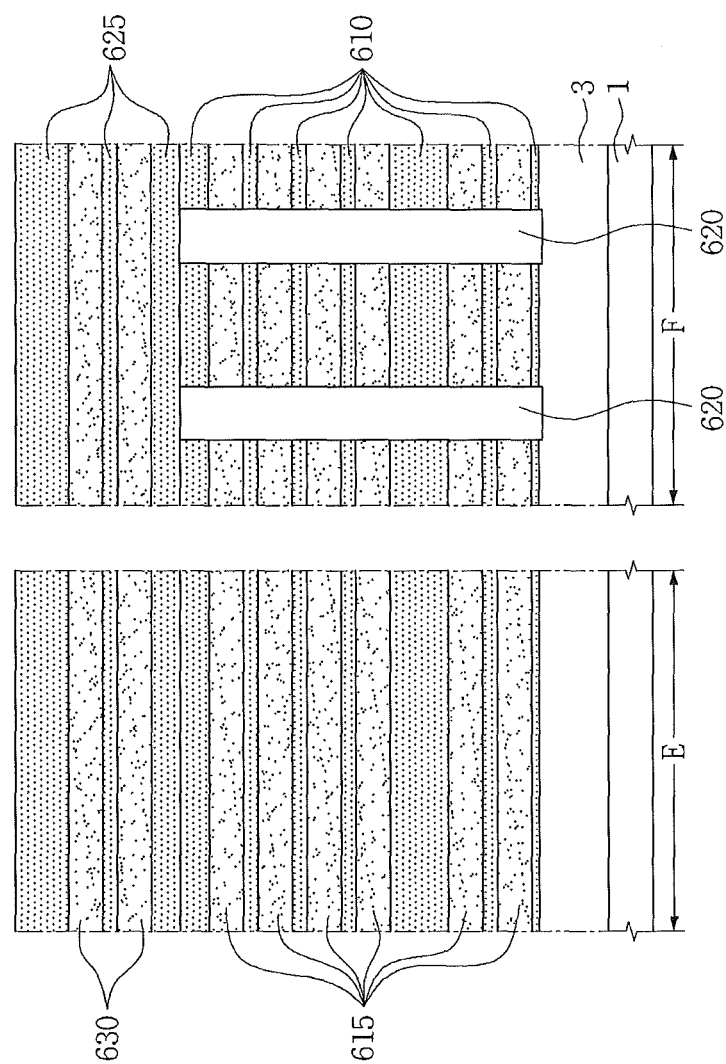

Referring to FIGS. 30, 41A, and 41B, alternately and repeatedly stacked second insulating layers 625 and second sacrificial layers 630, may be formed on the substrate having the auxiliary patterns 620. The lowermost layer among the second interlayer insulating layers 625 may be located at a lower level than the lowermost layer among the second sacrificial layers 630. The uppermost layer among the second interlayer insulating layers 625 may be located at a higher level than the uppermost layer among the second sacrificial layers 630.

The first and second sacrificial layers 615 and 630 may be formed of a material having etch selectivity with respect to the first and second interlayer insulating layers 610 and 625. For example, the first and second sacrificial layers 615 and 630 may be formed of silicon nitride, and the first and second interlayer insulating layers 610 and 625 may be formed of silicon oxide.

Figure 42A:
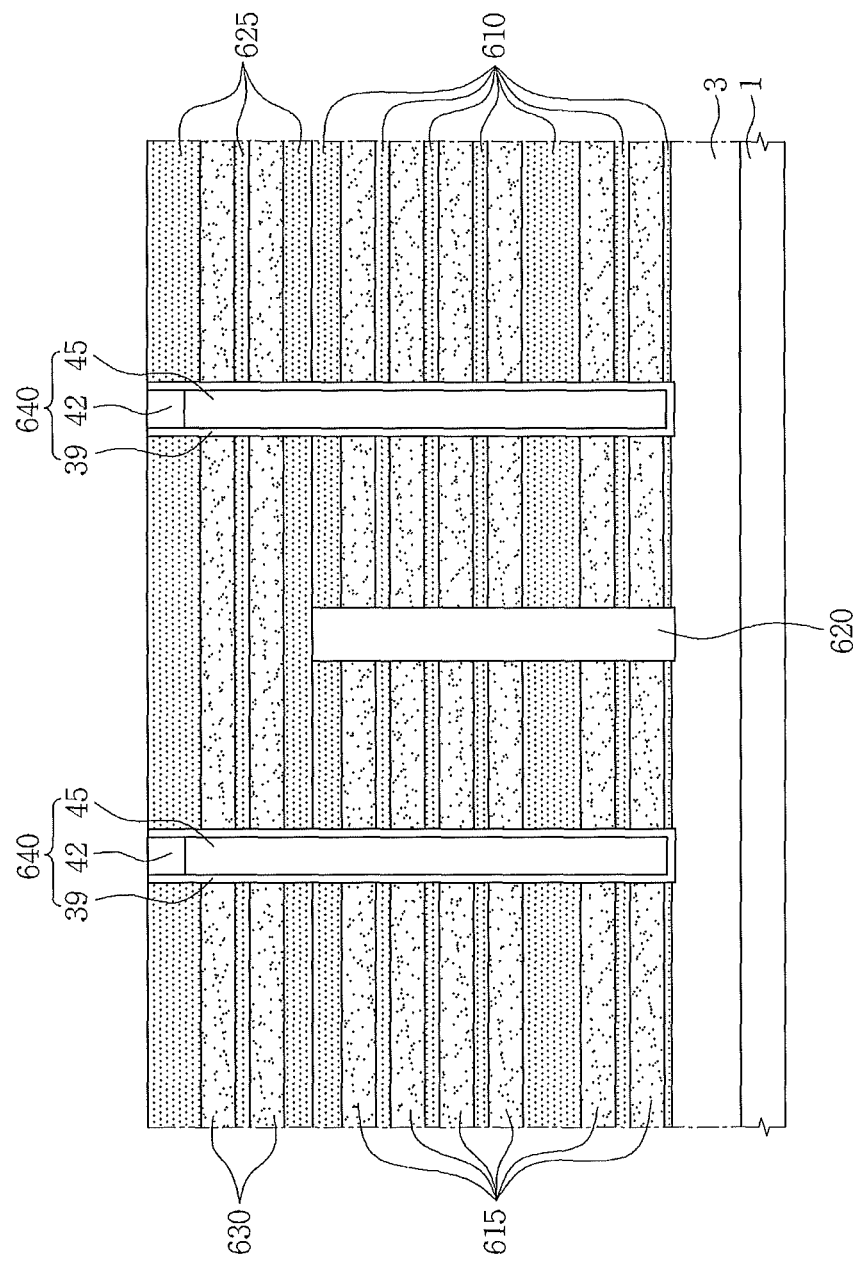
Figure 42B:
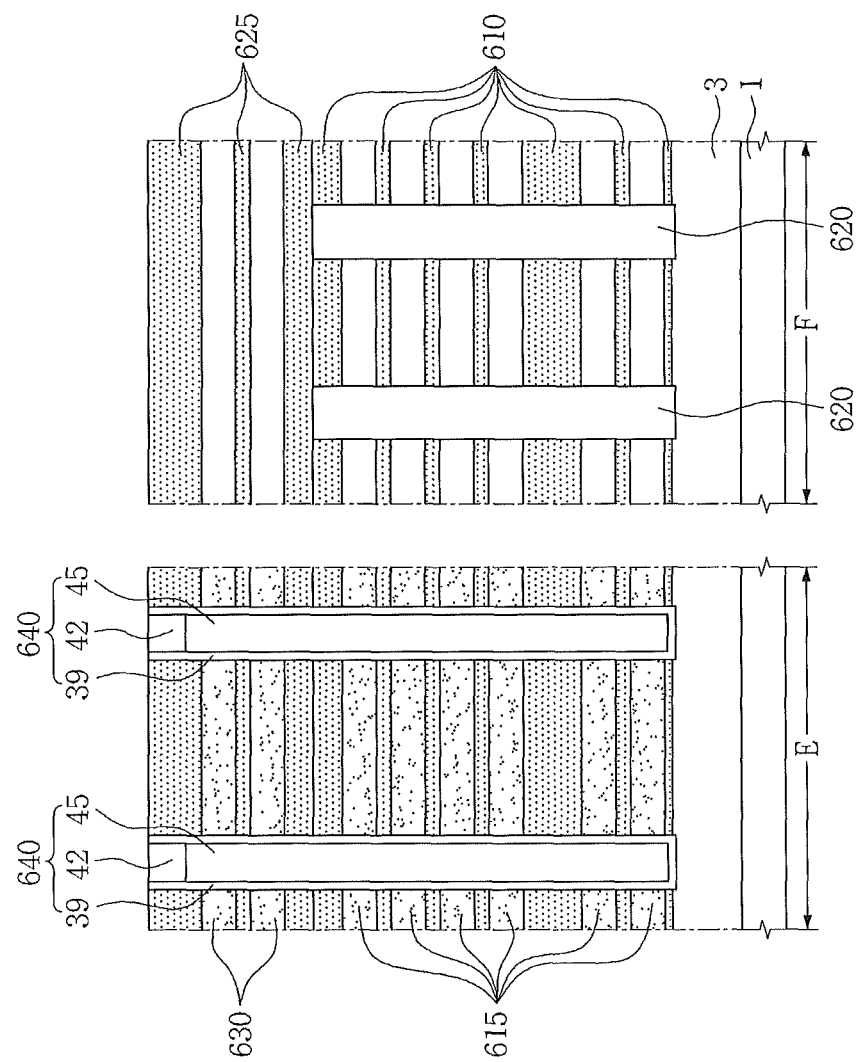

Referring to FIGS. 30, 42A, and 42B, vertical structures 640 passing through the first and second sacrificial layers 615 and 630 and first and second interlayer insulating layers 610 and 625, may be formed. The formation of the vertical structures 640 may include forming holes passing through the first and second sacrificial layers 615 and 630 and first and second interlayer insulating layers 610 and 625, forming a semiconductor layer on the substrate having the holes, forming core insulating patterns 42 partially filling the holes on the semiconductor layer, forming a pad layer on the substrate having the core insulating pattern 42, and forming a remaining semiconductor layer 39 and remaining pad layer 45 in the holes by planarizing the pad layer and semiconductor layer until the uppermost layer among the first interlayer insulating layers 610 is exposed.

Figure 43A:
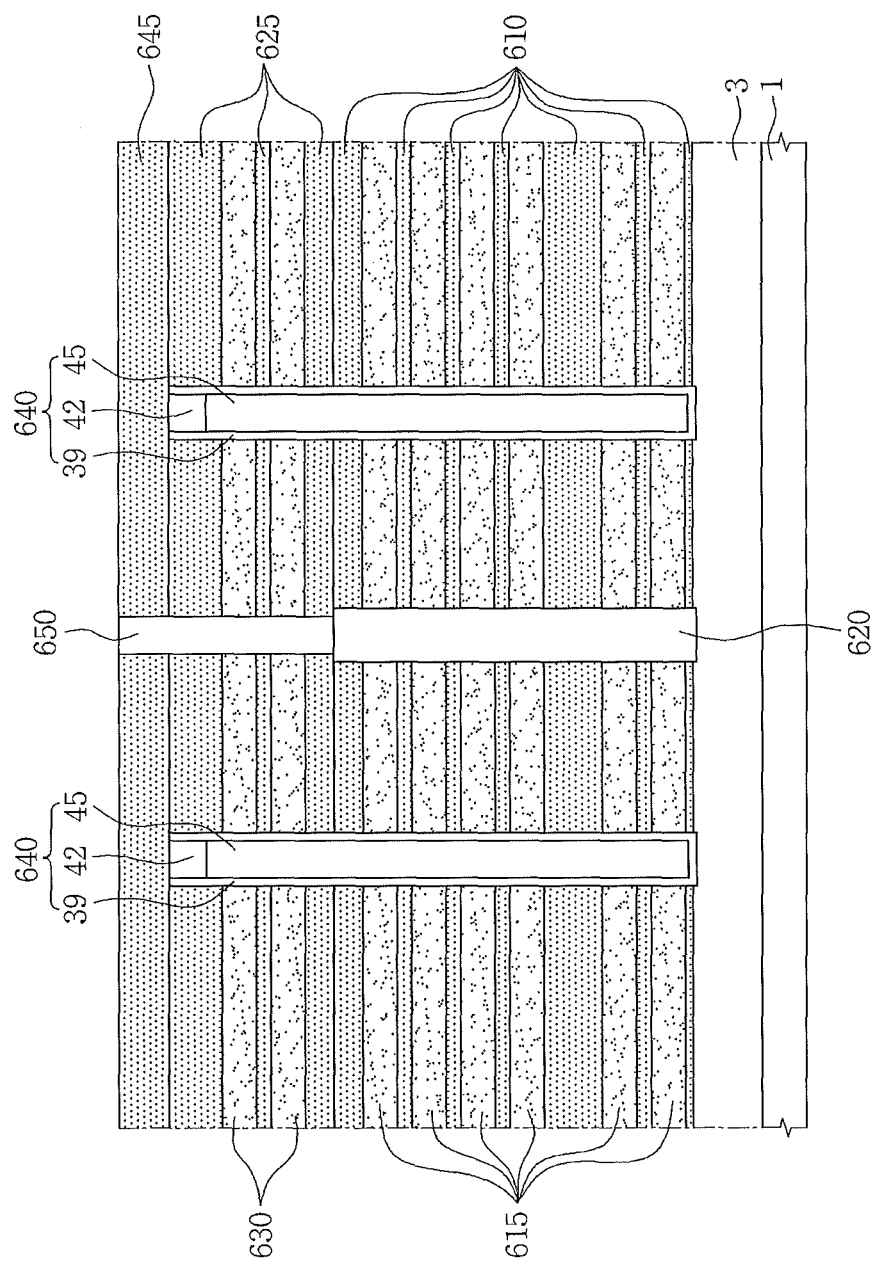
Figure 43B:
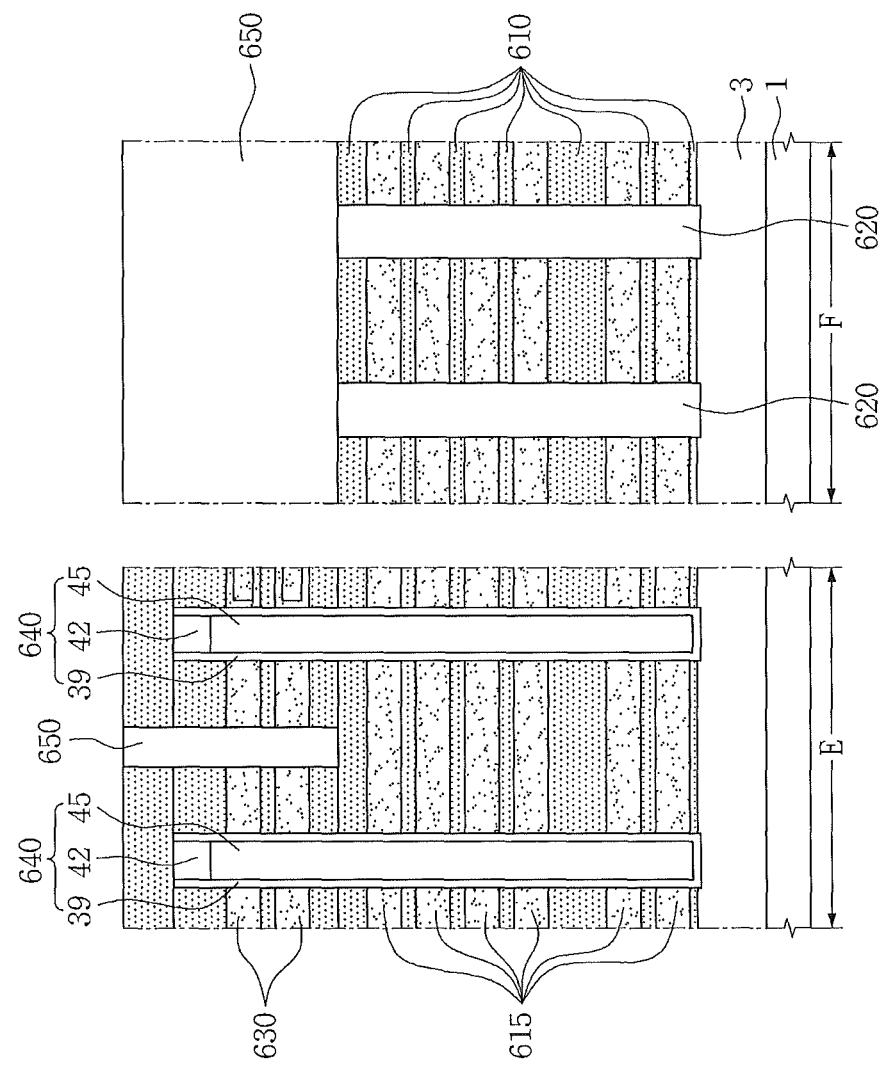

Referring to FIGS. 30, 43A, and 43B, a first capping layer 645 may be formed on the substrate having the vertical structures 640. The first capping layer 645 may be formed of silicon oxide.

An isolation pattern 650 which intersects and separates at least the second sacrificial layers 630 may be formed. The isolation pattern 650 may pass through the first capping layer 645, the second sacrificial layers 630, and the second interlayer insulating layers 625. The isolation pattern 650 may be formed of an insulating material such as silicon oxide.

The first and second interlayer insulating layers 610 and 625 may correspond to the interlayer insulating layers 21 described in FIGS. 8A and 8B, and the first and second sacrificial layers 615 and 630 may correspond to the sacrificial layers 18 described in FIGS. 8A and 8B.

Referring again to FIGS. 38A and 38B, a second capping layer 51 may be formed on the substrate having the isolation pattern 650. A process of forming the device isolation trench 54 described in FIGS. 13A and 13B on the substrate having the second capping layer 51, a process of removing the first and second sacrificial layers 615 and 630 described in FIGS. 14A and 14B, a process of forming the dielectric 60 and the conductive patterns 66 described in FIGS. 15A, 15B, 16A, and 16B, and a process of forming the insulating vertical patterns 78a and 78b and process of forming the capping interlayer insulating layer 81 which are described in FIGS. 17A and 17B, may be sequentially processed. Next, the contact structures 90 and the bit lines 93 may be formed.

Figure 44A:
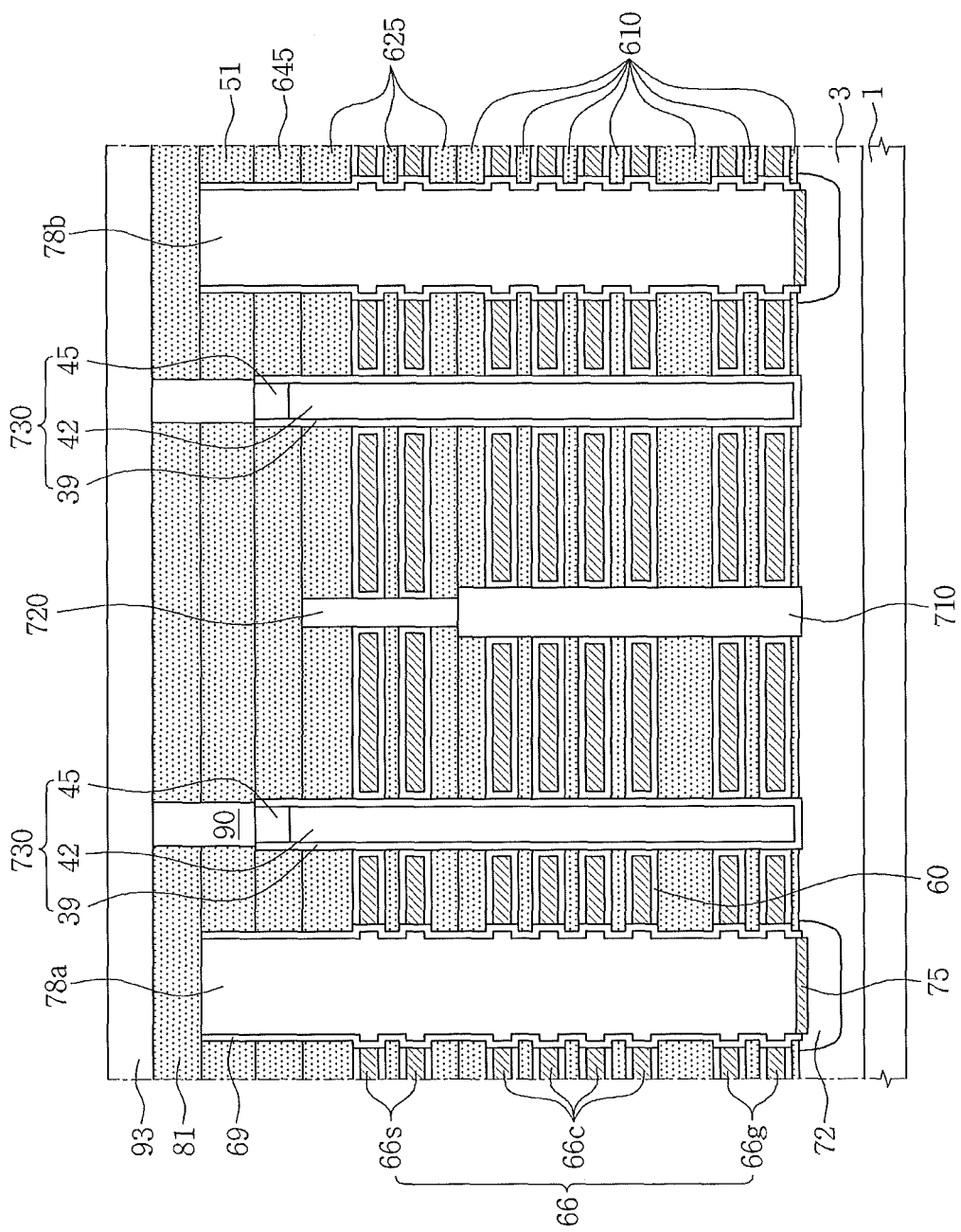
FIGS. 44A and 44B are cross-sectional views showing still another modified example of the semiconductor device in accordance with the embodiment of the inventive concept.
Figure 44B:
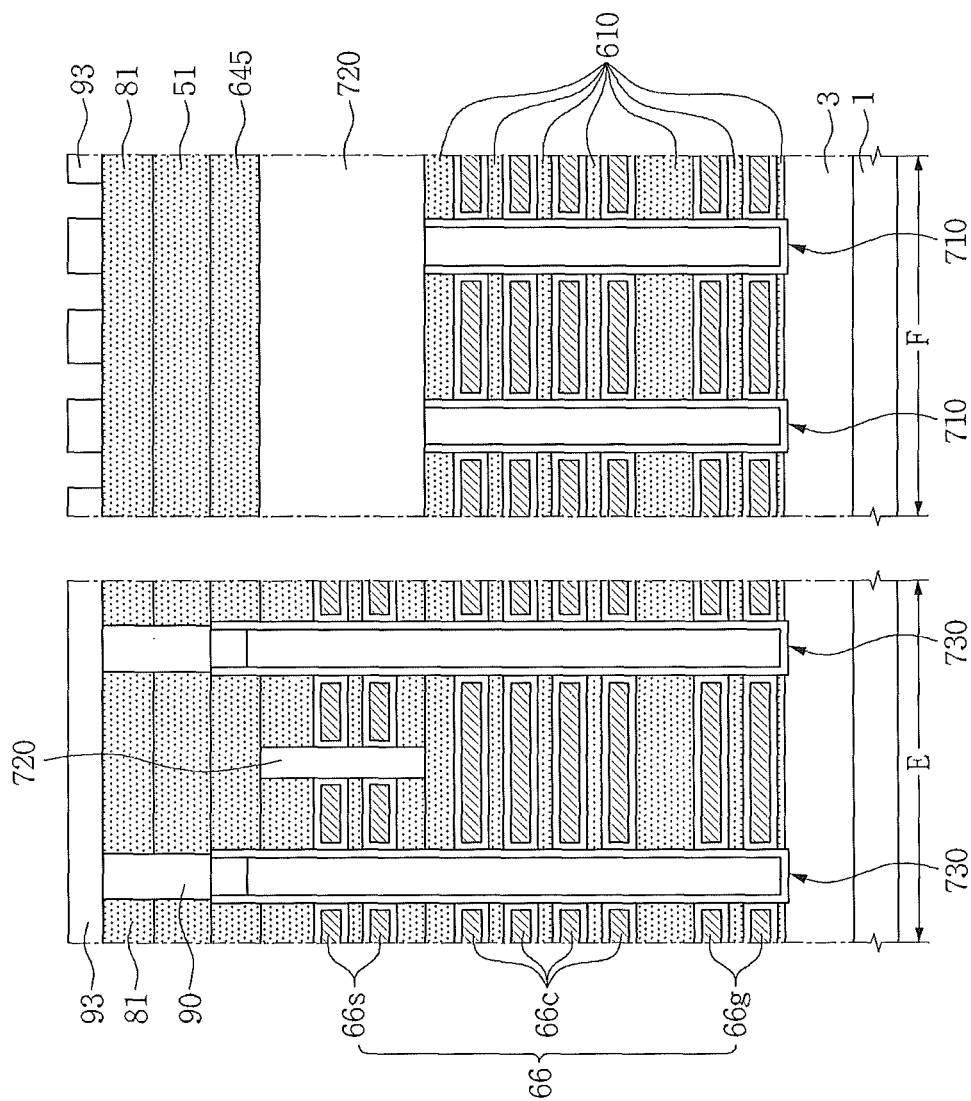

FIGS. 44A and 44B are cross-sectional views showing still another modified example of the semiconductor device in accordance with the embodiment of the inventive concept. In FIGS. 44A and 44B, FIG. 44A shows a cross-sectional view taken along line VII-VII' in FIG. 30. In FIG. 44B, a part denoted by character E shows an area taken along line VIII-VIII' in FIG. 30, and a part denoted by character F shows an area taken along line IX-IX' in FIG. 30.

Referring to FIGS. 30, 44A, and 44B, insulating vertical patterns 78a and 78b may be disposed on a semiconductor substrate 1. The insulating vertical patterns 78a and 78b may have line shapes in a plan view. First interlayer insulating layers 610 located between the insulating vertical patterns 78a and 78b and vertically arranged on the substrate 1, may be disposed. The first interlayer insulating layers 610 may be spaced apart from each other. Lower and intermediate conductive patterns 66g and 66c located between the insulating vertical patterns 78a and 78b and between the first interlayer insulating layers 610 may be disposed. Accordingly, the first interlayer insulating layers 610 and the lower and intermediate conductive patterns 66g and 66c may be alternatively, repeatedly, and vertically arranged.

Auxiliary patterns 710 passing through the first interlayer insulating layers 610 and lower and intermediate conductive patterns 66g and 66c may be disposed.

In some embodiments, as illustrated in FIGS. 44A and 44B, pillar-shaped auxiliary patterns 710 may be disposed.

Figure 45:
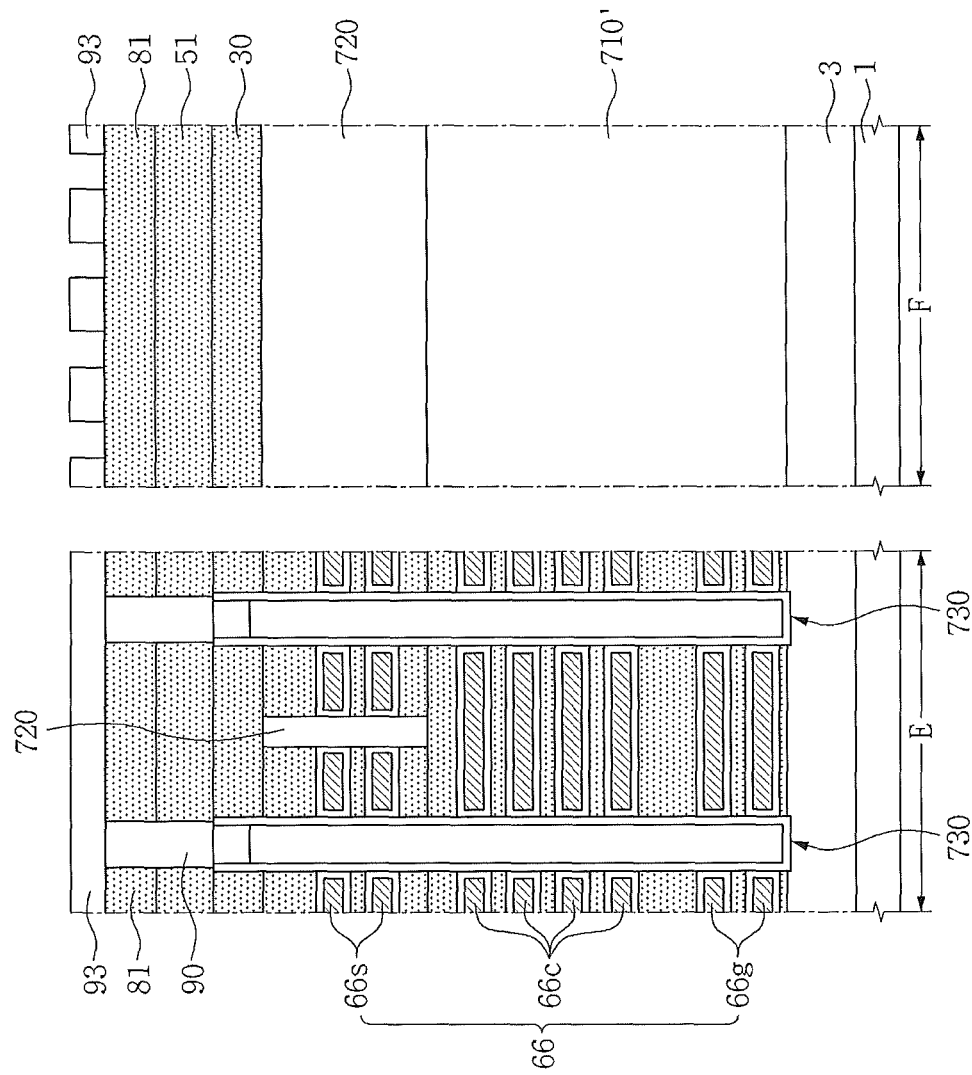
FIG. 45 is a cross-sectional view showing still another modified example of the semiconductor device in accordance with the embodiment of the inventive concept.

In other embodiments, as illustrated in FIG. 45, line-shaped auxiliary patterns 710' may be disposed.

Second interlayer insulating layers 625 located between the insulating vertical patterns 78a and 78b and vertically arranged on the first interlayer insulating layers 610, may be disposed. The second interlayer insulating layers 625 may be spaced apart from each other. Conductive lines 66s may be disposed between the second interlayer insulating layers 625. Accordingly, the second interlayer insulating layers 625 and the conductive lines 66s may be alternately, repeatedly, and vertically arranged. The conductive lines 66s may include first and second conductive lines 66s_1 and 66s_2 spaced apart from each other in the same plane. The conductive lines 66s and the lower and intermediate conductive patterns 66g and 66c may configure conductive patterns 66.

Isolation pattern 720 located between the first and second conductive lines 66s_1 and 66s_2 and passing through the second interlayer insulating layers 625 may be disposed. The isolation pattern 720 may be formed of an insulating material such as silicon oxide.

The isolation pattern 720 may overlap the auxiliary patterns 710. The isolation pattern 720 may have line shapes. A single isolation pattern 720 may overlap a plurality of the auxiliary patterns 710.

A first capping layer 645 located between the insulating vertical patterns 78a and 78b and on the second interlayer insulating layers 625 may be disposed.

Vertical structures 730 passing through the first capping layer 645, first and second interlayer insulating layers 610 and 625, and conductive patterns 66, may be disposed. The vertical structures 730 may have upper surfaces located at a higher level than the isolation pattern 720. Each of the vertical structures 730 may include a semiconductor pattern. Each of the vertical structures 730 may be formed of substantially the same material and the same structure as the vertical structures 48c described in FIGS. 2A and 2B, or as the vertical structures 48c' described in FIGS. 4A and 4B.

A second capping layer 51 located between the insulating vertical patterns 78a and 78b and covering the vertical structures 730 and first capping layer 645 may be disposed.

A capping interlayer insulating layer 81 covering the insulating vertical patterns 78a and 78b and second capping layer 51, may be formed.

Conductive contact structures 90 passing through the capping interlayer insulating layer 81 and second capping layer 51 and electrically connected to the vertical structures 730 may be disposed. Bit lines 93 electrically connected to the contact structures 90 may be disposed on the capping interlayer insulating layer 81.

Figure 46A:
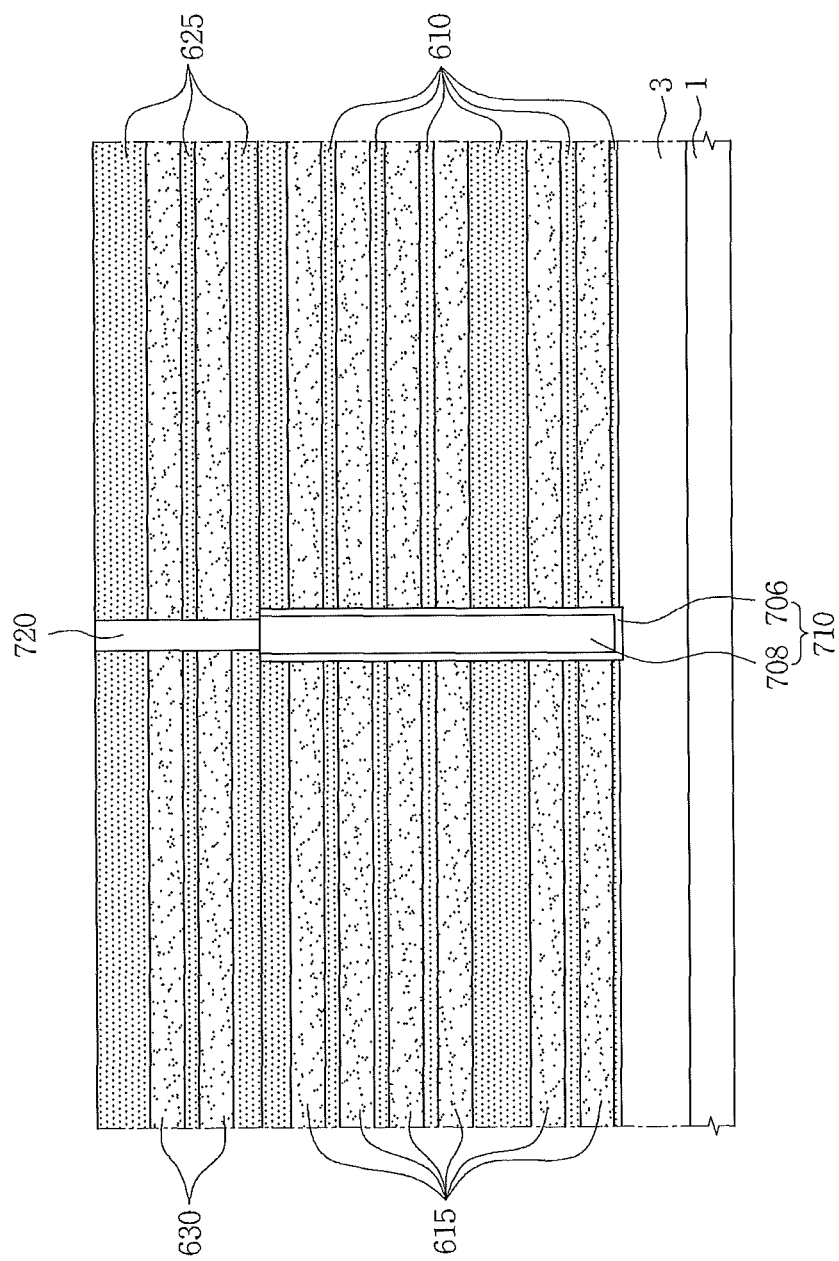
FIGS. 46A to 47B are cross-sectional views showing a method of fabricating still another modified example of the semiconductor device in accordance with the embodiment of the inventive concept.
Figure 46B:
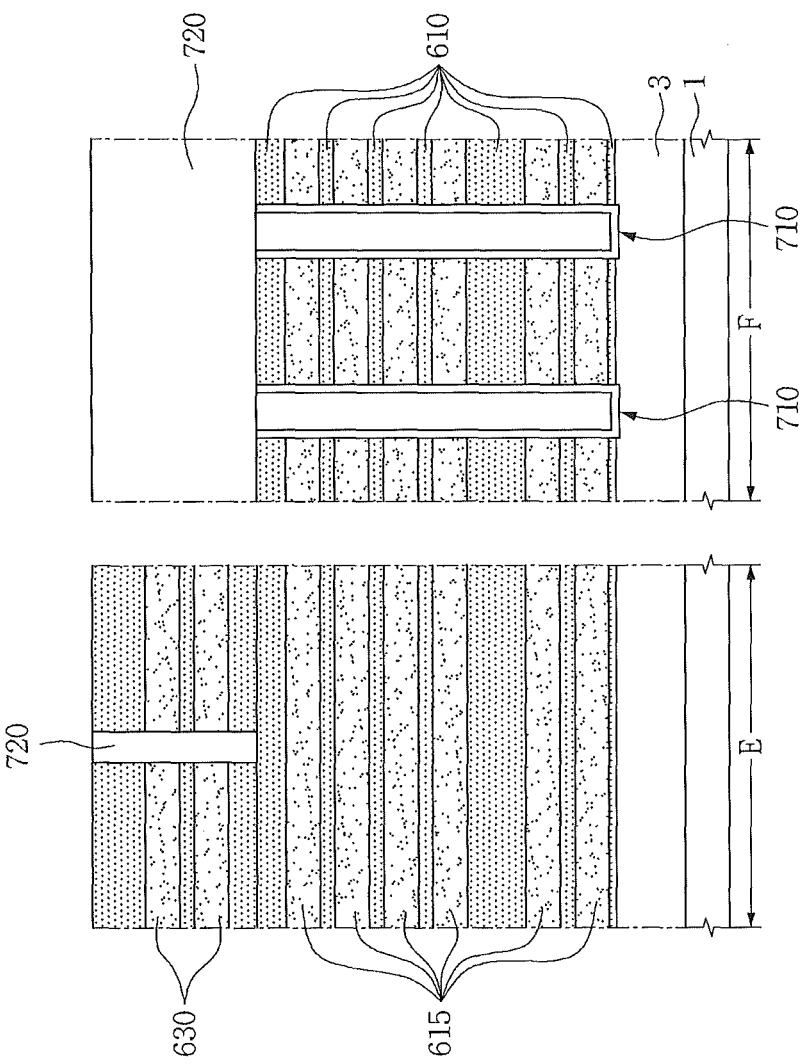
Figure 47A:
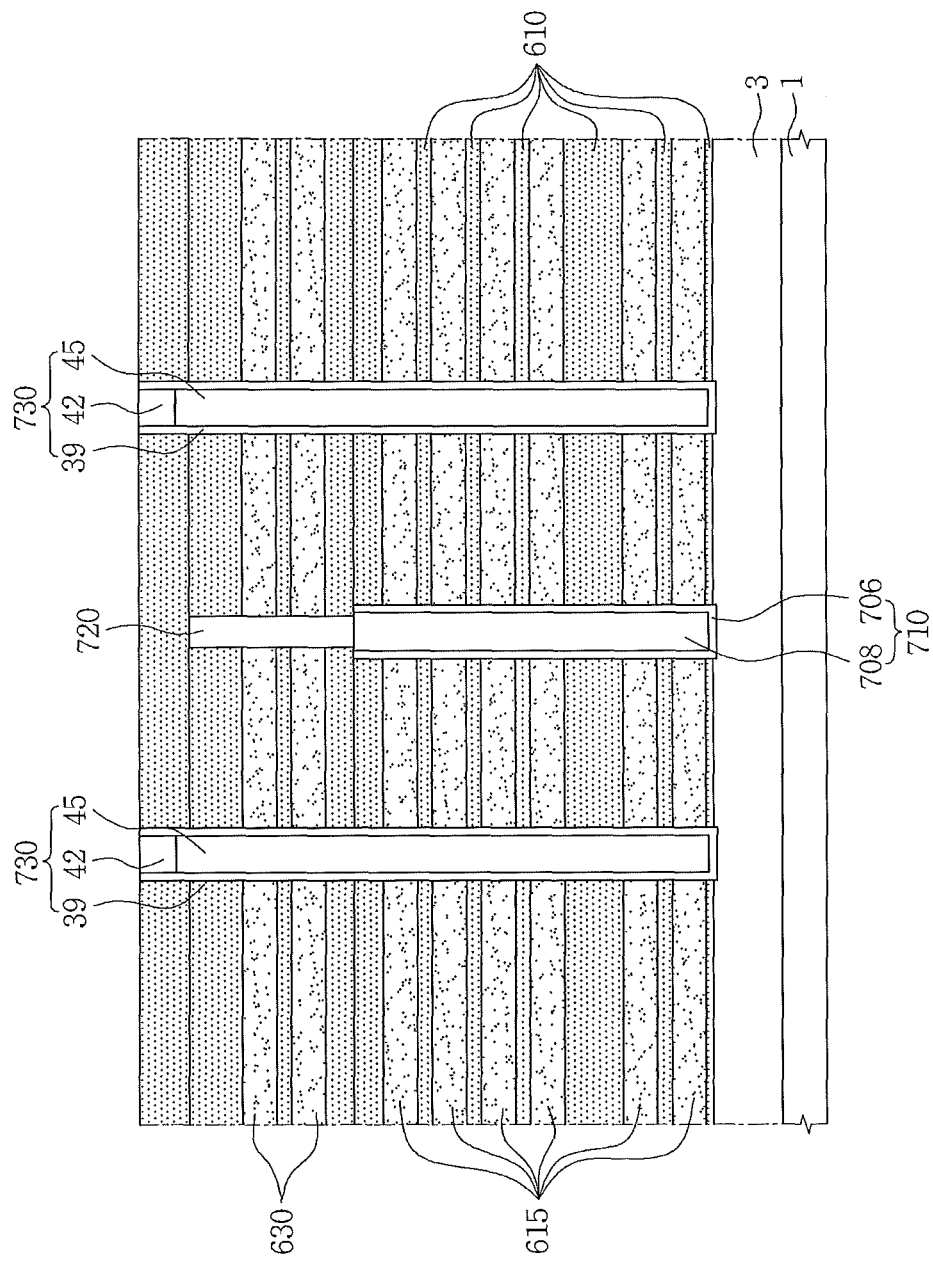
Figure 47B:
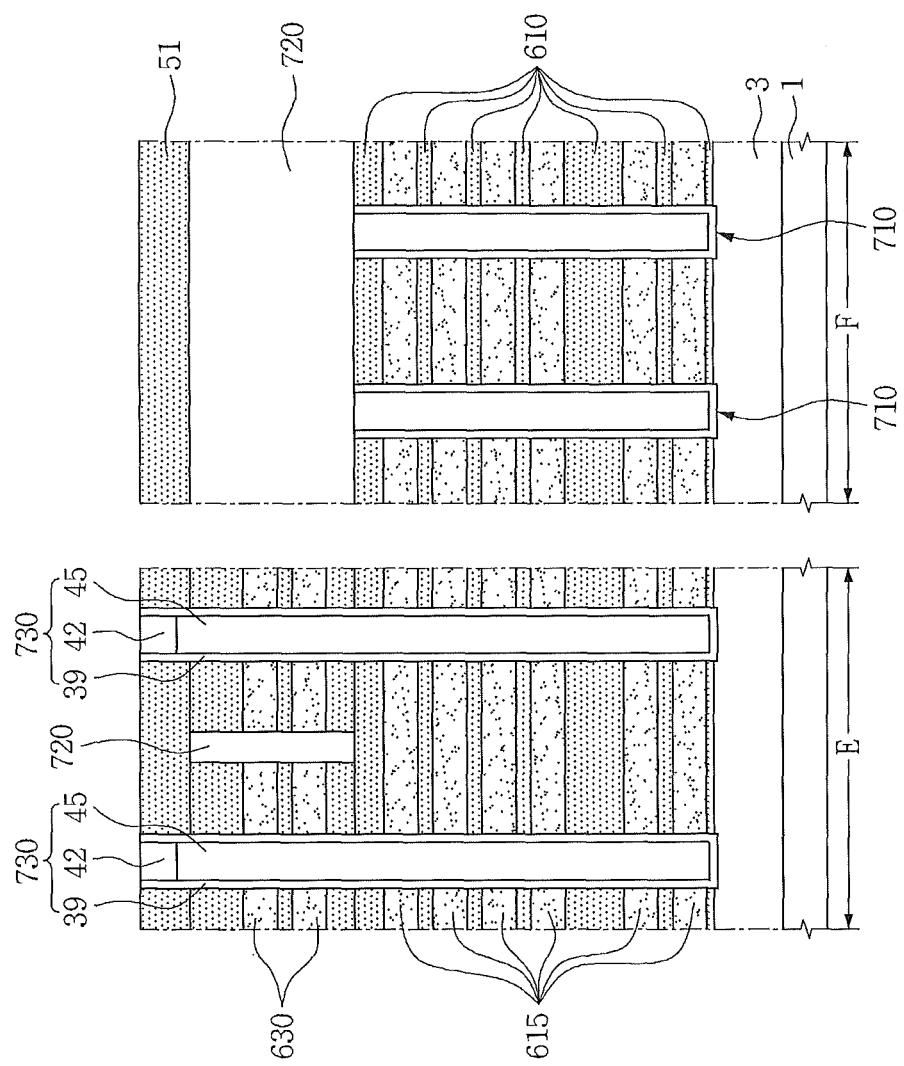

FIGS. 46A, 46B, 47A, and 47B are cross-sectional views describing a method of fabricating the semiconductor device described in FIGS. 44A and 44B. In FIGS. 46A to 47B, FIGS. 46A and 47A show cross-sectional views taken along line VII-VII' in FIG. 30. In FIGS. 46B and 47B, a part denoted by character E shows an area taken along line VIII-VIII' in FIG. 30, and a part denoted by character F shows an area taken along line IX-IX' in FIG. 30.

Referring to FIGS. 30, 46A, and 46B, alternately and repeatedly stacked first interlayer insulating layers 610 and first sacrificial layers 615 may be formed on a semiconductor substrate 1 having a well region 3. The first sacrificial layers 615 may be vertically spaced apart from each other by the first interlayer insulating layers 610. The lowermost layer of the first interlayer insulating layers 610 may be located at a lower level than the lowermost layer of the first sacrificial layers 615. The uppermost layer of the first interlayer insulating layers 610 may be located at a higher level than the uppermost layer of the first sacrificial layers 615.

Auxiliary patterns 710 passing through the first interlayer insulating layers 610 and first sacrificial layers 615 may be formed. The auxiliary patterns 710 may be formed to include a material having etch selectivity with respect to the first and second sacrificial layers 615 and 630. For example, the auxiliary patterns 710 may be formed of an insulating material such as silicon oxide. The auxiliary patterns 710 may be formed as a single layer or a multi layer. For example, the auxiliary patterns 710 may be formed as a pillar-shaped silicon oxide layer, or formed to include a pillar-shaped first pattern 708 and a second pattern 706 covering bottom and side surfaces of the first pattern 708. The first pattern 708 may be formed of a conductive material such as polysilicon, and the second pattern 706 may be formed of an insulating material such as silicon oxide.

In other embodiments, the auxiliary patterns 710 may be formed in line shapes in a plan view.

Alternately and repeatedly stacked second interlayer insulating layers 625 and second sacrificial layers 630 may be formed on the substrate having the auxiliary patterns 710. The first and second interlayer insulating layers 610 and 625 may correspond to the interlayer insulating layers 21 described in FIGS. 8A and 8B, and the first and second sacrificial layers 615 and 630 may correspond to the sacrificial layers 18 described in FIGS. 8A and 8B.

Isolation pattern 720 which intersects and separates at least the second sacrificial layers 630 may be formed. The isolation pattern 720 may pass through and intersect the second sacrificial layers 630 and the second interlayer insulating layers 625. The isolation pattern 720 may have line shapes. The isolation pattern 720 may be formed of an insulating material such as silicon oxide. The isolation pattern 720 may overlap the auxiliary patterns 710.

Referring to FIGS. 30, 47A, and 47B, a first capping layer 645 may be formed on the substrate having the isolation pattern 720. The first capping layer 645 may be formed of silicon oxide.

Vertical structures 730 passing through the first capping layer 645, first and second sacrificial layers 615 and 630, and first and second interlayer insulating layers 610 and 625, may be formed. The formation of the vertical structures 730 may include forming holes passing through the first and second sacrificial layers 615 and 630 and first and second interlayer insulating layers 610 and 625, forming a semiconductor layer on the substrate having the holes, forming core insulating patterns 42 partially filling the holes on the semiconductor layer, forming a pad layer on the substrate having the core insulating patterns 42, and forming a remaining semiconductor layer 39 and remaining pad layer 45 in the holes by planarizing the pad layer and semiconductor layer until the uppermost layer among the first interlayer insulating layers 610 is exposed.

Referring again to FIGS. 44A and 44B, a second capping layer 51 may be formed on the substrate having the vertical structures 730. A process of forming the device isolation trench 54 described in FIGS. 13A and 13B on the substrate having the second capping layer 51, a process of removing the first and second sacrificial layers 615 and 630 described in FIGS. 14A and 14B, a process of forming the dielectric 60 and the conductive patterns 66 described in FIGS. 15A, 15B, 16A, and 16B, and a process of forming the insulating vertical patterns 78a and 78b and process of forming the capping interlayer insulating layer 81 which are described in FIGS. 17A and 17B, may be sequentially processed. Next, the contact structures 90 and the bit lines 93 may be formed.

In accordance with the embodiments of the inventive concept, a structure and fabrication method in which damage or defect of the semiconductor device generated during processes for fabricating a semiconductor device are prevented, may be provided and, as a result, a highly reliable three-dimensional semiconductor device may be provided.

Figure 48:
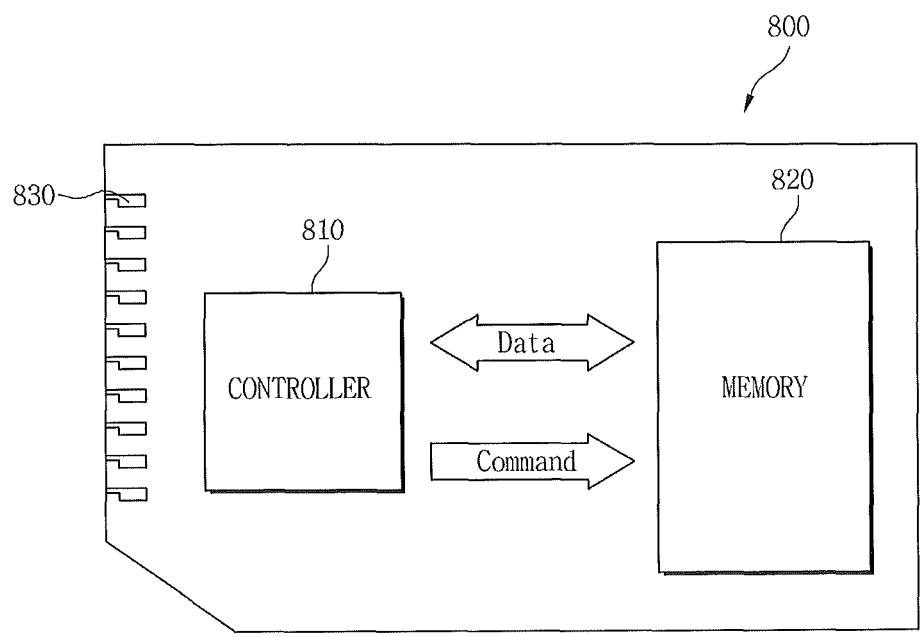
FIG. 48 is a schematic diagram showing a memory card in accordance with an embodiment of the inventive concept.

FIG. 48 is a diagram showing a memory card system including a semiconductor device in accordance with one of the embodiments of the inventive concept.

Referring to FIG. 48, a memory card system 800 may be provided. The memory card system 800 may include a controller 810, a memory 820, and an interfacer 830. The controller 810 and the memory 820 may be configured to send and receive a command and/or data to and from each other. The memory 820, for example, may be used to store a command executed by the controller 810 and/or data of a user. Accordingly, the memory card system 800 may store data in the memory 820, or output data from the memory 820 to an external. The memory 820 may include a semiconductor device, for example, a non-volatile memory device, in accordance with one of the embodiments described in FIGS. 1 to 47B.

The interfacer 830 may function to input/output data from/to the external. The memory card system 800 may be a multimedia card (MMC), a secure digital card (SD), or a portable data storage device.

Figure 49:
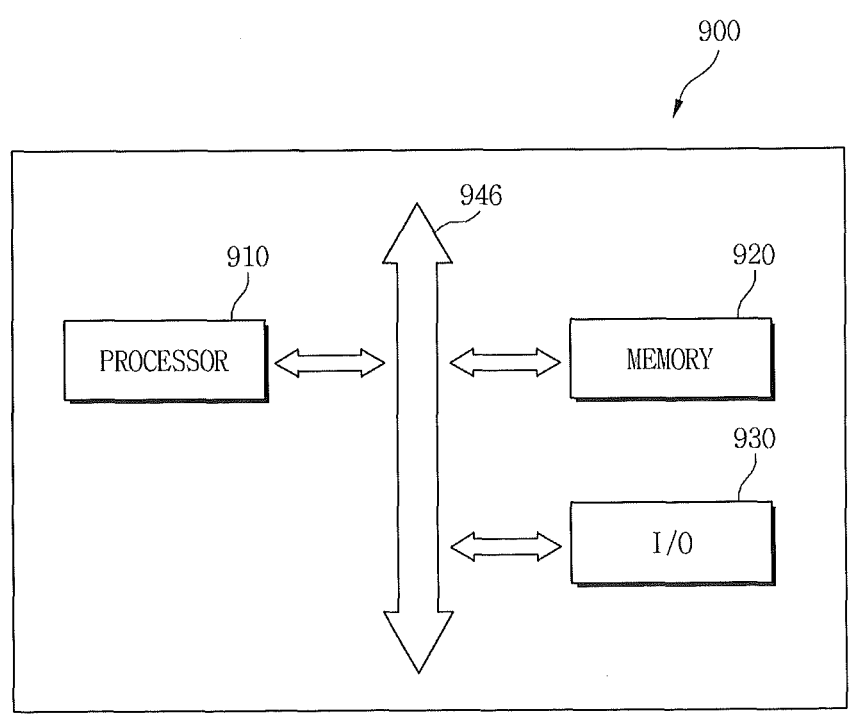
FIG. 49 is a block diagram showing an electronic system in accordance with an embodiment of the inventive concept.

FIG. 49 is a block diagram describing an electronic apparatus having a semiconductor device in accordance with one of the embodiments of the inventive concept.

Referring to FIG. 49, an electronic apparatus 900 may be provided. The electronic apparatus 900 may include a processor 910, a memory 920, and an input/output device (I/O) 930. The processor 910, the memory 920, and the I/O device 930 may be connected to each other through a bus 946.

The memory 920 may receive a control signal such as RAS*, WE*, and CAS* from the processor 910. The memory 920 may store a code and data for operating the processor 910. The memory 920 may be used to store data accessed through the bus 946.

The memory 920 may include a semiconductor device, for example, a non-volatile memory device, in accordance with one of the embodiments of the inventive concept described in FIGS. 1 to 47B. For a specific implementation and modification of the inventive concept, additional circuits and control signals may be provided.

The electronic apparatus 900 may configure variable electronic control apparatuses which require the memory 920. For example, the electronic apparatus 900 may be used in a computer system, a wireless communication apparatus such as a PDA, laptop computer, a portable computer, a web tablet, a wireless phone, a mobile phone, a digital music player, an MP3 player, a navigation system, a solid state disk (SSD), a household appliance, or all devices which are capable of transmitting information in a wireless environment.

A more specifically implemented and modified example of the electronic apparatus 900 will be described with reference to FIGS. 50 and 51.

Figure 50:
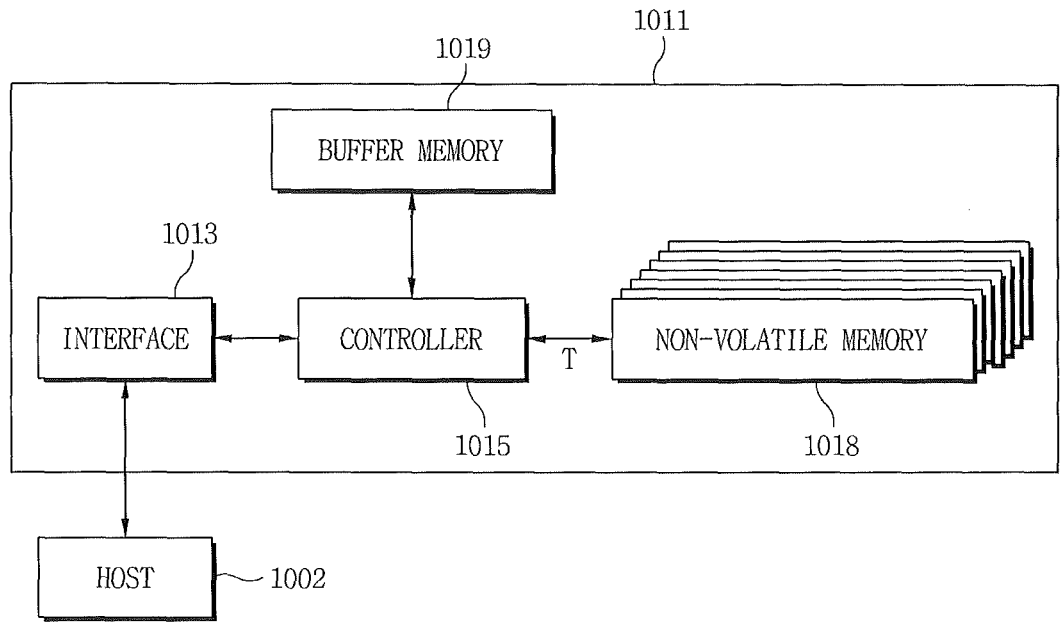
FIG. 50 is a block diagram showing a data storage apparatus in accordance with an embodiment of the inventive concept.

FIG. 50 is a system block diagram showing an electronic apparatus including a semiconductor device in accordance with one of the embodiments of the inventive concept.

Referring to FIG. 50, the electronic apparatus may be a data storage apparatus such as an SSD 1011. The SSD 1011 may include an interface 1013, a controller 1015, a non-volatile memory 1018, and a buffer memory 1019.

The SSD 1011 is an apparatus which stores information using a semiconductor device. The SSD 1011 is faster, has a lower mechanical delay or failure rate, and generates less heat and noise than a hard disk drive (HDD). Further, the SSD 1011 may be smaller and lighter than the HDD. The SSD 1011 may be widely used in a laptop computer, a netbook, a desktop PC, an MP3 player, or a portable storage device.

The controller 1015 may be formed adjacent to the interface 1013 and electrically connected thereto. The controller 1015 may be a microprocessor including a memory controller and a buffer controller. The non-volatile memory 1018 may be formed adjacent to the controller 1015 and electrically connected thereto via a connection terminal T. A data storage capacity of the SSD 1011 may correspond to a capacity of the non-volatile memory 1018. The buffer memory 1019 may be formed close to the controller 1015 and electrically connected thereto.

The interface 1013 may be connected to a host 1002, and may send and receive electrical signals such as data. For example, the interface 1013 may be a device using a standard such as a Serial Advanced Technology Attachment (SATA), an Integrated Drive Electronics (IDE), a Small Computer System Interface (SCSI), and/or a combination thereof. The non-volatile memory 1018 may be connected to the interface 1013 via the controller 1015.

The non-volatile memory 1018 may function to store data received through the interface 1013. The non-volatile memory 1018 may include one of the semiconductor devices in accordance with the embodiments of the inventive concept described in FIGS. 1 to 47B.

Even when power supplied to the SSD 1011 is interrupted, the data stored in the non-volatile memory 1018 may be retained.

The buffer memory 1019 may include a volatile memory. The volatile memory may be a Dynamic Random Access Memory (DRAM) and/or a Static Random Access Memory (SRAM). The buffer memory 1019 has a relatively faster operating speed than the non-volatile memory 1018.

Data processing speed of the interface 1013 may be relatively faster than the operating speed of the non-volatile memory 1018. Here, the buffer memory 1019 may function to temporarily store data. The data received through the interface 1013 may be temporarily stored in the buffer memory 1019 via the controller 1015, and then permanently stored in the non-volatile memory 1018 according to the data write speed of the non-volatile memory 1018. Further, frequently-used items of the data stored in the non-volatile memory 1018 may be pre-read and temporarily stored in the buffer memory 1019. That is, the buffer memory 1019 may function to increase effective operating speed and reduce error rate of the SSD 1011.

Figure 51:
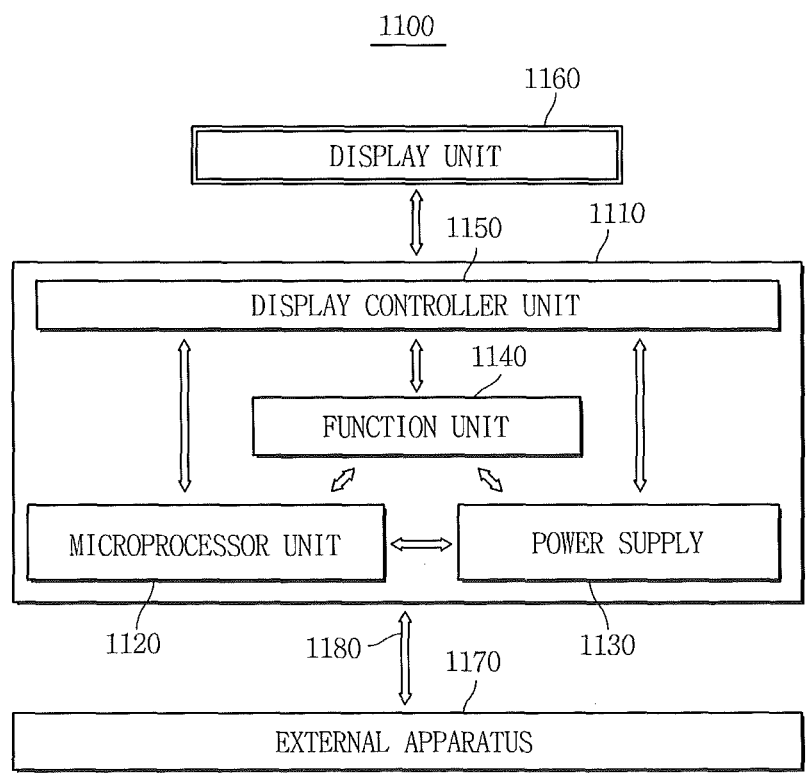
FIG. 51 is a block diagram showing an electronic apparatus in accordance with an embodiment of the inventive concept.

FIG. 51 is a system block diagram showing an electronic apparatus including a semiconductor device in accordance with one of the embodiments of the inventive concept.

Referring to FIG. 51, one of the semiconductor devices in accordance with the embodiments of the inventive concept described with reference to FIGS. 1 to 47B, may be applied to an electronic system 1100. The electronic system 1100 may include a body 1110, a microprocessor unit 1120, a power supply 1130 a function unit 1140, and a display controller unit 1150. The body 1110 may be a mother board formed of a printed circuit board (PCB). The microprocessor unit 1120, the power supply 1130, the function unit 1140, and the display controller unit 1150 may be installed in the body 1110. A display unit 1160 may be installed inside or outside of the body 1110. For example, the display unit 1160 may be disposed on a surface of the body 1110 to display an image processed by the display controller unit 1150.

The power supply 1130 may function to receive a constant voltage from an external battery (not shown), etc., divide the voltage into required levels, and supply those voltages to the microprocessor unit 1120, the function unit 1140, and the display controller unit 1150. The microprocessor unit 1120 may receive the voltage from the power supply 1130 to control the function unit 1140 and the display unit 1160. The function unit 1140 may perform functions of various electronic systems 1100. For example, if the electronic system 1100 is a mobile phone, the function unit 1140 may have several components which can perform functions of the mobile phone such as dialing, video output to the display unit 1160 through communication with an external apparatus 1170, and sound output to a speaker, and if a camera is installed, the function unit 1140 may function as a camera image processor.

In the embodiment to which the inventive concept is applied, when the electronic system 1100 is connected to a memory card, etc. in order to expand capacity, the function unit 1140 may be a memory card controller. The function unit 1140 may exchange signals with the external apparatus 1170 through a wired or wireless communication unit 1180. Further, when the electronic system 1100 needs a universal serial bus (USB) in order to expand functionality, the function unit 1140 may function as an interface controller.

One of the semiconductor devices in accordance with the embodiments of the inventive concept, described with reference to FIGS. 1 to 47B, may be applied at least one of the microprocessor unit 1120 and the function unit 1140.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   a plurality of cell gate electrodes vertically arranged on a semiconductor substrate;
   a selection gate electrode disposed on the plurality of cell gate electrodes, wherein the selection gate electrode comprises first and second conductive lines located at the same level as each other;
   an isolation pattern overlapping an uppermost cell gate electrode of the plurality of cell gate electrodes and disposed between the first and second conductive lines;
   an interlayer insulating layer between the isolation pattern and the plurality of cell gate electrodes;
   a first vertical structure passing through the first conductive line and the plurality of cell gate electrodes;
   a second vertical structure passing through the second conductive line and the plurality of cell gate electrodes; and
   an auxiliary pattern passing through the plurality of cell gate electrodes and in contact with the isolation pattern.

2. The semiconductor device of claim 1, wherein the auxiliary pattern has a greater width than the isolation pattern.

3. The semiconductor device of claim 1, wherein the auxiliary pattern passes through the isolation pattern.

4. The semiconductor device of claim 1, further comprising:
   a bit line intersecting the first and second conductive lines, and overlapping the first and second vertical structures and the auxiliary pattern;
   a first contact structure interposed between the bit line and the first vertical structure, and electrically connecting the bit line and the first vertical structure;
   a second contact structure interposed between the bit line and the second vertical structure, and electrically connecting the bit line and the second vertical structure; and
   an insulating material interposed between the bit line and the auxiliary pattern, and insulating the bit line from the auxiliary pattern.

5. A semiconductor device, comprising:
   a semiconductor substrate;
   first and second vertical patterns disposed on the semiconductor substrate and spaced apart from each other;
   a selection gate electrode comprising first and second conductive lines disposed between the first and second vertical patterns and located at the same level as each other;
   a plurality of conductive patterns disposed between the first and second conductive lines and the semiconductor substrate, the plurality of conductive patterns comprising a plurality of cell gate electrodes;
   an isolation pattern overlapping an uppermost cell gate electrode of the plurality of cell gate electrodes and interposed between the first and second conductive lines;
   an upper interlayer insulating layer between the isolation pattern and the conductive patterns;
   a first vertical structure passing through the first conductive line and the plurality of conductive patterns;
   a second vertical structure passing through the second conductive line and the plurality of conductive patterns; and
   auxiliary patterns disposed between the first and second conductive lines and passing through the plurality of conductive patterns.

6. The semiconductor device of claim 5, further comprising:
   a third vertical structure passing through the first conductive line and the plurality of conductive patterns, and spaced apart from the first vertical structure;
   a fourth vertical structure passing through the second conductive line and the plurality of conductive patterns and spaced apart from the second vertical structure;
   a first bit line intersecting the first and second conductive lines and overlapping the first and second vertical structures; and
   a second bit line intersecting the first and second conductive lines and overlapping the third and fourth vertical structures,
   wherein the first bit line overlaps one of the auxiliary patterns, and the second bit line passes between the auxiliary patterns in a plan view, and
   wherein a distance between the first and second vertical structures is greater than a distance between the third and fourth vertical structures.

7. The semiconductor device of claim 5, wherein each of the first and second vertical structures includes a semiconductor pattern electrically connected to the semiconductor substrate.

8. The semiconductor device of claim 5, wherein the first conductive line has a first width between the isolation pattern located between the auxiliary patterns, and the first vertical pattern, and a second width smaller than the first width, between the first vertical pattern and the auxiliary patterns.

9. The semiconductor device of claim 5, wherein the auxiliary patterns are spaced apart from each other and in direct contact with the isolation pattern.

10. The semiconductor device of claim 5, wherein the auxiliary patterns pass through the plurality of conductive patterns and the isolation pattern.

11. The semiconductor device of claim 5, wherein the isolation pattern has a line shape.

12. The semiconductor device of claim 5, further comprising:
   a plurality of intermediated interlayer insulating layers repeatedly and alternatively stacked with the conductive patterns, wherein the auxiliary patterns pass through the plurality of conductive patterns and the plurality of intermediated interlayer insulating layers.

13. The semiconductor device of claim 5, wherein the auxiliary patterns have upper surfaces located at the same level as upper surfaces of the first and second vertical structures.

14. The semiconductor device of claim 5, wherein the first and second vertical structures are located at a different level from the isolation pattern.

15. The semiconductor device of claim 5, wherein the isolation pattern is completely outside spaces between the conductive patterns.

16. A semiconductor device, comprising:
   a semiconductor substrate;
   a plurality of cell gate electrodes on the semiconductor substrate;
   a selection gate electrode disposed on the plurality of cell gate electrodes, wherein the selection gate electrode comprises first and second conductive lines located at the same level as each other;
   an isolation pattern overlapping an uppermost cell gate electrode of the plurality of cell gate electrodes and between the first and second conductive lines, wherein the isolation pattern has a line shape;
   an interlayer insulating layer between the isolation pattern and the plurality of cell gate electrodes;
   a first vertical structure passing through the first conductive line;
   a second vertical structure passing through the second conductive line; and
   an auxiliary pattern disposed on the substrate and in contact with the isolation pattern.

17. The semiconductor device of claim 16, wherein the first and second vertical structures are electrically connected to a bit line overlapping the first and second vertical structures and the auxiliary pattern, and wherein the auxiliary pattern is electrically insulated from the bit line.

18. The semiconductor device of claim 16, further comprising:
   a third vertical structure passing through the first conductive line; and
   a fourth vertical structure passing through the second conductive line, wherein the distance between the first and second vertical structures is greater than a distance between the third and fourth vertical structures, and wherein the auxiliary pattern is between the first and second vertical structures and not the third and fourth vertical structures.

19. The semiconductor device of claim 16, wherein the auxiliary pattern intersects the isolation pattern at a layer below the first and second conductive lines.

20. The semiconductor device of claim 16, wherein the isolation pattern passes through the auxiliary pattern.

\* \* \* \* \*